(12) United States Patent
Kim et al.

(10) Patent No.: US 10,305,166 B2
(45) Date of Patent: May 28, 2019

(54) ANTENNA DEVICE AND ELECTRONIC DEVICE INCLUDING THE SAME

(71) Applicant: Samsung Electronics Co., Ltd., Suwon-si, Gyeonggi-do (KR)

(72) Inventors: Ki-Man Kim, Gumi-si (KR); Jaehwan Kim, Gyeongju-si (KR); Min-Soo Kim, Gumi-si (KR); Chulhyung Yang, Gumi-si (KR); Ji-Woo Lee, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 253 days.

(21) Appl. No.: 15/211,653

(22) Filed: Jul. 15, 2016

(65) Prior Publication Data

US 2017/0047637 A1    Feb. 16, 2017

(30) Foreign Application Priority Data

Aug. 13, 2015    (KR) .................. 10-2015-0114240

(51) Int. Cl.
*H01Q 1/24*    (2006.01)
*H01Q 1/27*    (2006.01)
(Continued)

(52) U.S. Cl.
CPC .............. *H01Q 1/243* (2013.01); *G06F 3/044* (2013.01); *H01Q 1/273* (2013.01); *H01Q 1/44* (2013.01);
(Continued)

(58) Field of Classification Search
CPC ............ H01Q 1/243; H01Q 1/44; H01Q 1/27; H01Q 1/245; H01Q 1/48; H01Q 21/28; H03K 17/955; H03K 2217/94026; H03K 2017/9455; G06F 3/044; G06F 3/0418; G01R 27/2605; H04M 1/0202; H04M 2250/12; G04G 21/08
See application file for complete search history.

(56) References Cited

U.S. PATENT DOCUMENTS 9,490,885 B1 *  11/2016  Zheng .................. H04W 52/42
9,843,091 B2 *  12/2017  Mow ..................... H01Q 1/243
(Continued)

FOREIGN PATENT DOCUMENTS

KR    10-2008-0112502 A    12/2008
KR    10-2013-0077362 A    7/2013
KR    10-2015-0001072 A    1/2015

*Primary Examiner* — Ryan Johnson
(74) *Attorney, Agent, or Firm* — Jefferson IP Law, LLP

(57) ABSTRACT

An electronic device is provided. The electronic device includes a housing that includes a first face, a second face that is directed opposite to the first face, and a side face that at least partially enclose a space between the first face and the second face, a first metallic member, a second metallic member, and a third metallic member that form a side face, a sensor configured to detect whether an external object comes in contact with at least one of the first metallic member, the second metallic member, and the third metallic member, and to generate a signal, and a circuit configured to change an electric path between at least one of the first metallic member, the second metallic member, and the third metallic member, and the ground member, at least partially based on the generated signal.

20 Claims, 37 Drawing Sheets

(51) Int. Cl.
  *H01Q 1/44* (2006.01)
  *H04M 1/02* (2006.01)
  *G06F 3/044* (2006.01)
  *H01Q 21/28* (2006.01)
  *H03K 17/955* (2006.01)
  *H04W 4/70* (2018.01)

(52) U.S. Cl.
  CPC ........... *H01Q 21/28* (2013.01); *H03K 17/955* (2013.01); *H04M 1/0202* (2013.01); *H04W 4/70* (2018.02); *H04M 2250/12* (2013.01)

(56) References Cited

U.S. PATENT DOCUMENTS

| | | |
|---|---|---|
| 2011/0250928 A1* | 10/2011 | Schlub .................. H01Q 1/243 455/550.1 |
| 2012/0009983 A1 | 1/2012 | Mow et al. |
| 2012/0112970 A1 | 5/2012 | Caballero et al. |
| 2012/0218723 A1 | 8/2012 | Kwak et al. |
| 2012/0319918 A1 | 12/2012 | Ramachandran et al. |
| 2013/0135157 A1 | 5/2013 | Tsou et al. |
| 2013/0217342 A1* | 8/2013 | Abdul-Gaffoor .... H03K 17/955 455/77 |
| 2014/0009360 A1 | 1/2014 | Ikonen et al. |
| 2014/0078008 A1 | 3/2014 | Kang et al. |
| 2014/0125528 A1 | 5/2014 | Tsai et al. |
| 2014/0354491 A1 | 12/2014 | Kim et al. |
| 2014/0370825 A1 | 12/2014 | Kim et al. |
| 2015/0003551 A1 | 1/2015 | Kim |
| 2015/0171916 A1 | 6/2015 | Asrani et al. |

* cited by examiner

ANTENNA DEVICE AND ELECTRONIC DEVICE INCLUDING THE SAME

CROSS-REFERENCE TO RELATED APPLICATION(S)

This application claims the benefit under 35 U.S.C. § 119(a) of a Korean patent application filed on Aug. 13, 2015 in the Korean Intellectual Property Office and assigned Serial number 10-2015-0114240, the entire disclosure of which is hereby incorporated by reference.

TECHNICAL FIELD

The present disclosure relates to an electronic device. More particularly, the present disclosure relates to an electronic device that includes an antenna device.

BACKGROUND

As electronic telecommunication technologies have been developed, electronic devices having various functions have appeared. Such electronic devices generally have a convergence function that compositely performs one or more functions.

As functional differences have been considerably reduced among electronic devices, each manufacturer has made efforts to increase the rigidity of electronic devices, to strengthen the design aspect of the electronic devices, and to slim the electronic devices in order to meet the consumers' purchasing needs. As one aspect of such a trend, efforts have been made to efficiently secure a space for arranging one or more antenna devices that shall be essentially provided for communication among the components of the electronic devices, and at the same time, to prevent the degradation of the radiating performance of the antenna devices in advance, and to make the antenna device exhibit an excellent performance.

According to various examples of the related art, antenna devices used in an electronic device have an inverted-F antenna (IFA) or a monopole radiator as a basic structure, and the volume and number of the mounted antenna radiators may be determined based on the frequency, bandwidth, and the kind of each service. For example, although there is a difference in frequency from region to region in the world, typically a low frequency band of 700 MHz to 900 MHz, a middle frequency band of 1,700 MHz to 2,100 MHz, and a high frequency band of 2,300 MHz to 2,700 MHz are used as the main communication bands. Alternatively, an electronic device may use a frequency for various wireless communication services, such as Bluetooth (BT), a global navigation satellite system (GNSS), and Wi-Fi.

In order to satisfy all the above-described communication bands in a limited antenna volume, it is practically difficult for an electronic device to secure the entire band with only a single antenna. In order to overcome this problem, a number of antennas are divisionally designed in an electronic device by lumping service bands, which have similar frequency bands, with each other.

The exterior of the electronic device may include a metallic member (e.g., a metal bezel). In such a case, unlike the case in which the exterior includes an injection-molded product of a dielectric material, the antenna of the electronic device may be designed by using the metallic member as an antenna radiator, rather than designing a separate antenna. For example, in the case where a metal bezel, which is used in the rim of the electronic device, is utilized as an antenna radiator, the antenna of the electronic device may be designed to include a main antenna radiator and one or more coupling antenna radiators with a split portion formed of a dielectric material being interposed therebetween. Since the electronic device includes an electric gap formed by a split portion between the main antenna and the coupling antenna radiator, it is possible to form a resonance in a desired frequency band by using the coupling antenna radiator.

However, in the case where the user grasps the electronic device so that a contact occurs with respect to the split portion of the antenna, the capacitance component of the split portion may be changed such that the radiating performance of the antenna may be remarkably degraded.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure are to provide a device and method for preventing a radiating performance from being degraded by the capacitance change of a bezel portion that is used as an antenna in an electronic device.

In accordance with an aspect of the present disclosure, an electronic device is provided. The electronic device includes a housing that includes a first face, a second face that is directed opposite to the first face, and a side face that at least partially encloses a space between the first face and the second face, a first metallic member that forms a first portion of the side face, and includes a first end and a second end, a second metallic member that forms a second portion of the side face, and is positioned adjacent to the first end of the first metallic member and electrically insulated from the first metallic member, a third metallic member that forms a third portion of the side face, and is positioned adjacent to the second end of the first metallic member and electrically insulated from the first metallic member, a communication circuit that is electrically connected to at least one of the first metallic member, the second metallic member, and the third metallic member, at least one ground member that is included within the housing, a sensor configured to detect whether an external object comes in contact with at least one of the first metallic member, the second metallic member, and the third metallic member, and to generate a signal, and a circuit configured to change an electric path between at least one of the first metallic member, the second metallic member, and the third metallic member, and the ground member, at least partially based on the generated signal.

In accordance with an aspect of the present disclosure, a method of operating an electronic device is provided. The method includes a housing that includes a first face, a second face that is directed opposite to the first face, and a side face that at least partially enclose a space between the first face and the second face, a first metallic member that forms a first portion of the side face, and includes a first end and a second end, a second metallic member that forms a second portion of the side face, and is positioned adjacent to the first end of the first metallic member and electrically insulated from the first metallic member, a third metallic member that forms a third portion of the side face, and is positioned adjacent to the second end of the first metallic member and electrically insulated from the first metallic member, a communication circuit that is electrically connected to at least one of the first metallic member, the second metallic member, and the third metallic member, and at least one ground member that is included within the housing.

The operating method may include detecting, by the electronic device, whether an external object comes in contact with at least one of the first metallic member, the second metallic member, and the third metallic member, and changing an electric path between at least one of the first metallic member, the second metallic member, and the third metallic member, and the ground member, at least partially based on the detected result.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
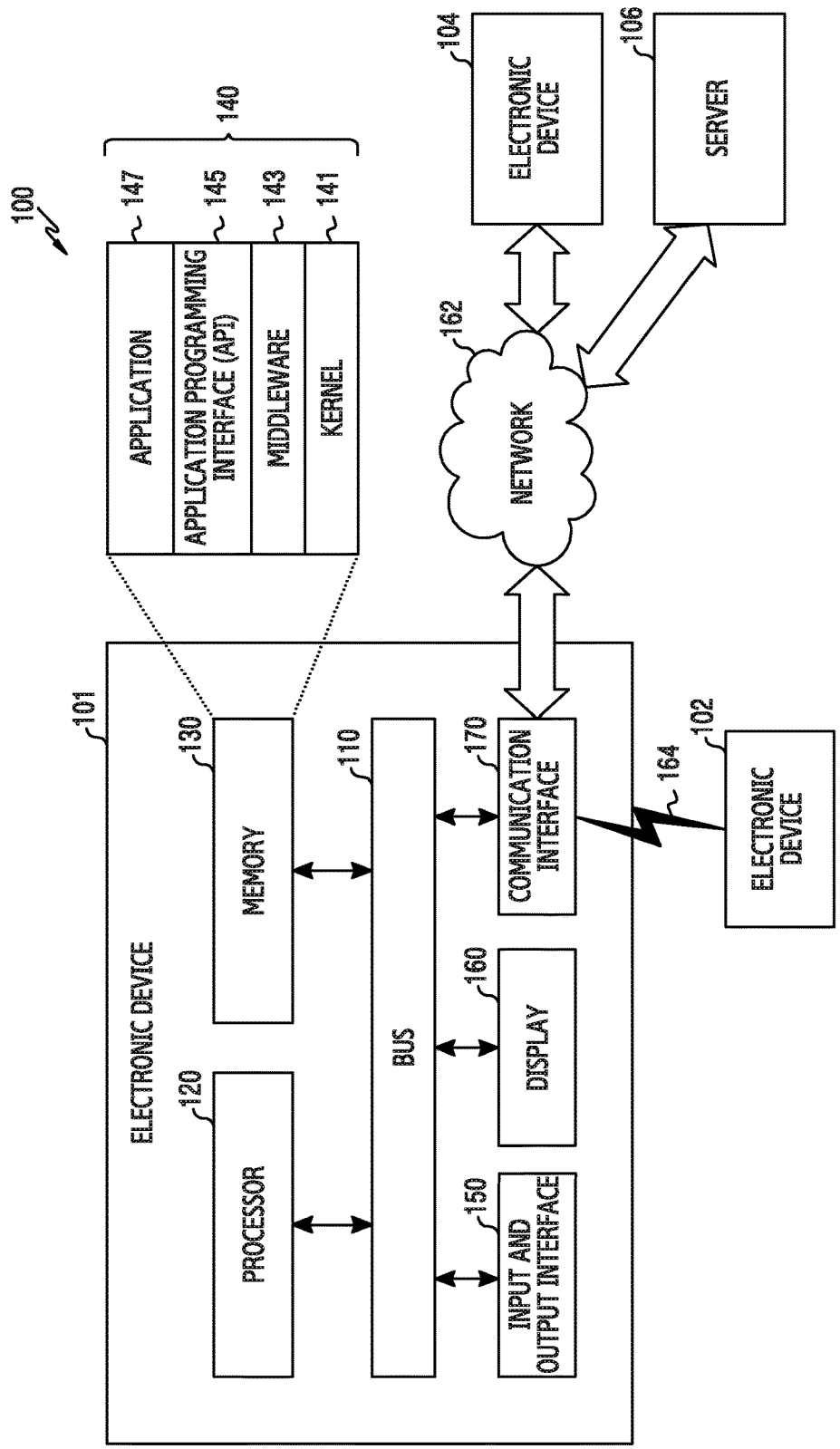
FIG. 1 is a view illustrating a network environment that includes an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary.

Accordingly, those of ordinary skill in the art will recognize that various changes and modifications of the various embodiments described herein can be made without departing from the scope and spirit of the present disclosure. In addition, descriptions of well-known functions and constructions are omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "have", "may have", "include", or "may include" used in the various embodiments of the present disclosure indicate the presence of disclosed corresponding functions, operations, elements, and the like, and do not limit additional one or more functions, operations, elements, and the like. In addition, it should be understood that the terms "include" or "have" used in the various embodiments of the present disclosure are to indicate the presence of features, numbers, operations, elements, parts, or a combination thereof described in the specifications, and do not preclude the presence or addition of one or more other features, numbers, operations, elements, parts, or a combination thereof.

The terms "A or B", "at least one of A or/and B" or "one or more of A or/and B" used in the various embodiments of the present disclosure include any and all combinations of words enumerated with it. For example, "A or B", "at least one of A and B" or "at least one of A or B" means (1) including at least one A, (2) including at least one B, or (3) including both at least one A and at least one B.

Although the term such as "first" and "second" used in various embodiments of the present disclosure may modify various elements of various embodiments of the present disclosure, these terms do not limit the corresponding elements. For example, these terms do not limit an order and/or importance of the corresponding elements. These terms may be used for the purpose of distinguishing one element from another element. For example, a first user device and a second user device all indicate user devices and may indicate different user devices. For example, a first element may be named a second element without departing from the scope of right of various embodiments of the present disclosure, and similarly, a second element may be named a first element.

It will be understood that when an element (e.g., first element) is "connected to" or "(operatively or communicatively) coupled with/to" to another element (e.g., second element), the element may be directly connected or coupled to another element, and there may be an intervening element (e.g., third element) between the element and another element. To the contrary, it will be understood that when an element (e.g., first element) is "directly connected" or "directly coupled" to another element (e.g., second element), there is no intervening element (e.g., third element) between the element and another element.

The expression "configured to (or set to)" used in various embodiments of the present disclosure may be replaced with "suitable for", "having the capacity to", "designed to", "adapted to", "made to", or "capable of" according to a situation. The term "configured to (set to)" does not necessarily mean "specifically designed to" in a hardware level. Instead, the expression "apparatus configured to . . . " may mean that the apparatus is "capable of . . . " along with other devices or parts in a certain situation. For example, "a processor configured to (set to) perform A, B, and C" may be a dedicated processor, e.g., an embedded processor, for performing a corresponding operation, or a generic-purpose processor, e.g., a central processing unit (CPU) or an application processor (AP), capable of performing a corresponding operation by executing one or more software programs stored in a memory device.

The terms as used herein are used merely to describe certain embodiments and are not intended to limit the present disclosure. As used herein, singular forms may include plural forms as well unless the context explicitly indicates otherwise. Further, all the terms used herein, including technical and scientific terms, should be interpreted to have the same meanings as commonly understood by those skilled in the art to which the present disclosure pertains, and should not be interpreted to have ideal or excessively formal meanings unless explicitly defined in various embodiments of the present disclosure.

An electronic device according to various embodiments of the present disclosure, for example, may include at least one of a smartphone, a tablet personal computer (PC), a mobile phone, a video phone, an electronic book (e-book) reader, a desktop PC, a laptop PC, a netbook computer, a workstation, a server, a personal digital assistant (PDA), a portable multimedia player (PMP), an moving picture experts group phase 1 or phase 2 (MPEG-1 or MPEG-2) audio layer 3 (MP3) player, a mobile medical appliance, a camera, and a wearable device (e.g., smart glasses, a head-mounted-device (HMD), electronic clothes, an electronic bracelet, an electronic necklace, an electronic appcessory, an electronic tattoo, a smart mirror, or a smart watch and the like).

According to various embodiments of the present disclosure, the electronic device may be a smart home appliance. The home appliance may include at least one of, for example, a television, a digital versatile disc (DVD) player, an audio, a refrigerator, an air conditioner, a vacuum cleaner, an oven, a microwave oven, a washing machine, an air cleaner, a set-top box, a home automation control panel, a security control panel, a television (TV) box (e.g., Samsung HomeSync™ Apple TV™, or Google TV™), a game console (e.g., Xbox™ and PlayStation™), an electronic dictionary, an electronic key, a camcorder, and an electronic photo frame or the like.

According to another embodiment of the present disclosure, the electronic device may include at least one of various medical devices (e.g., various portable medical measuring devices (a blood glucose monitoring device, a heart rate monitoring device, a blood pressure measuring device, a body temperature measuring device, or the like), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, or the like.).

According to various embodiments of the present disclosure, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 is a view illustrating a network environment that includes an electronic device according to various embodiments of the present disclosure.

Referring to FIG. 1, an electronic device 101 in a network environment 100, according to various embodiments of the present disclosure, is illustrated. The electronic device 101 may include a bus 110, a processor 120 (e.g., including processing circuitry), a memory 130, an input/output interface 150 (e.g., including input/output circuitry), a display 160 (e.g., including a display panel and display circuitry), and a communication interface 170 (e.g., including communication circuitry). In various embodiments of the present disclosure, the electronic device 101 may omit at least one of the above components or may further include other components.

The bus 110 may include, for example, a circuit that interconnects the components 120 to 170 and delivers communication (e.g., a control message and/or data) between the components 120 to 170.

The processor 120 may include one or more of a CPU, an AP, and a communication processor (CP). For example, the processor 120 may carry out operations or data processing relating to control and/or communication of at least one other components of the electronic device 101.

According to an embodiment of the present disclosure, a processor 120 may perform a control to switch a connection state for a sub-ground of a main antenna to correspond to a capacitance change of a bezel portion (e.g., a lower bezel portion) that is used as an antenna. For example, the processor 120 may generate a resonant path by using a main antenna and a first coupling antenna. When a contact with respect to a split portion between the main antenna and the first coupling antenna is detected, the processor 120 may sense that the capacitance of the bezel portion, which is used as the antenna, is changed. The processor 120 may perform a control such that an electric connection with respect to the sub-ground of the main antenna is cut off (opened) to correspond to the change in the capacitance of the bezel portion that is used as an antenna. In this case, the electronic device 101 may generate a new resonant path by using the main antenna and a second coupling antenna. For example, the sub-ground may be designed to minimize the influence of a signal radiating performance by other peripheral components, such as an ear jack, or to isolate the second coupling antenna such that no signal is fed to the second coupling antenna. For example, the processor 120 may generate a resonant path by using the second coupling antenna. When a contact with respect to the second coupling antenna is detected, the processor 120 may sense that the capacitance of the bezel portion, which is used as the antenna, is changed. The processor 120 may perform a control such that the electric connection with respect to the sub-ground of the main antenna is cut off (opened) to correspond to the change in the capacitance of the bezel portion that is used as an antenna. In this case, the electronic device 101 may generate a new resonant path by using the main antenna and the second coupling antenna.

The memory 130 may include a volatile memory and/or a non-volatile memory. The memory 130 may store, for example, instructions or data (e.g. motion pattern information, motion data) relevant to at least one other element of the electronic device 101. According to an embodiment of the present disclosure, the memory 130 may store software and/or a program 140. For example, the program may include a kernel 141, middleware 143, an application programming interface (API) 145, and an application (or "application program") 147. At least some of the kernel 141, the middleware 143, and the API 145 may be referred to as an operating system (OS).

The kernel 141 may control or manage system resources (e.g., the bus 110, the processor 120, or the memory 130) used for performing an operation or function implemented by the other programs (e.g., the middleware 143, the API 145, or the application 147). Furthermore, the kernel 141 may provide an interface through which the middleware 143, the API 145, or the application 147 may access the individual elements of the electronic device 101 to control or manage the system resources.

The middleware 143, for example, may function as an intermediary for allowing the API 145 or the application 147 to communicate with the kernel 141 to exchange data.

In addition, the middleware 143 may process one or more task requests received from the application 147 according to priorities thereof. For example, the middleware 143 may assign priorities for using the system resources (e.g., the bus 110, the processor 120, the memory 130, or the like) of the electronic device 101, to at least one of the application 147. For example, the middleware 143 may perform scheduling or loading balancing on the one or more task requests by processing the one or more task requests according to the priorities assigned thereto.

The API 145 is an interface through which the applications 147 control functions provided from the kernel 141 or the middleware 143, and may include, for example, at least one interface or function (e.g., instruction) for file control, window control, image processing, or text control.

The input/output interface 150, for example, may function as an interface that may transfer instructions or data input from a user or another external device to the other element(s) of the electronic device 101. Furthermore, the input/output interface 150 may output the instructions or data received from the other element(s) of the electronic device 101 to the user or another external device.

Examples of the display 160 may include a liquid crystal display (LCD), a light-emitting diode (LED) display, an organic light-emitting diode (OLED) display, a microelectromechanical systems (MEMS) display, and an electronic paper display. The display 160, for example, may display various types of content (e.g., text, images, videos, icons, or symbols) to the user. The display 160 may include a touch screen and receive, for example, a touch, gesture, proximity, or hovering input using an electronic pen or the user's body part.

The communication interface 170, for example, may set communication between the electronic device 101 and an external device (e.g., the first external electronic device 102, the second external electronic device 104, or a server 106). For example, the communication interface 170 may be connected to a network 162 through wireless or wired communication to communicate with the external device (e.g., the second external electronic device 104 or the server 106).

The wireless communication may use at least one of, for example, long term evolution (LTE), LTE-advance (LTE-A), code division multiple access (CDMA), wideband CDMA (WCDMA), universal mobile telecommunications system (UMTS), wireless broadband (WiBro), and global system for mobile communications (GSM), as a cellular communication protocol. In addition, the wireless communication may include, for example, short range communication 164. The short-range communication 164 may be performed by using at least one of, for example, Wi-Fi, Bluetooth, near field communication (NFC), and GNSS. The GNSS may include at least one of, for example, a GPS, a global navigation satellite system (Glonass), a Beidou navigation satellite system (hereinafter, referred to as "Beidou"), and Galileo (European global satellite-based navigation system or the like). Hereinafter, in the present disclosure, the "GPS" may be interchangeably used with the "GNSS". The wired communication may include at least one of, for example, a universal serial bus (USB), a high definition multimedia interface (HDMI), recommended standard-232 (RS-232), and a plain old telephone service (POTS). The network 162 may include at least one of a communication network such as a computer network (e.g., a local area network (LAN) or a wireless area network (WAN)), the Internet, and a telephone network.

Each of the first and second external electronic devices 102 and 104 may be of a type identical to or different from that of the electronic device 101.

According to an embodiment of the present disclosure, the server 106 may include a group of one or more servers. According to various embodiments of the present disclosure, all or some of the operations performed in the electronic device 101 may be performed in another electronic device or a plurality of electronic devices (e.g., the electronic devices 102 and 104 or the server 106). According to an embodiment of the present disclosure, when the electronic device 101 has to perform some functions or services automatically or in response to a request, the electronic device 101 may make a request for performing at least some functions relating thereto to another device (e.g., the electronic device 102 or 104 or the server 106) instead of performing the functions or services by itself or in addition. Another electronic device (e.g., the electronic device 102 or 104 or the server 106) may execute the requested functions or the additional functions, and may deliver a result of the execution to the electronic device 101. The electronic device 101 may process the received result as it is or additionally to provide the requested functions or services. To achieve this, for example, cloud computing, distributed computing, or client-server computing technology may be used.

In describing the present disclosure, a metal bezel arranged along the rim of an electronic device is described as a metallic member that is utilized as an antenna radiator by way of an example, but is not limited thereto. For example, various metal-made structures provided in the electronic device may also be utilized as an antenna radiator. According to one embodiment of the present disclosure, an electronic device applied to an embodiment of the present disclosure is a bar-type electronic device, but is not limited thereto. For example, the electronic device may be an electronic device or a wearable device that adopts various opening/closing methods.

Figure 2:
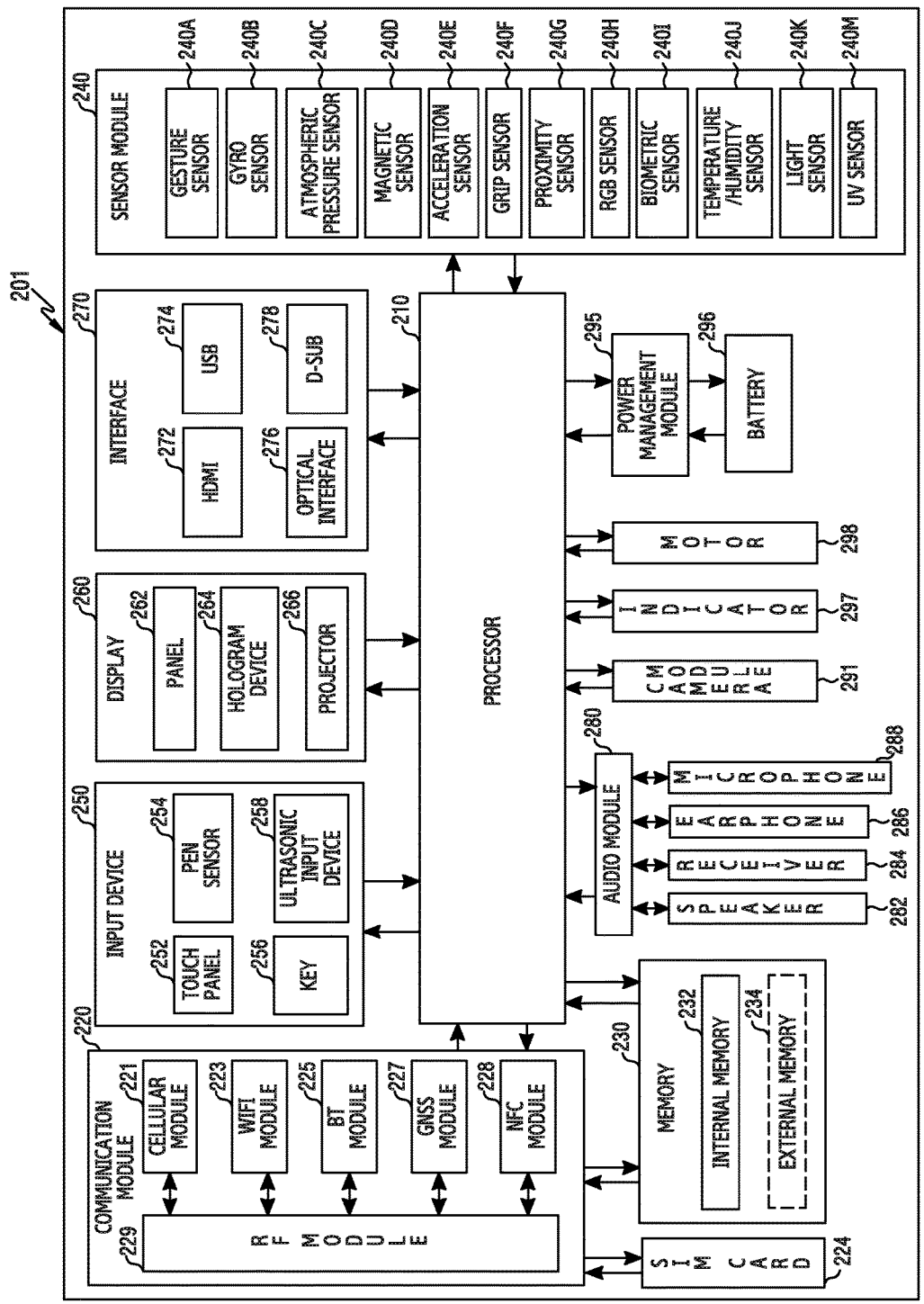
FIG. 2 is a block diagram of an electronic device according to various embodiments of the present disclosure.

FIG. 2 is a block diagram of an electronic device 201 according to various embodiments of the present disclosure. The electronic device 201 may include, for example, all or a part of the electronic device 101 illustrated in FIG. 1. The electronic device 201 may include at least one AP 210, a communication module 220, a subscriber identification module (SIM) card 224, a memory 230, a sensor module 240, an input device 250, a display 260, an interface 270, an audio module 280, a camera module 291, a power management module 295, a battery 296, an indicator 297, and a motor 298.

Referring to FIG. 2, the AP 210 may, for example, control a plurality of hardware or software elements connected thereto and perform a variety of data processing and calculations by driving an operating system or application programs. The AP 210 may be implemented as, for example, a system on chip (SoC).

According to an embodiment of the present disclosure, the AP 210 may further include a graphic processing unit (GPU) and/or an image signal processor (ISP). The AP 210 may include at least some of the elements (e.g., a cellular module 221) illustrated in FIG. 2. The AP 210 may load commands or data, received from at least one other element (e.g., a non-volatile memory), in a volatile memory to process the loaded commands or data, and may store various types of data in the non-volatile memory.

The communication module 220 may have a configuration that is the same as or similar to that of the communication interface 160 of FIG. 1. The communication module 220 may include, for example, a cellular module 221, a Wi-Fi module 223, a BT module 225, a GNSS module 227, an NFC module 228, and a radio frequency (RF) module 229. The communication module 220 provides a function of transmitting/receiving a signal. Accordingly, the communication module 220 may be referred to as a "reception unit", a "transmission unit", a "transmission and reception unit", a "communication unit", or the like.

The cellular module 221 may provide, for example, a voice call, a video call, a text message service, or an Internet service through a communication network. According to an embodiment of the present disclosure, the cellular module 221 may distinguish and authenticate the electronic device 201 in the communication network by using a subscriber identification module (e.g., the SIM card 224).

According to an embodiment of the present disclosure, the cellular module 221 may perform at least some of the functions that the AP 210 may provide. According to an embodiment of the present disclosure, the cellular module 221 may include a CP.

The Wi-Fi module 223, the BT module 225, the GNSS module 227, or the NFC module 228 may include, for example, a processor for processing data transmitted/received through the corresponding module.

According to an embodiment of the present disclosure, at least some (e.g., two or more) of the cellular module 221, the Wi-Fi module 223, the BT module 225, the GNSS module 227, and the NFC module 228 may be included in a single integrated chip (IC) or IC package.

The RF module 229 may, for example, transmit/receive a communication signal (e.g., an RF signal). The RF module 229 may include, for example, a transceiver, a power amp module (PAM), a frequency filter, a low noise amplifier (LNA), or an antenna.

According to another embodiment of the present disclosure, at least one of the cellular module 221, the Wi-Fi module 223, the BT module 225, the GNSS module 227, and the NFC module 228 may transmit/receive an RF signal through a separate RF module.

The SIM card 224 may include, for example, a card including a subscriber identification module and/or an embedded SIM, and may further include unique identification information (e.g., an integrated circuit card identifier (ICCID)) or subscriber information (e.g., international mobile subscriber identity (IMSI)).

The memory 230 may include, for example, an internal memory 232 or an external memory 234. The internal memory 232 may include, for example, at least one of a volatile memory (e.g., a dynamic random access memory (DRAM), a static RAM (SRAM), a synchronous dynamic RAM (SDRAM), or the like) and a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), a hard disc drive, or a solid state drive (SSD)).

The external memory 234 may further include a flash drive, for example, a compact flash (CF), a secure digital (SD), a micro SD (Micro-SD), a mini SD (Mini-SD), an extreme digital (xD), a memory stick, or the like. The external memory 234 may be functionally and/or physically connected to the electronic device 201 through various interfaces.

The sensor module 240 may, for example, measure a physical quantity or detect an operating state of the electronic device 201, and may convert the measured or detected information into an electrical signal. The sensor module 240 may include, for example, at least one of, a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., red, green, and blue (RGB) sensor), a bio-sensor 240I, a temperature/humidity sensor 240J, an illumination sensor 240K, and a ultra violet (UV) sensor 240M. Additionally or alternatively, the sensor module 240 may include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. In an embodiment of the present disclosure, the electronic device 201 may further include a processor that is configured as a part of the AP 210 or a separate element from the AP 210 in order to control the sensor module 240, thereby controlling the sensor module 240 while the AP 2710 is in a sleep state.

The input device 250 may include, for example, a touch panel 252, a (digital) pen sensor 254, a key 256, or an ultrasonic input device 258. The touch panel 252 may use at least one of, for example, a capacitive type, a resistive type, an infrared type, and an ultrasonic type. In addition, the touch panel 252 may further include a control circuit. The touch panel 252 may further include a tactile layer to provide a tactile reaction to a user.

The (digital) pen sensor 254 may be, for example, a part of the touch panel, or may include a separate recognition sheet. The key 256 may include, for example, a physical button, an optical key, or a keypad. The ultrasonic input device 258 may identify data by detecting acoustic waves with a microphone (e.g., a microphone 288) of the electronic device 201 through an input unit for generating an ultrasonic signal.

The display 260 (e.g., the display 160) may include a panel 262, a hologram device 264, or a projector 266. The panel 262 may include a configuration that is the same as or similar to that of the display 160 of FIG. 1. The panel 262 may be implemented to be, for example, flexible, transparent, or wearable. The panel 262 may be configured as a single module integrated with the touch panel 252. The hologram device 264 may show a stereoscopic image in the air using interference of light. The projector 266 may project light onto a screen to display an image. The screen may be located, for example, in the interior of or on the exterior of the electronic device 201. According to an embodiment of the present disclosure, the display 260 may further include a control circuit for controlling the panel 262, the hologram device 264, or the projector 266.

The interface 270 may include, for example, a HDMI 272, USB 274, an optical interface 276, or a D-subminiature (D-sub) 278. The interface 270 may be included in, for example, the communication interface 160 illustrated in FIG. 1. Additionally or alternatively, the interface 270 may include, for example, a mobile high-definition link (MHL) interface, a SD card/multi-media card (MMC) interface, or an infrared data association (IrDA) standard interface.

The audio module 280 may, for example, convert a sound into an electrical signal, and vice versa. At least some elements of the audio module 280 may be included in, for example, the input/output interface 140 illustrated in FIG. 1. The audio module 280 may, for example, process sound information that is input or output through the speaker 282, the receiver 284, the earphones 286, the microphone 288, or the like.

The camera module 291 may be, for example, a device that can take a still image or a moving image, and according to an embodiment of the present disclosure, the camera module 291 may include one or more image sensors (e.g., a front sensor or a rear sensor), a lens, an ISP, or a flash (e.g., an LED or a xenon lamp).

The power management module 295 may manage, for example, the power of the electronic device 201. According to an embodiment of the present disclosure, the power management module 295 may include a power management integrated circuit (PMIC), a charger IC, or a battery 296 or fuel gauge. The power management module 295 may receive power from the outside in a wired and/or wireless manner. For example, the power management module 295 may receive power from the outside through a wireless charging method, such as a magnetic resonance type, a magnetic induction type, an electromagnetic wave type, or the like. The power management module 295 may further include a coil loop, a resonance circuit, a rectifier, or the like, which is an additional circuit for receiving power in a wireless manner. The battery gauge may measure, for example, the residual quantity of the battery 296, and a voltage, a current, or a temperature while charging.

The battery 296 may include, for example, a rechargeable battery and/or a solar battery.

The indicator 297 may indicate a specific state of the electronic device 201 or a part thereof (e.g., the AP 210), for example, a booting state, a message state, a charging state, or the like. The motor 298 may convert an electrical signal into a mechanical vibration, and may generate a vibration or haptic effect. Although not illustrated, the electronic device 201 may include a processing unit (e.g., a GPU) for mobile TV support. The processing device for mobile TV support may, for example, process media data according to a standard of digital multimedia broadcasting (DMB), digital video broadcasting (DVB), media flow, or the like.

Each of the components of the electronic device according to the present disclosure may be implemented by one or more components and the name of the corresponding component may vary depending on a type of the electronic device. In various embodiments of the present disclosure, the electronic device may include at least one of the above-described elements. Some of the above-described elements may be omitted from the electronic device, or the electronic device may further include additional elements. Further, some of the elements of the electronic device according to various embodiments of the present disclosure may be coupled to form a single entity while performing the same functions as those of the corresponding elements before the coupling.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 3:
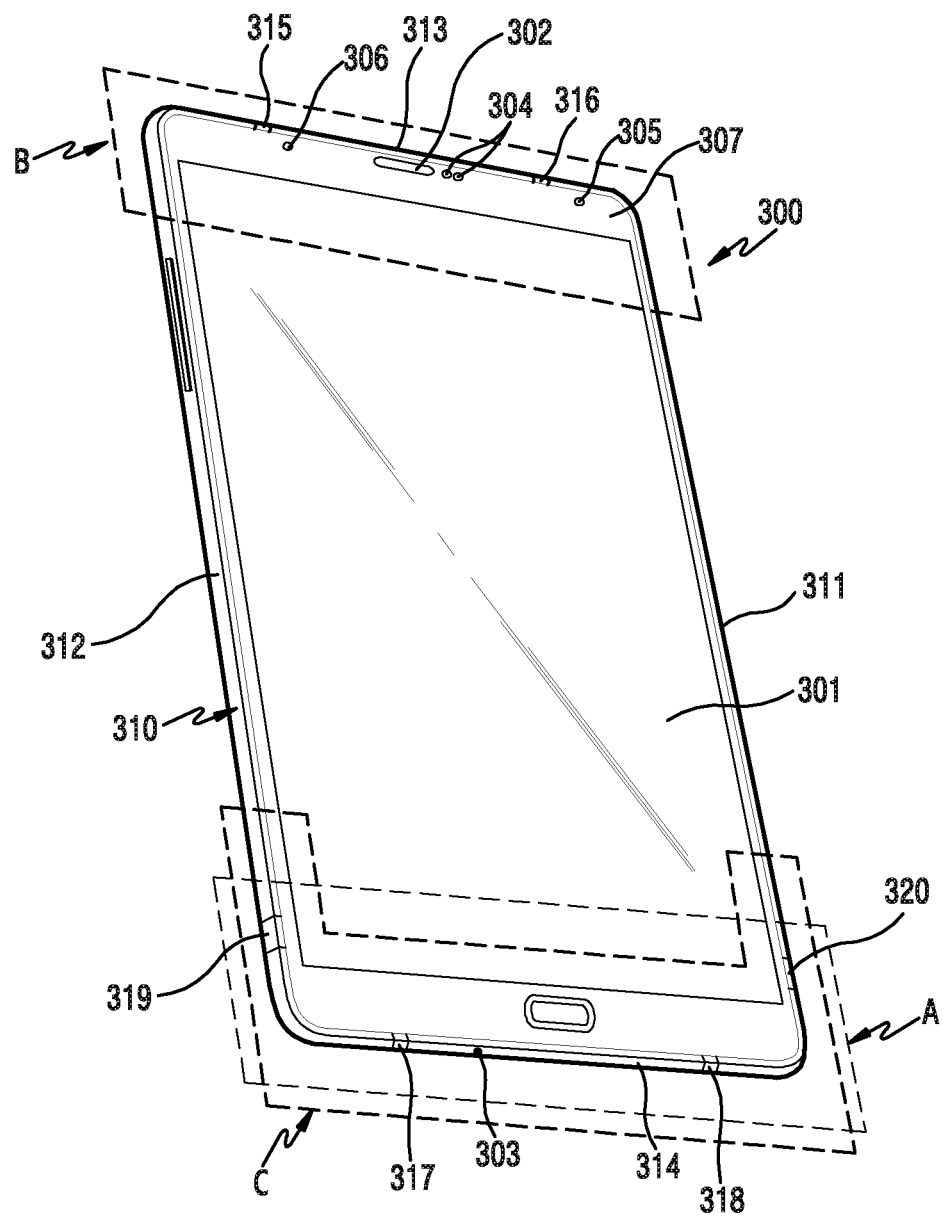
FIG. 3 is a perspective view illustrating an electronic device according to various embodiments of the present disclosure.

FIG. 3 is a perspective view illustrating an electronic device 300 according to various embodiments of the present disclosure.

Referring to FIG. 3, a display 301 may be provided on the front face 307 of the electronic device 300. A speaker device 302 may be provided above the display 301 so as to receive the voice of a counterpart. A microphone device 303 may be provided below the display 301 so as to transmit the voice of the user of the electronic device.

According to an embodiment of the present disclosure, components for conducting various functions of the electronic device 300 may be arranged around the speaker device 302. The components may include one or more sensor modules 304. The sensor modules 304 may include at least one of, for example, an illuminance sensor (e.g., an optical sensor), a proximity sensor, an infrared sensor, and an ultrasonic sensor. According to one embodiment of the present disclosure, the components may include a camera device 305.

According to one embodiment of the present disclosure, the components may include an LED indicator 306 that informs the user of the status information of the electronic device 300.

According to various embodiments of the present disclosure, the electronic device 300 may include a metal bezel 310 (that may serve as at least a partial region of, for example, a metal housing).

According to one embodiment of the present disclosure, the metal bezel 301 may be arranged along the rim of the electronic device 300, and may be disposed to expand to at least a partial region of the rear face of the electronic device 300 that extends from the rim.

According to one embodiment of the present disclosure, the metal bezel 310 may be formed in a loop shape along the rim of the electronic device 300.

According to one embodiment of the present disclosure, the metal bezel 310 may only be formed on at least a partial region of the rim of the electronic device 300.

According to various embodiments of the present disclosure, the metal bezel 310 may have a loop shape along the rim, and may be arranged to serve as the whole or a part of the thickness of the electronic device 300.

According to one embodiment of the present disclosure, when viewed from the front side of the electronic device 300, the metal bezel 310 may include a right bezel section 311, a left bezel section 312, an upper bezel section 313, a lower bezel section 314.

According to various embodiments of the present disclosure, the antenna device may be disposed in a region of the electronic device 300 (e.g., the lower region ("A" region) or the upper region ("B" region)).

According to one embodiment of the present disclosure, the lower bezel section 314 may be used as the main antenna or a radiator by one or more split portions 317 and 318. For example, with reference to the split portions 317 and 318, a first sub-bezel section positioned at the left side of the lower bezel section 314 may be used as a first coupling antenna radiator, and a second sub-bezel section positioned at the right side may be used as a second coupling antenna radiator. For example, the first sub-bezel section may be formed with a region from the first split portion 317 positioned at the left side of the lower bezel section 314 to a grounded position of the left bezel section 312. The second sub-bezel section may be formed with a region from the second split portion 318 positioned at the right side of the lower bezel section 314 to a grounded position of the right bezel section 311.

According to one embodiment of the present disclosure, the lower bezel section 314 may serve as an antenna radiator that operates in at least two operating frequency bands by using the first sub-bezel section or the second sub-bezel section.

In the embodiment of the present disclosure, the split portions 317 and 318 are formed in the lower portion of the electronic device 300, and the lower bezel section 314 and the left and right non-split bezel sections 311 and 312 with reference to the split portions 317 and 318 are utilized as antenna radiators. However, if a space is allowed, antenna radiators may also be formed in the upper region ("B" region) of the electronic device in the same configuration as that described above.

According to various embodiments of the present disclosure, the right bezel section 311 may be utilized as an antenna radiator (e.g., a coupling antenna radiator) by a ground region that is grounded to a non-split portion. However, without being limited thereto, the left bezel section 312 may also be utilized as an antenna radiator (e.g., a coupling antenna radiator) by a ground region that is grounded to a non-split portion.

According to various embodiments of the present disclosure, the left bezel section 312 region ("C" region) may be used as a main antenna, and may also be formed by the ground region ("C" region) of the right bezel section 311.

According to one embodiment of the present disclosure, the left bezel section 312 may serve as an antenna radiator as a unit bezel section by the other pair of split portions 319 and 320.

Figure 4:
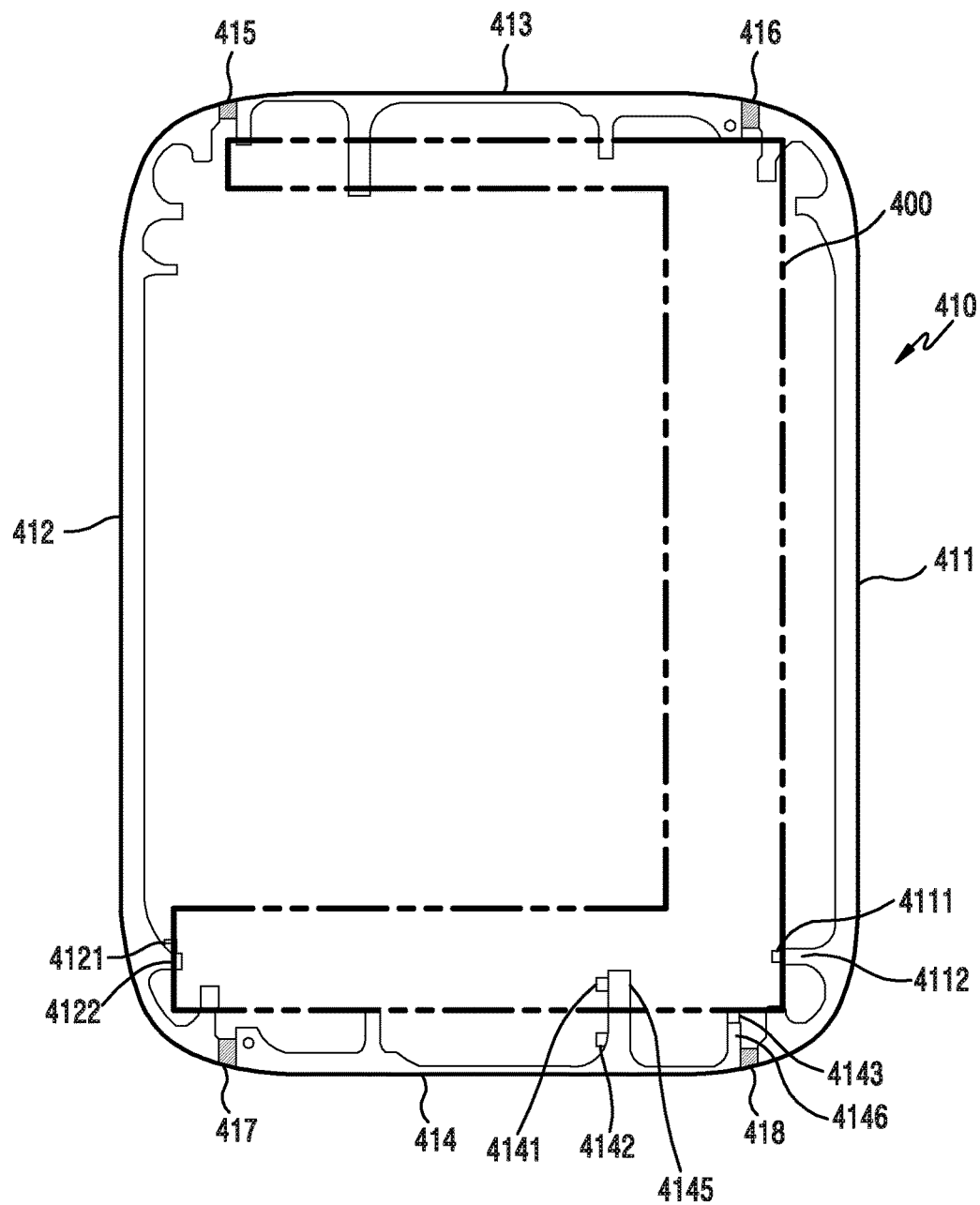
FIG. 4 is a diagram illustrating a configuration of an antenna device according to various embodiments of the present disclosure.

FIG. 4 is a diagram illustrating a configuration of an antenna device according to various embodiments of the present disclosure.

According to various embodiments of the present disclosure, the metal bezel 410 of FIG. 4 is an embodiment of a metal bezel that is the same as or similar to, or different from the metal bezel 310 of FIG. 3.

Referring to FIG. 4, when viewed from the front side, the metal bezel 410 may include a right bezel section 411, a left bezel section 412, an upper bezel section 413, and a lower bezel section 414.

According to one embodiment of the present disclosure, the upper bezel section 413 may be maintained in the state where it is separated from the right bezel section 411 and the left bezel section 412 by one or more split portions (e.g., a pair of split portions 415 and 416) that are formed at a predetermined interval.

According to one embodiment of the present disclosure, the lower bezel section 414 may be maintained in the state where it is separated or insulated from the right bezel section 411 and the left bezel section 412 by one or more split portions (e.g., a pair of split portions 417 and 418) that are formed at a predetermined interval.

According to one embodiment of the present disclosure, the split portions 415, 416, 417, and 418 may include a dielectric material.

According to various embodiments of the present disclosure, the lower bezel section 414 may include a predetermined power feeding piece 4145.

According to one embodiment of the present disclosure, a board 400 is provided in the electronic device, the lower bezel section 414 may be fed with power from a power feeding portion of the board 400, or may be connected to the power feeding portion of the board 400 by a separate electric connection member 4141 (e.g., a C-clip).

According to various embodiments of the present disclosure, the lower bezel section 414 may include a plurality of ground pieces 4145 and 4146 that are formed at different positions.

According to one embodiment of the present disclosure, the board 400 is provided in the electronic device, and the lower bezel section 414 may be electrically connected to a ground portion of the board 400, or may be electrically connected to the ground of the board 400 by separate electric connection members 4142 and 4143. For example, in the lower bezel section 414, at least a portion of the power feeding piece 4145 may be used as a first ground piece.

According to various embodiments of the present disclosure, the left bezel section 412, which is split by the first split portion 417, may include a ground piece 4122.

According to one embodiment of the present disclosure, board 400 is provided in the electronic device, and the left bezel section 412 may be electrically connected to a ground portion of the board 400, or may be electrically connected to the ground portion of the board 400 by a separate electric connection member 4121.

According to various embodiments of the present disclosure, the lower bezel section 414 and the left bezel section 412 may serve as band antenna radiators that operate in a desired operating frequency band due to the capacitance that is formed in the first split portion 417 that is formed of a non-metallic member.

According to one embodiment of the present disclosure, the lower bezel section 414 and the left bezel section 412 may serve as antenna radiators that operate in an operating frequency band corresponding to a physical length that extends from the power feeding piece of the lower bezel section 414 to the ground portion connected to the ground piece of the left bezel section 412.

According to various embodiments of the present disclosure, the right bezel section 411, which is split by the second split portion 418, may include a ground piece 4112.

According to one embodiment of the present disclosure, the board 400 is provided in the electronic device, and the right bezel section 411 may be electrically connected to a ground portion of the board 400, or may be electrically connected to the ground portion of the board by a separate electric connection member 4111.

According to various embodiments of the present disclosure, where the second ground piece 4146 of the lower bezel section 414 is switched to a non-connection state (opened), the lower bezel section 414 and the right bezel section 411 may serve as band antenna radiators that operate in a desired operating frequency band due to the capacitance that is formed in the second split portion 418 that is formed of a non-metallic member.

According to one embodiment of the present disclosure, the lower bezel section 414 and the right bezel section 411 may serve as antenna radiators that operate in an operating frequency band corresponding to a physical length that extends from the power feeding piece of the lower bezel section 414 to the ground portion connected to the ground piece of the right bezel section 411. For example, the non-connection state of the second ground piece 4146 may include a state where the electric connection of the second ground piece 4146 is cut off.

According to one embodiment of the present disclosure, the above-described power feeding piece 4145 and the ground pieces 4112, 4122, 4145, and 4146 may be conductive connecting pieces that are integrally formed with or separately formed from the metal bezel 410.

According to one embodiment of the present disclosure, the above-described electric connection members 4111, 4121, 4141, 4142, and 4143 may include one or more of various members, such as a fine cable (e.g., a metal wire), a flexible printed circuit, a C-clip, and a conductive gasket.

According to one embodiment of the present disclosure, the electric connection members 4111, 4121, 4141, 4142, and 4143 may be mounted on the metal bezel 410 or the board 400, or may be embedded in the board 400.

Figure 5A:
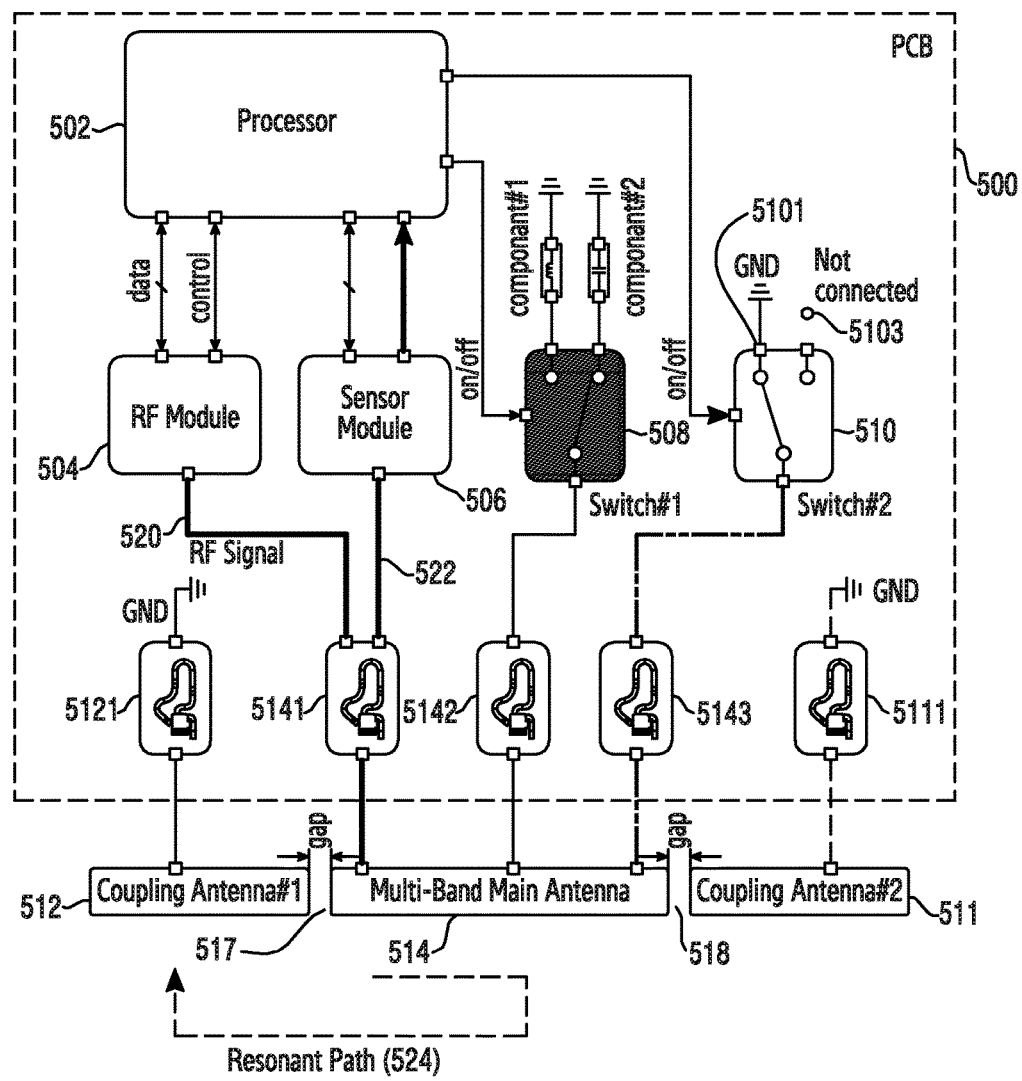
FIG. 5A is a diagram illustrating a configuration of an antenna circuit according to various embodiments of the present disclosure.

FIG. 5A is a diagram illustrating a configuration of an antenna circuit according to various embodiments of the present disclosure.

According to various embodiments of the present disclosure, a board 500 in FIG. 5A may include the board 400 of FIG. 4.

Referring to FIG. 5A, the antenna circuit may include an antenna that uses a metal housing of a split structure (hereinafter, referred to as a "metal housing antenna") and the board 500.

According to various embodiments of the present disclosure, the metal housing antenna may be divided into a main antenna 514 and coupling antennas 511 and 512 with reference to the split portions 517 and 518.

According to one embodiment of the present disclosure, the main antenna 514 and the first coupling antenna 512 may be formed with an electric gap by the first split portion 517 so as to form a resonant path that corresponds to a desired frequency band.

According to various embodiments of the present disclosure, the board 500 is disposed within the metal housing antenna, and connection members 5111, 5121, 5141, 5142, and 5143 may be included in the board 500 to be electrically connected with the metal housing antenna in order to feed or ground a signal.

According to one embodiment of the present disclosure, the connection members 5111, 5121, 5141, 5142, and 5143 may be connected to an RF module 504 for signal feeding or a ground within the board 500.

According to one embodiment of the present disclosure, the above-described connection members 5111, 5121, 5141, 5142, and 5143 may include one or more of various members, such as a fine cable (e.g., a metal wire), a flexible printed circuit (FPC), a C-clip, and a conductive gasket.

According to various embodiments of the present disclosure, the board 500 may include a processor 502, an RF module 504, a sensor module 506, or switches 508 and 510.

According to various embodiments of the present disclosure, the processor 502 may perform signal transmission and the control of the switches 508 and 510.

According to one embodiment of the present disclosure, the processor 502 may control the RF module 504 in order to transmit a signal to the outside. According to one embodiment of the present disclosure, the processor 502 may control the first switch 508 for the characteristic conversion of a resonance frequency (e.g., the shift of a resonance frequency) of the metal housing antenna.

According to one embodiment of the present disclosure, contact (e.g., touch) information of the main antenna 514 is received from the sensor module 506, and the processor 502 may control the second switch 510 in order to change a resonant path.

According to various embodiments of the present disclosure, the RF module 504 may convert the data, which is received from the processor 502 through a power feeding channel 520, into a radiatable signal, and may deliver the signal to the main antenna 514.

According to one embodiment of the present disclosure, the RF module 504 may perform power feeding for radiating the data received from the processor 502 to the outside. For example, a power feeding path may be formed to cause a signal, which is fed through the RF module 502, to flow toward a ground through the connection member 5141 (e.g., the connection member 4141 in FIG. 4) and via the metal housing antenna. In the case where the above-described power feeding path corresponds to the length of the resonant path of a resonance frequency, the power feeding path may be referred to as a resonant path.

According to various embodiments of the present disclosure, the sensor module 506 may detect, through a recognition channel 522, an access or contact of an object, which may have an influence on signal radiation, with respect to the main antenna 514 or the first split portion 517. For example, when an access or contact of the object with respect to the main antenna 514 or the first split portion 517 is detected through the connection member 5141, the sensor module 506 may transmit the detection information to the processor 502 in an interrupt format.

According to one embodiment of the present disclosure, the sensor module 506 may detect the access or contact of the object in a self-capacitance manner or a mutual-capacitance manner.

According to one embodiment of the present disclosure, the sensor module 506 may include at least one of a touch sensor and a grip sensor.

According to various embodiments of the present disclosure, the first switch 508 may convert a resonance frequency characteristic of the metal housing antenna by controlling the connection between the main antenna 514 and a plurality of resonance elements based on a control signal that is provided from the processor 502. For example, the first switch 508 may tune the ground length of the entire antenna by controlling the connection between the main antenna 514 and the plurality of resonance elements so that the current density of the antenna may be finely adjusted.

According to various embodiments of the present disclosure, the second switch 510 may control the connection of a sub-ground (e.g., the ground by the second ground piece 4146 in FIG. 4) connected to the main antenna 514 through the connection member 5143 based on a control signal that is provided from the processor 502.

According to one embodiment of the present disclosure, when the access or contact of the object is not detected through the sensor module 506, the second switch 510 may electrically connect (short circuit) the sub-ground (5101). When the sub-ground is electrically connected by the second switch 510, the second coupling antenna 511 may be separated from the main antenna 514 such that no signal is fed to the second coupling antenna 511. In this case, an electric gap may be formed in the first split portion 517 by the signal fed through the RF module 504. For example, a signal fed through the RF module 504 (e.g., an RF signal) flows toward the ground of the first coupling antenna 512 through the connection member 5141 and via the ground of the main antenna 514 so that a resonant path 524 may be formed.

According to one embodiment of the present disclosure, when the access or contact of the object is detected through the sensor module 506, the second switch 510 may cut off (open) the electric connection of the sub-ground (5103).

Figure 5B:
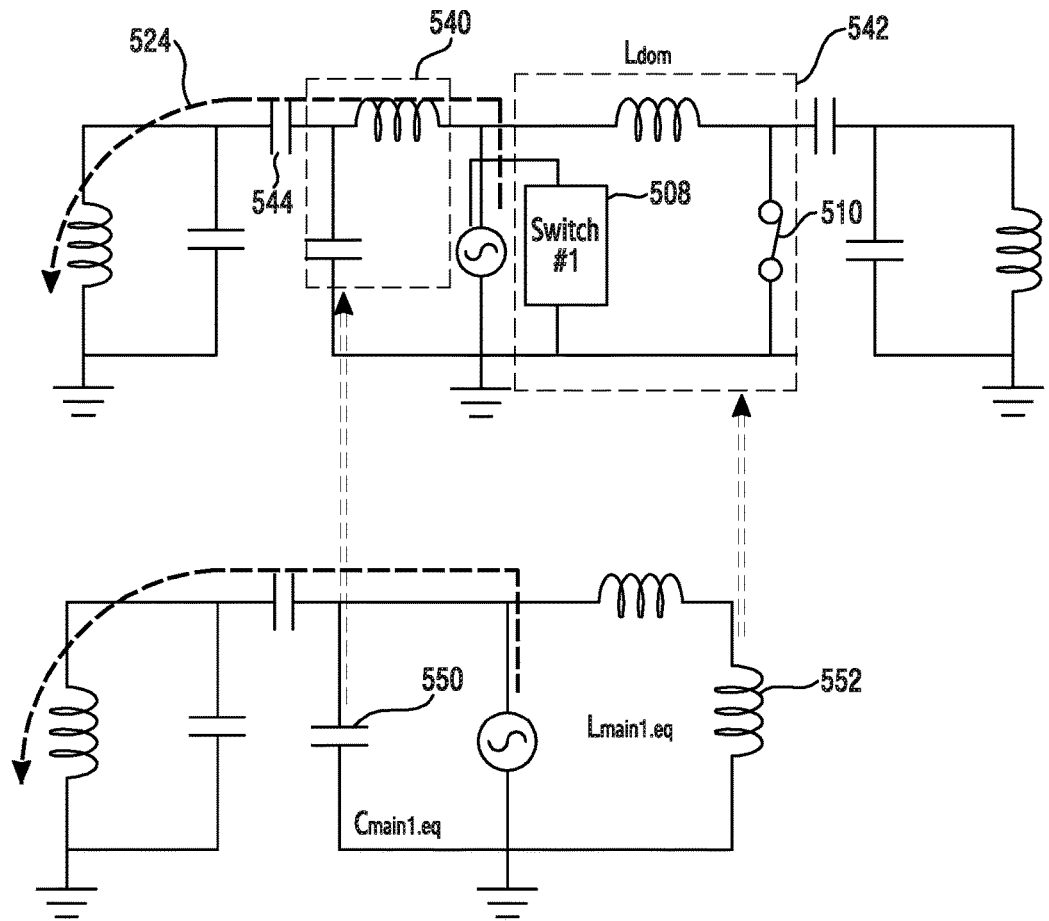
FIG. 5B is an equivalent circuit illustrating radiating flows of an antenna device according to various embodiments of the present disclosure.

FIG. 5B is an equivalent circuit illustrating radiating flows of an antenna device according to various embodiments of the present disclosure.

According to various embodiments of the present disclosure, the antenna circuit configured on the board 500 of FIG. 5A may be expressed as the equivalent circuit of FIG. 5B.

Referring to FIG. 5B, in the case where the sub-ground is electrically connected by the second switch 510 (e.g., the second switch 510 of FIG. 5A), an inductance component ($L_{dom}$) 542 may be expressed by an inductance ($L_{main1.eq}$) 552, and a parasitic inductance component 540 serially connected to the capacitance may be expressed by an equivalent capacitance ($C_{main1.eq}$) 550.

According to one embodiment of the present disclosure, a resonant path 524 (the resonant path 524 of FIG. 5A) may be formed in the direction of the equivalent capacitance 550 where a signal fed from the RF module 504 of FIG. 5A is in the capacitance direction of the equivalent circuit. For example, a signal fed from the RF module 504 may be coupled to the first coupling antenna 512 of FIG. 5A due to the capacitance component 544 formed in the first split portion 517 in FIG. 5A so as to form a power feeding path having a length corresponding to the resonance frequency, thereby forming a resonance frequency.

According to one embodiment of the present disclosure, the first switch 508 of FIG. 5 (e.g., the first switch 508 of FIG. 5A) is a device for tuning the ground length of the entire antenna, which may be configured to finely adjust the current density of the antenna and may be included in the antenna inductance 542 in the equivalent circuit.

Figure 5C:
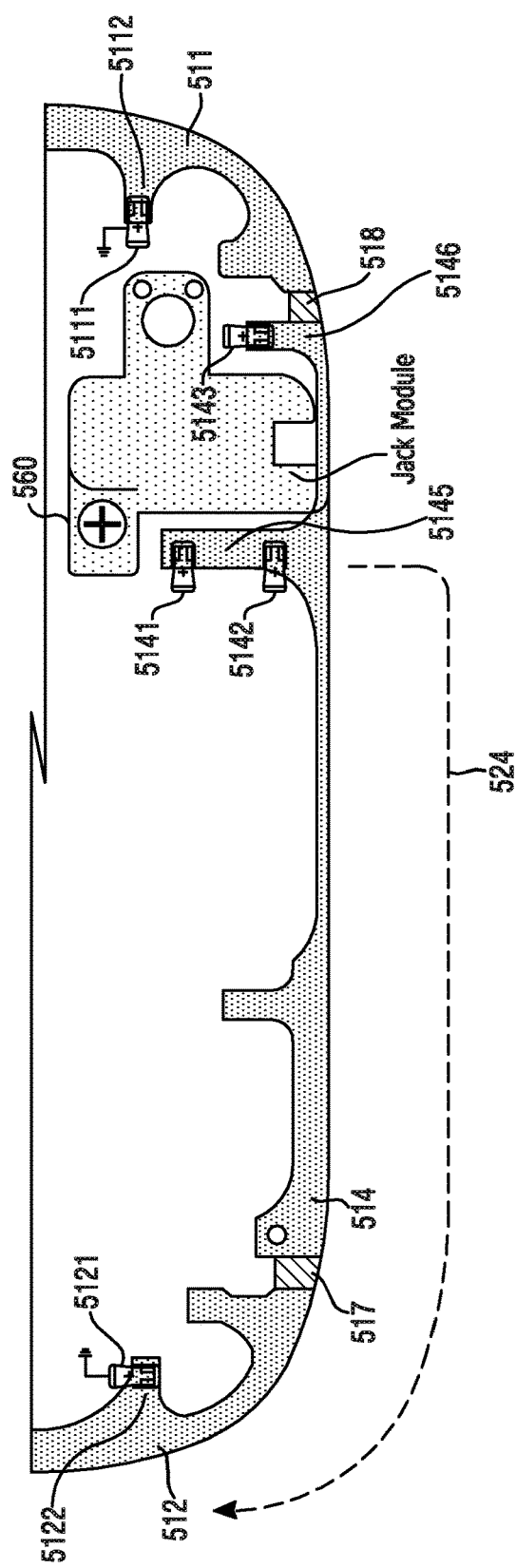
FIG. 5C is a diagram illustrating a configuration an antenna device according to various embodiments of the present disclosure, in which radiating flows of the antenna device are illustrated.

FIG. 5C is a diagram illustrating a configuration an antenna device according to various embodiments of the present disclosure, in which radiating flows of the antenna device are illustrated; According to various embodiments of the present disclosure, the metal bezel of FIG. 5C is an embodiment of a metal bezel that is the same as or similar to, or different from the metal bezel 410 of FIG. 4.

Referring to FIG. 5C, the lower bezel section 514 (e.g., the main antenna 514 of FIG. 5A) that is separated by a pair of split portions 517 and 518 (e.g., the split portions 517 and

518 of FIG. 5A) may be electrically connected to the RF module 504 of the board 500 of FIG. 5A by the connection member 5141 (e.g., the connection member 5141 of FIG. 5A).

According to one embodiment of the present disclosure, the lower bezel section 514 may be utilized as a main antenna radiator of the electronic device.

According to various embodiments of the present disclosure, the first ground piece 5145 of the lower bezel section 514 may be electrically connected to the first switch 508 of the board 500 of FIG. 5A (e.g., the first switch 508 of FIG. 5A) through the connection member 5142. The second ground piece 5146 may be electrically connected to the second switch 510 of the board 500 (e.g., the second switch 510 of FIG. 5A) through the connection member 5143. For example, the first ground piece 5145 may include at least a portion of the power feeding piece 5145 of the lower bezel section 514.

According to various embodiments of the present disclosure, the ground piece 5122 of the left bezel section 512, which is split by the first split portion 517 (e.g., the first coupling antenna 512 of FIG. 5A), may be electrically connected to the ground portion of the board 500 through the connection member 5121.

According to one embodiment of the present disclosure, the left bezel section 512 may be utilized as the first coupling antenna radiator (e.g., a coupling antenna radiator) of the electronic device.

According to various embodiments of the present disclosure, the ground piece 5112 of the right bezel section 511, which is split by the second split portion 518 (e.g., the second coupling antenna 511 of FIG. 5A), may be electrically connected to the ground portion of the board 500 through the connection member 5111.

According to one embodiment of the present disclosure, the right bezel section 511 may be utilized as the second coupling antenna radiator (e.g., a coupling antenna radiator) of the electronic device.

According to various embodiments of the present disclosure, when the second ground piece 5146 of the lower bezel section 514 is electrically connected to the ground portion 5101 of the board 500 by the second switch 510, the resonant path 524 of the signal fed from the RF module 504 may pass through the first ground at the power feeding piece 5145 of the lower bezel section 514, and may be coupled to the lower bezel section 512 at the lower bezel section 514 so as to be formed as a ground portion that is connected to the ground piece 5122 of the lower bezel section 512.

Figure 6A:
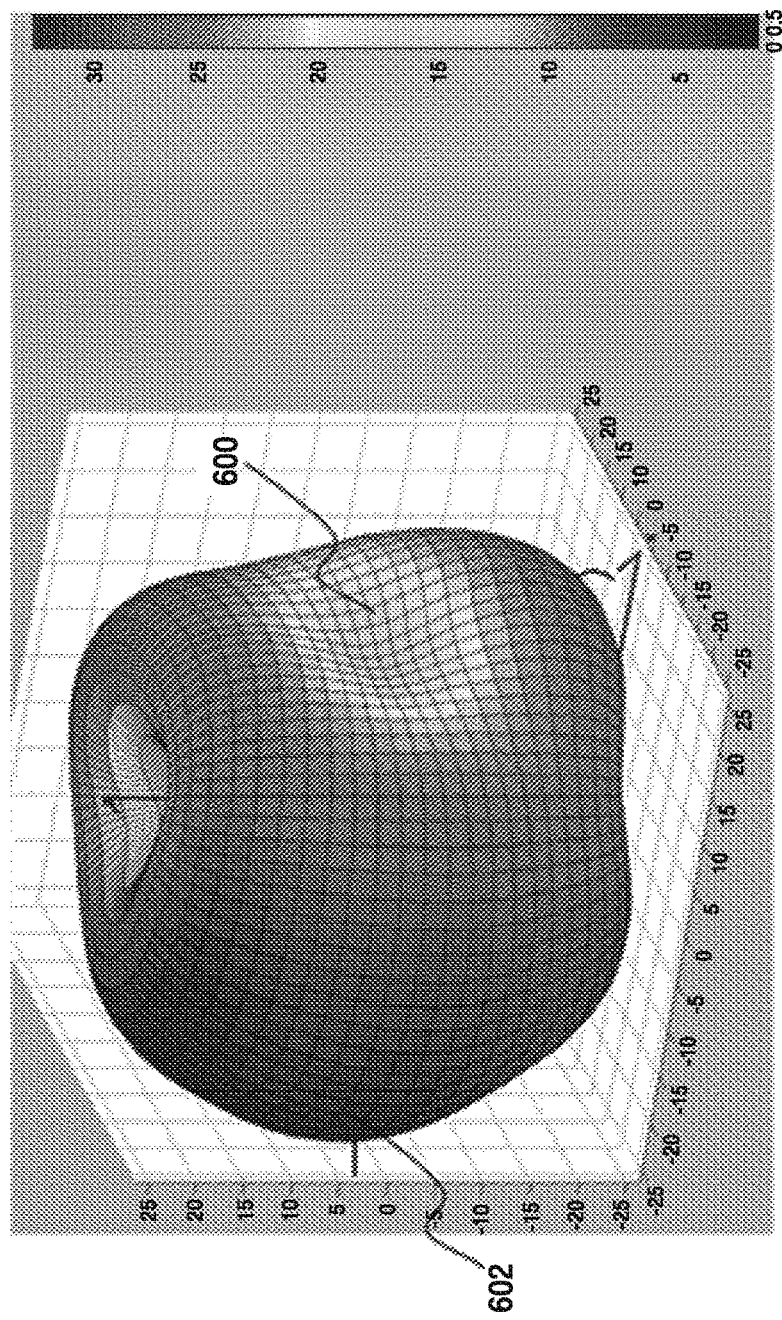
FIGS. 6A to 6C are graphs representing radiating characteristics of an antenna device according to various embodiments of the present disclosure.
Figure 6B:
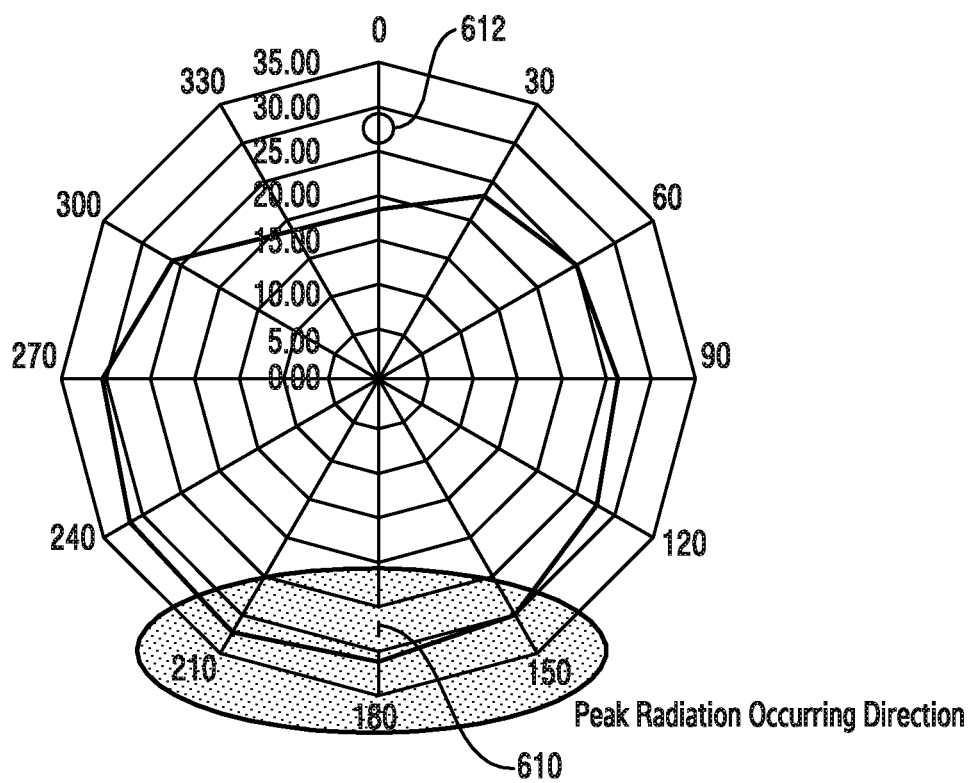
Figure 6C:
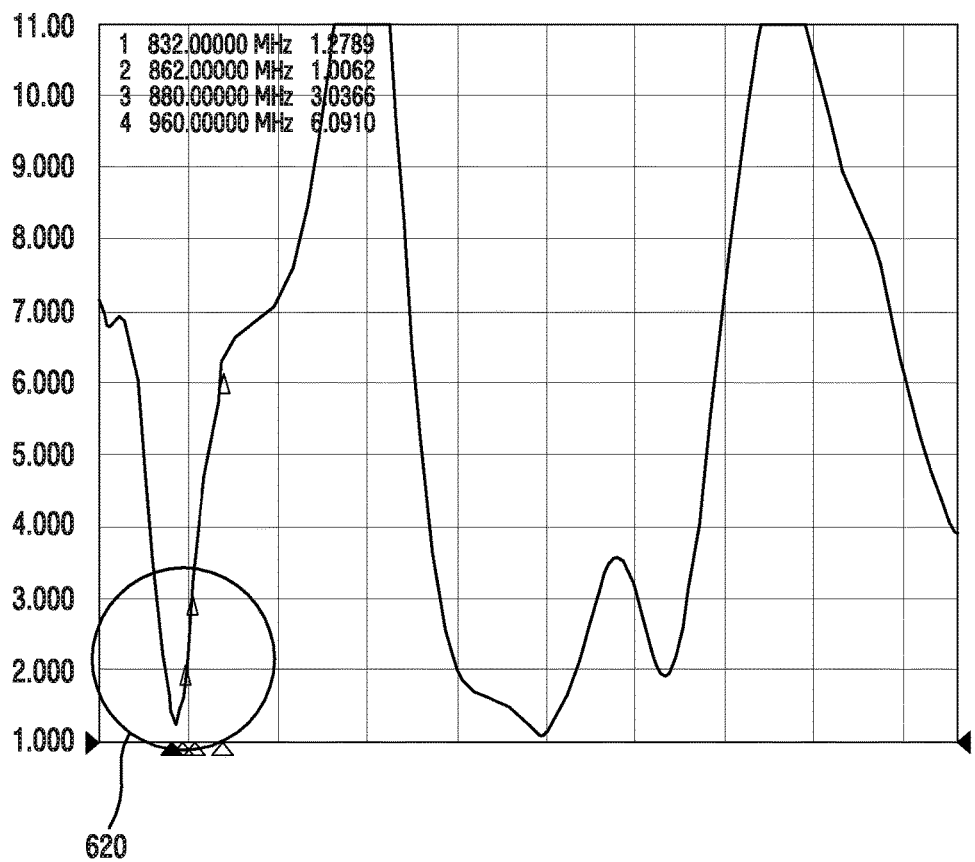

FIGS. 6A to 6C are graphs representing radiating characteristics of an antenna device according to various embodiments of the present disclosure.

According to various embodiments, FIGS. 6A to 6C may represent a radiating characteristic of a metal housing antenna that uses the main antenna 514 and the first coupling antenna 512, as in FIG. 5A.

According to various embodiments of the present disclosure, FIG. 6A may represent a radiating characteristic that is omnidirectionally measured with reference to the main antenna of the electronic device (e.g., the main antenna 514 of FIG. 5A).

According to one embodiment of the present disclosure, the radiating characteristic may be exhibited more highly on the side face 602 of the left split portion 516 than on the side face 600 of the right split portion 516 due to the resonant path 524 formed on the main antenna 514 and the first coupling antenna 512. For example, the total radiating characteristic (total radiated power (TRP)) may be measured as 28.36 dB.

According to various embodiments of the present disclosure, FIG. 6B may represent a radiating characteristic that is measured while rotating the electronic device by 360 degrees with reference to the display thereof.

According to one embodiment of the present disclosure, the numerical value measured when the electronic device is rotated by 180 degrees may be larger than the numerical value measured when the electronic device is rotated by zero degrees. For example, the radiating characteristic may be exhibited more highly on the side face 610 of the first split portion 517 than on the side face 612 of the second split portion 518 due to the resonant path 524 formed on the main antenna 514 and the first coupling antenna 512.

According to various embodiments of the present disclosure, a resonance frequency 620 may be generated as illustrated in FIG. 6C due to the resonant path 524 formed on the main antenna 514 and the first coupling antenna 512.

Figure 7A:
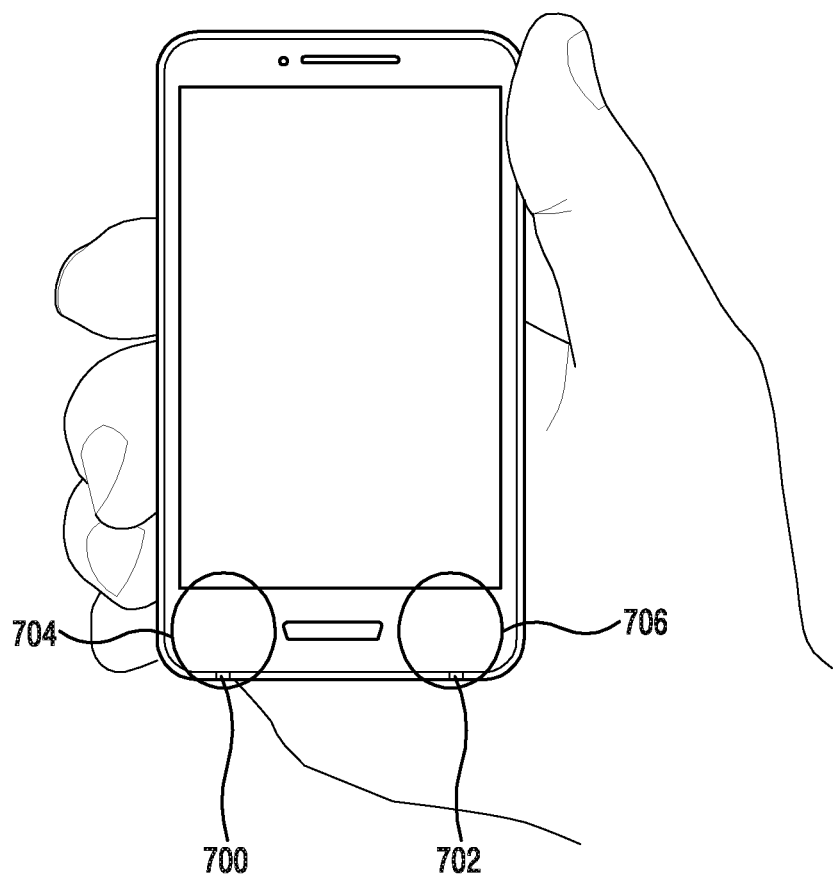
FIG. 7A is a view illustrating a contact region by gripping an electronic device according to various embodiments of the present disclosure.

FIG. 7A is a view illustrating a contact region by gripping an electronic device according to various embodiments of the present disclosure.

According to various embodiments of the present disclosure, when an object, which may have an influence on signal radiating, approaches or comes in contact with the split portion, the capacitance component of the split portion may be changed to affect the resonant path. For example, when the user grasps the electronic device as illustrated in FIG. 7A, the user's touch 704 or 706 may occur on the split portion 700 or 702 of the electronic device. Since a human body has a relatively high dielectric permittivity, a new capacitance component may be formed in the split portion 700 or 702.

Figure 7B:
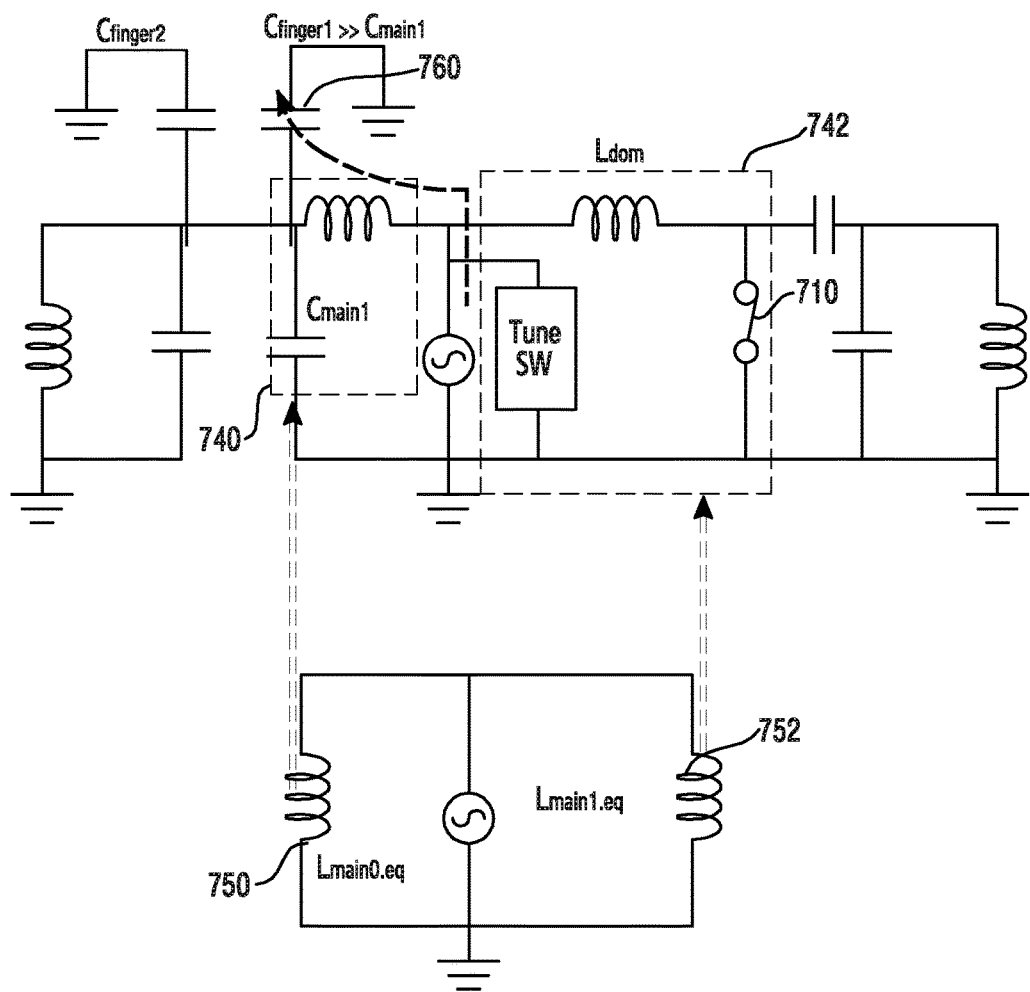
FIG. 7B is an equivalent circuit illustrating radiating flows of an antenna device according to various embodiments of the present disclosure.

FIG. 7B is an equivalent circuit illustrating radiating flows of an antenna device according to various embodiments of the present disclosure.

According to various embodiments of the present disclosure, when touches with respect to the split portions 700 and 702 are detected (704, 706) as illustrated in FIG. 7A, the antenna circuit may be expressed as the equivalent circuit of FIG. 7B.

According to various embodiments of the present disclosure, when a human body comes in contact with the first split portion 700 of the metal housing antenna (e.g., the split portion 517 of FIG. 5A), the capacitance 760 generated by the contact of the human body may be larger than the capacitance generated by the first split portion 700. Thus, the capacitance component generated by the first split portion 700 disappears so that a phenomenon, such as an electric connection (short circuit) to a ground 710, may occur with respect to a high frequency signal component. In other words, an inductance ($L_{main0.eq}$) 750 of an antenna pattern is formed so that the capacitance component of the equivalent circuit disappears. In this example, no capacitance is formed in the first split portion 517 between the main antenna 514 and the first coupling antenna 512 in FIG. 5A so that no resonant path may be generated and thus, the signal radiating performance of the antenna may be reduced.

Figure 8A:
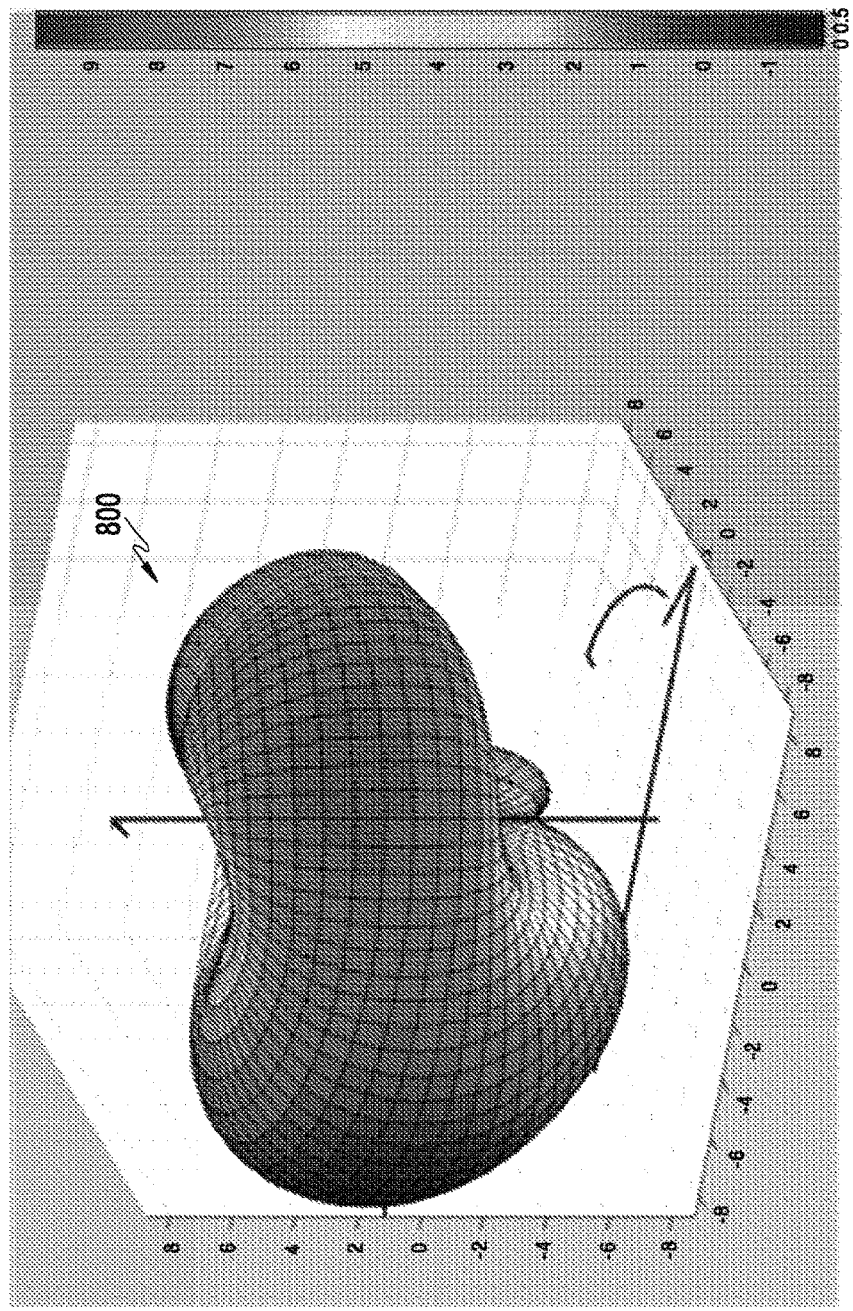
FIGS. 8A to 8C are graphs representing radiating characteristics of an antenna device according to various embodiments of the present disclosure.
Figure 8B:
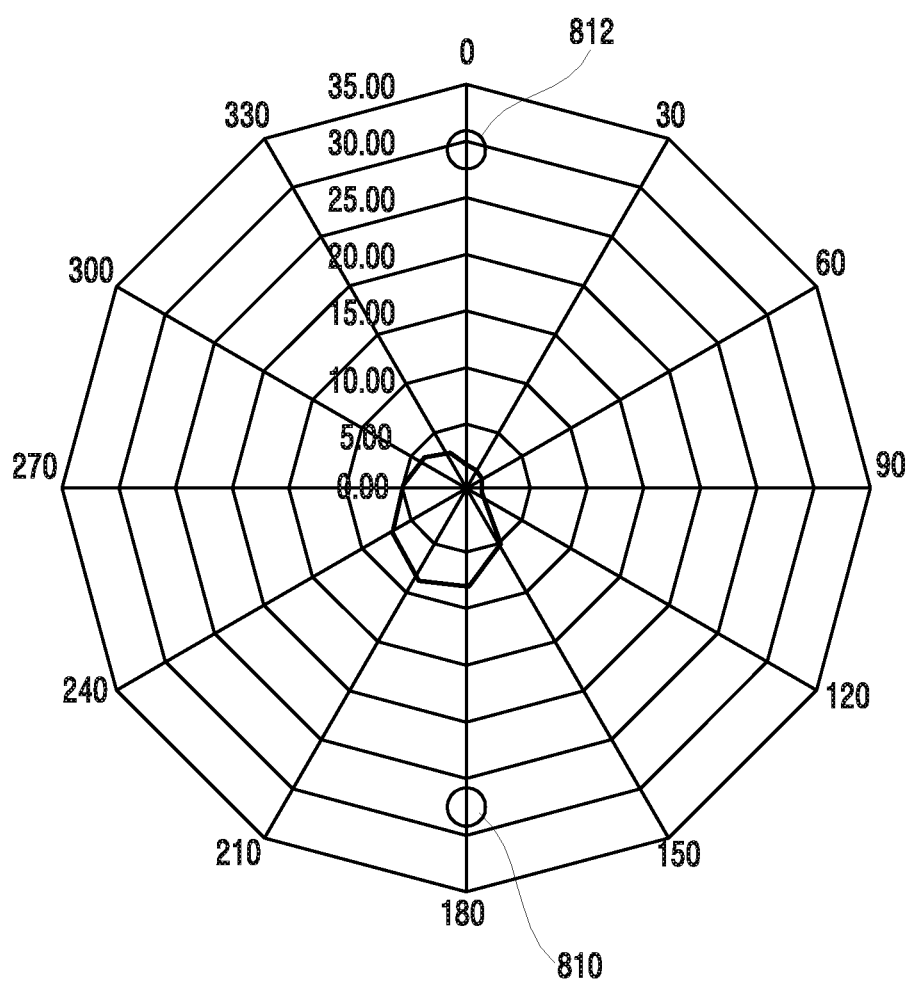
Figure 8C:
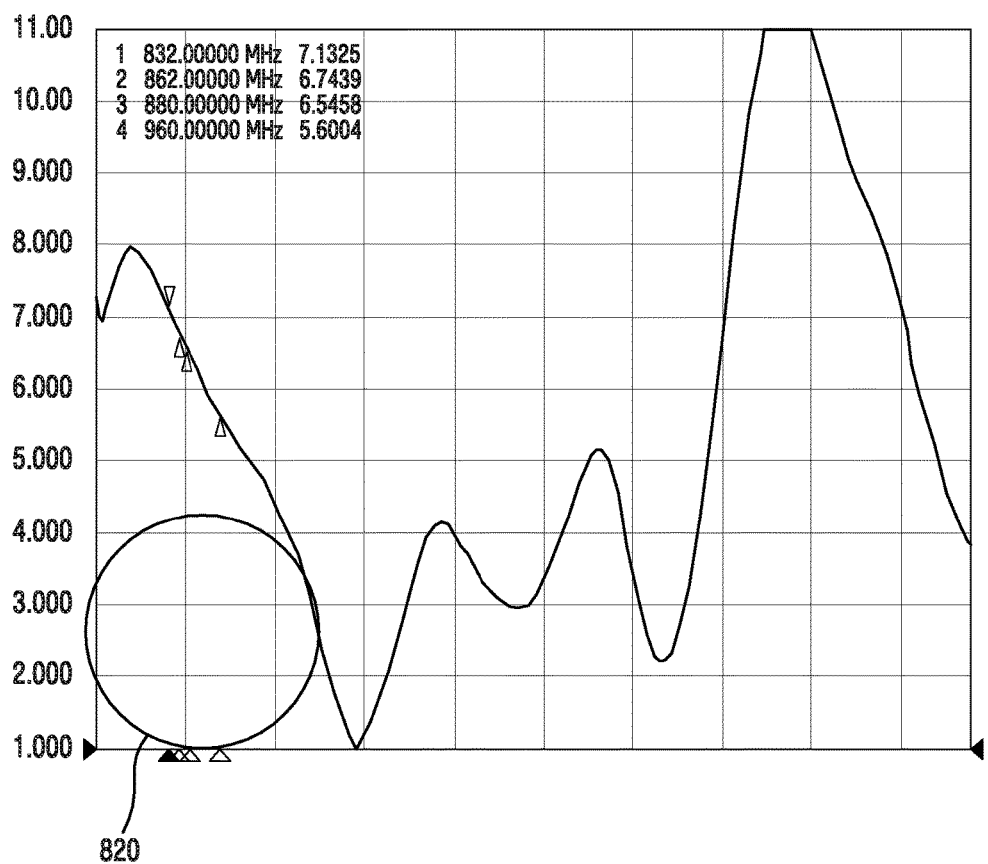

FIGS. 8A to 8C are graphs representing radiating characteristics of an antenna device according to various embodiments of the present disclosure.

According to various embodiments of the present disclosure, when the contact with respect to the split portions 700 and 702 is detected as in FIG. 7A, a radiating characteristic of a metal housing antenna may be represented as in FIG. 5A by using the main antenna 514 and the first coupling antenna 512.

According to various embodiments of the present disclosure, FIG. 8A may represent a radiating characteristic that is omnidirectionally measured with reference to the main antenna of the electronic device 800 (e.g., the main antenna 514 of FIG. 5A).

According to one embodiment of the present disclosure, since the antenna radiating characteristic illustrated in FIG. 8A is expressed with a lower scale than the radiating characteristic due to the resonant path 524 formed on the main antenna 514 and first coupling antenna 512 that are illustrated in FIG. 6A, it may be unreasonable to interpret the radiation as being generated in a specific direction. For example, the total radiating characteristic (TRP) may be measured as 4.57 dB, which corresponds to a numerical value that is reduced by about 24 dB compared to 28.36 dB of FIG. 6A.

According to various embodiments of the present disclosure, FIG. 8B may represent a radiating characteristic that is measured while rotating the electronic device by 360 degrees with reference to the display thereof.

According to one embodiment of the present disclosure, the side faces 810 and 812 of the split portions 517 and 518 of FIG. 5A may have a poor signal radiating performance such that a signal radiating characteristic may not appear.

According to various embodiments of the present disclosure, since no capacitance is formed in the first split portion 517 between the main antenna 514 and the first coupling antenna 512, no resonant path may be generated and thus, the signal radiating performance of the antenna may not be generated as in FIG. 8C (820).

Figure 9A:
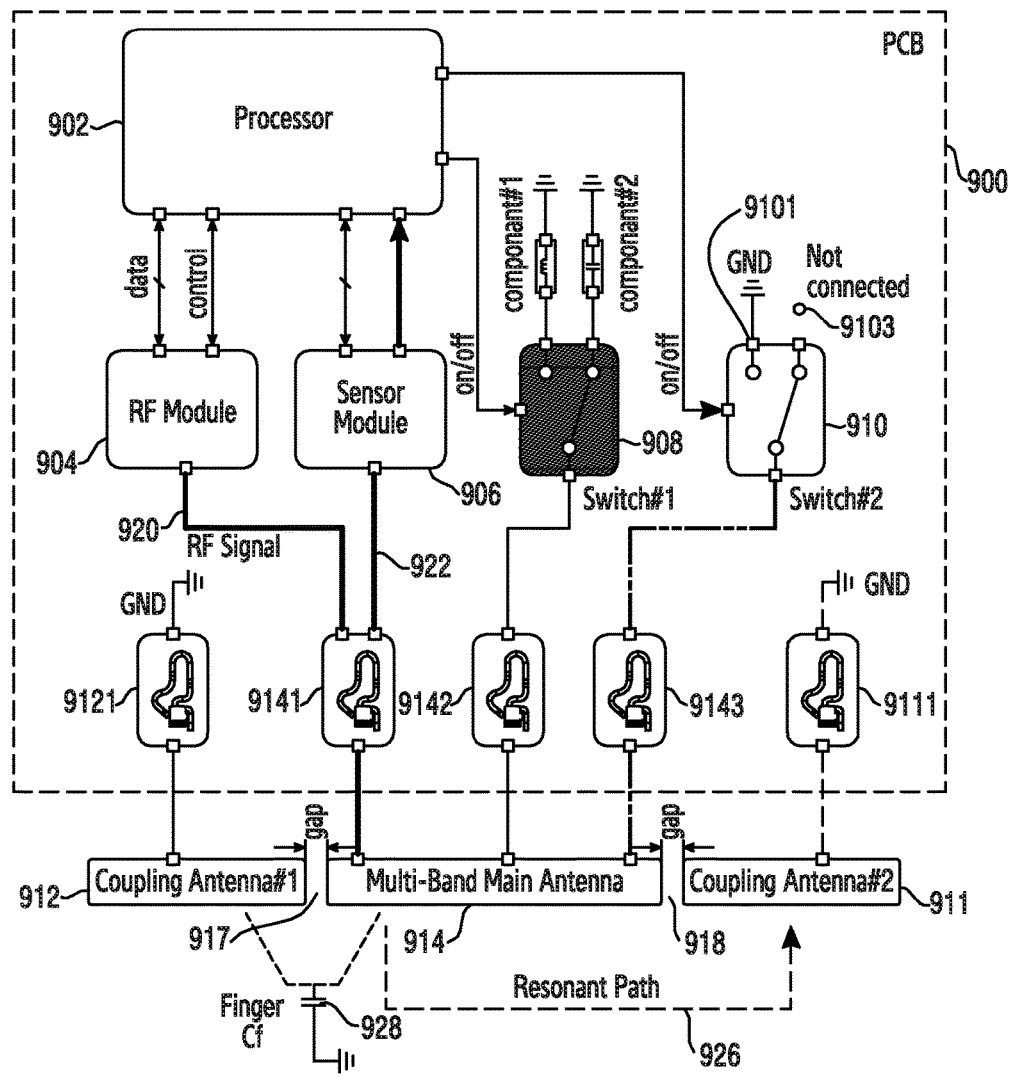
FIG. 9A is a diagram illustrating a configuration of an antenna circuit according to various embodiments of the present disclosure.

FIG. 9A is a diagram illustrating a configuration of an antenna circuit according to various embodiments of the present disclosure.

Referring to FIG. 9A, according to various embodiments of the present disclosure, the antenna circuit 900 of FIG. 9A may be the same as or similar to the antenna circuit 500 of FIG. 5A. Thus, in the following, descriptions for the respective components of the antenna circuit 900 will be omitted.

According to various embodiments of the present disclosure, the sensor module 906 may detect, through a recognition channel 922, an access or contact of an object, which may have an influence on signal radiation (e.g., a human body), with respect to the main antenna 914 or the first split portion 917 between the main antenna 914 and the first coupling antenna 912.

According to one embodiment of the present disclosure, when the user comes in contact with the first split portion 917, a new capacitance component 928 may be formed in the first split portion 917 by the dielectric permittivity of the human body. The sensor module 906 may detect the access or contact of the object based on a change in the capacitance of the main antenna 914 due to the new capacitance component 928.

According to various embodiments of the present disclosure, when the access or contact information of the object with respect to the first split portion 917 or the main antenna 914 is received from the sensor module 906, the processor 902 may control the second switch 910 such that the electric connection of the sub-ground of the main antenna 914 is cut off (opened).

According to various embodiments of the present disclosure, the second switch 910 may cut off (open) the electric connection of a sub-ground connected to the main antenna 914 through the connection member 9143, based on a control signal that is provided from the processor 902.

According to one embodiment of the present disclosure, when the access or contact of the object with respect to the first split portion 917 or the main antenna 914 is detected through the sensor module 906, the second switch 910 may cut off the electric connection of the sub-ground (9103). In the case where the electric connection of the sub-ground is cut off by the second switch 910, an electric gap may be formed in the second split portion 918 between the main antenna 914 and the second coupling antenna 911 by a signal fed from the RF module 902. For example, the signal fed from the RF module 902 flows toward the ground of the second coupling antenna 911 through the connection member 9141 and via the ground of the main antenna 914 so that a resonant path 926 may be formed.

Figure 9B:
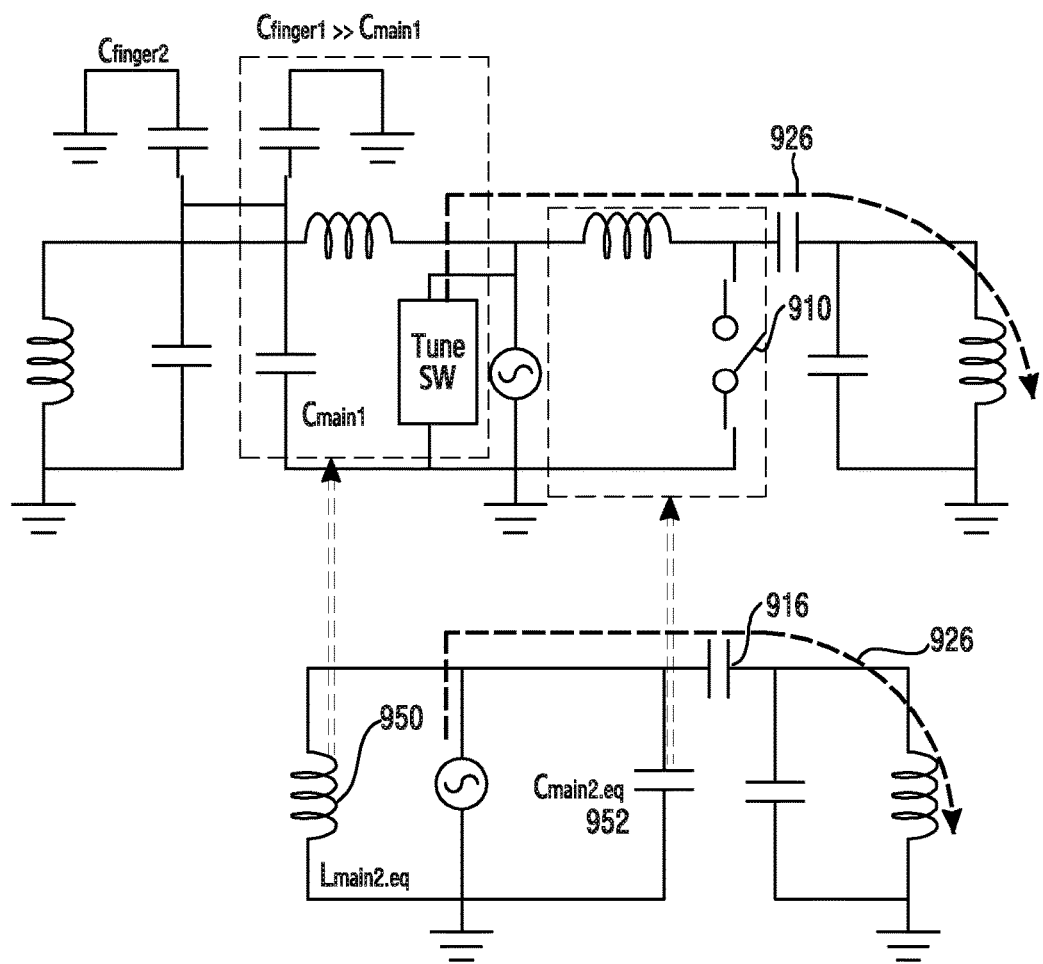
FIG. 9B is an equivalent circuit illustrating radiating flows of an antenna device according to various embodiments of the present disclosure.

FIG. 9B is an equivalent circuit illustrating radiating flows of an antenna device according to various embodiments of the present disclosure.

According to various embodiments of the present disclosure, the antenna circuit configured on the board 900 of FIG. 9A may be expressed as the equivalent circuit of FIG. 9B.

Referring to FIG. 9B, when the electric connection of the sub-ground is cut off by the second switch 910 (e.g., the second switch 910 of FIG. 9A), a new capacitance is formed in the region where the electric connection of the sub-ground is cut off, and may be expressed by an equivalent capacitance ($C_{main2.eq}$) 952.

According to one embodiment of the present disclosure, a resonant path 926 may be formed in the direction of the equivalent capacitance 952 where a signal fed from the RF module 904 of FIG. 9A is in the capacitance direction of the equivalent circuit. For example, a signal fed from the RF module 904 may be coupled to the second coupling antenna 911 of FIG. 9A due to the capacitance component formed in the second split portion 918 in FIG. 9A so as to form a power feeding path 920 having a length corresponding to the resonance frequency, thereby forming a resonance frequency.

According to one embodiment of the present disclosure, when a human body comes in contact with a split portion of the metal housing antenna (e.g., the first split portion 917 in FIG. 9A), an equivalent inductance ($L_{main2.eq}$) 950 may be formed by the capacitance component generated by the contact of the human body.

Figure 9C:
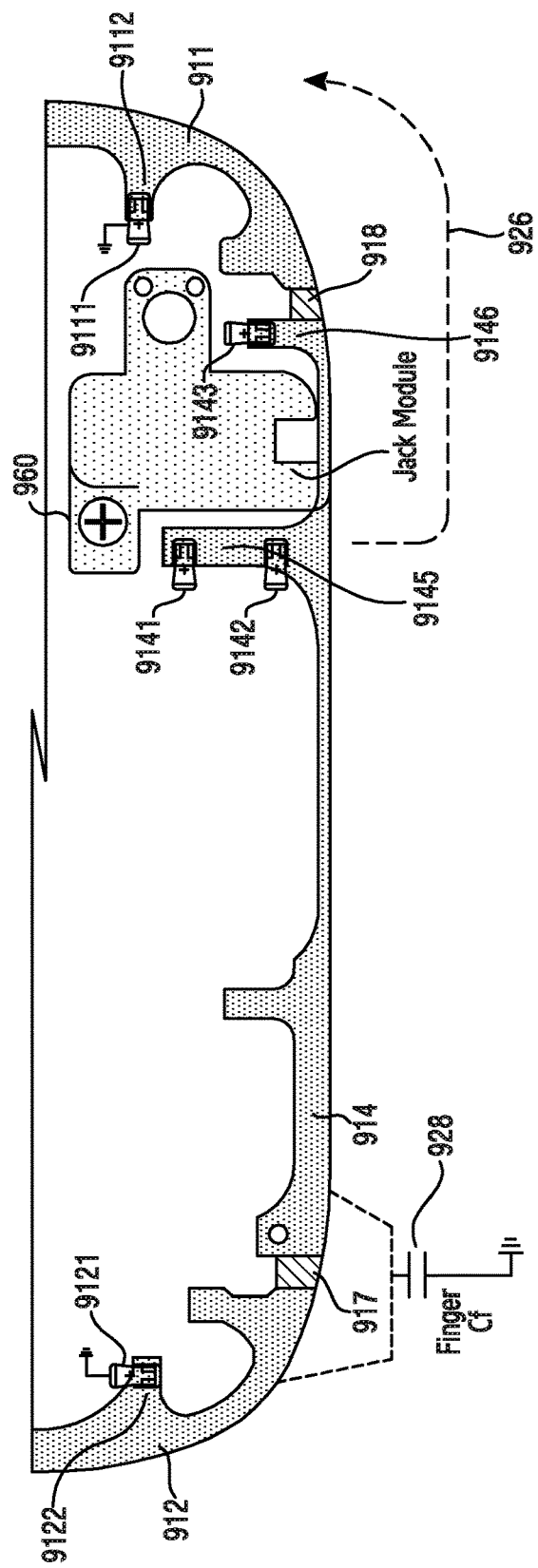
FIG. 9C is a diagram illustrating a configuration of an antenna device according to various embodiments of the present disclosure, in which radiating flows of the antenna device are illustrated.

FIG. 9C is a diagram illustrating a configuration of an antenna device according to various embodiments of the present disclosure, in which radiating flows of the antenna device are illustrated.

According to various embodiments of the present disclosure, the configuration of the antenna device of FIG. 9C is similar to or the same as that of the antenna device of FIG. 5C, and thus descriptions for respective components will be omitted.

Referring to FIG. 9C, when the human body comes in contact with the first split portion 917 of the metal housing antenna (e.g., the first antenna split portion 917 of FIG. 9A), a new capacitance component 928 may be formed in the first split portion 917 by the dielectric permittivity of the human body. In this case, the capacitance component of the first split portion 917 is changed so that a resonant path may not be formed by using the left bezel section 912 (e.g., the first coupling antenna 912 of FIG. 9A).

According to various embodiments of the present disclosure, when the electric connection of the second ground piece 9146 (e.g., the sub-ground) of the lower bezel section 914 (e.g., the main antenna 914 of FIG. 9A) is cut off by the second switch 910 of FIG. 9A, an electric gap may be formed in the second split portion 918 (e.g., the second split portion 918 of FIG. 9A) between the lower bezel section 914 and the right bezel section 911 (e.g., the second coupling antenna 911 of FIG. 9A) by the signal fed through the RF module 904 of FIG. 9A. For example, the resonant path 926 of the signal fed from the RF module 904 may pass through the first ground in the power feeding piece 9145 of the lower bezel section 914 and may be coupled to the right bezel section 911, thereby being formed as a ground portion connected to the ground piece 9112 of the right bezel section 911.

Figure 10A:
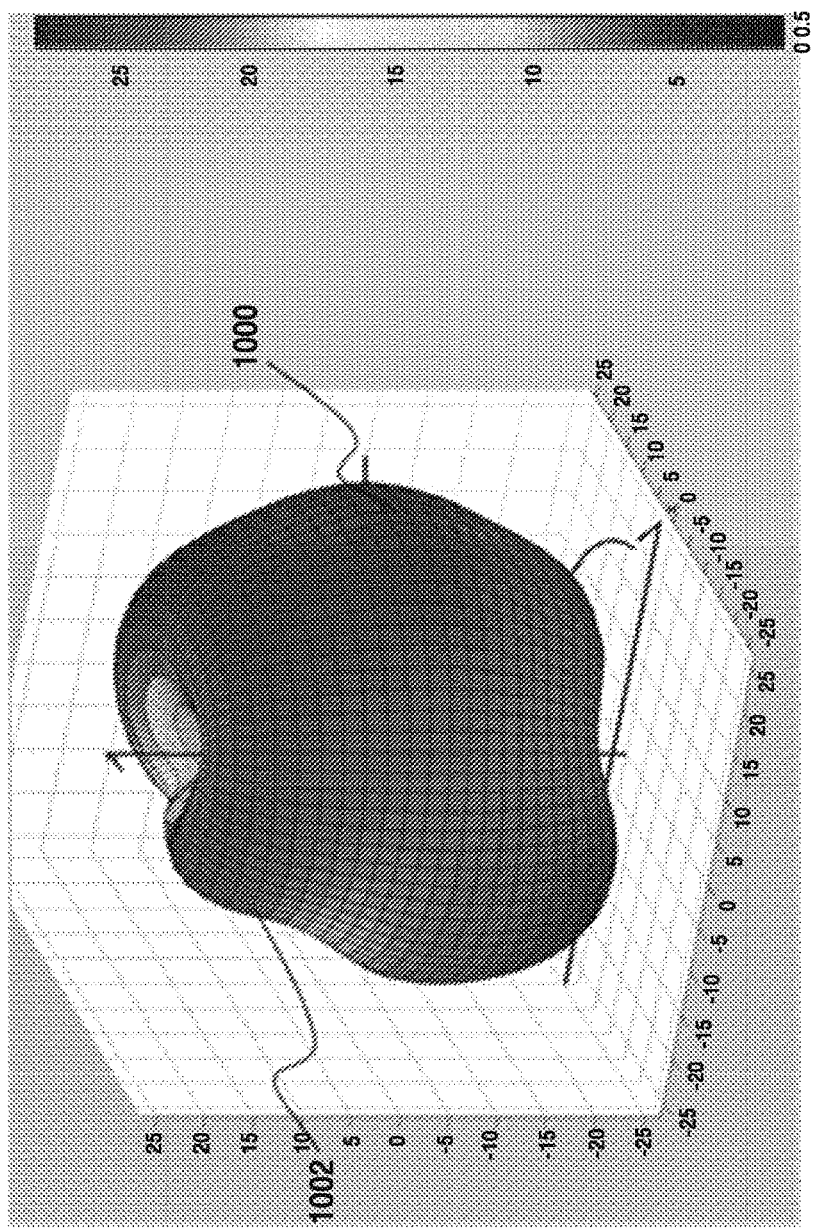
FIGS. 10A to 10C are graphs representing radiating characteristics of an antenna device according to various embodiments of the present disclosure.
Figure 10B:
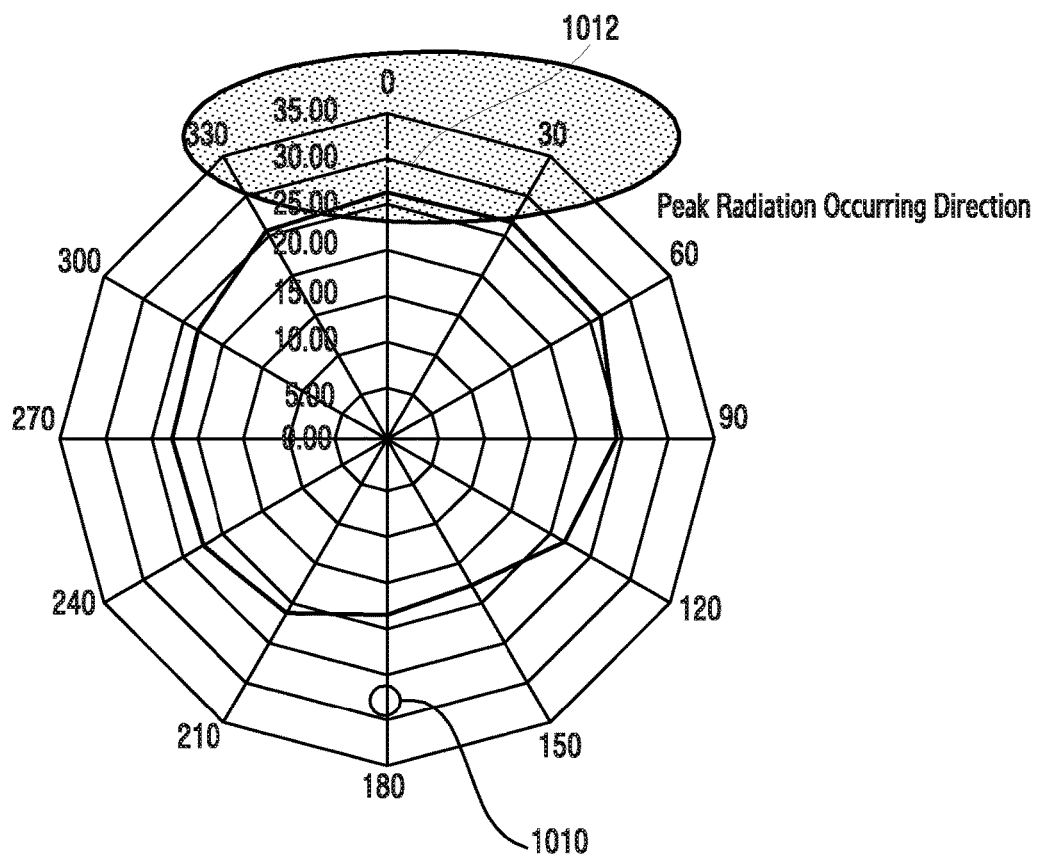
Figure 10C:
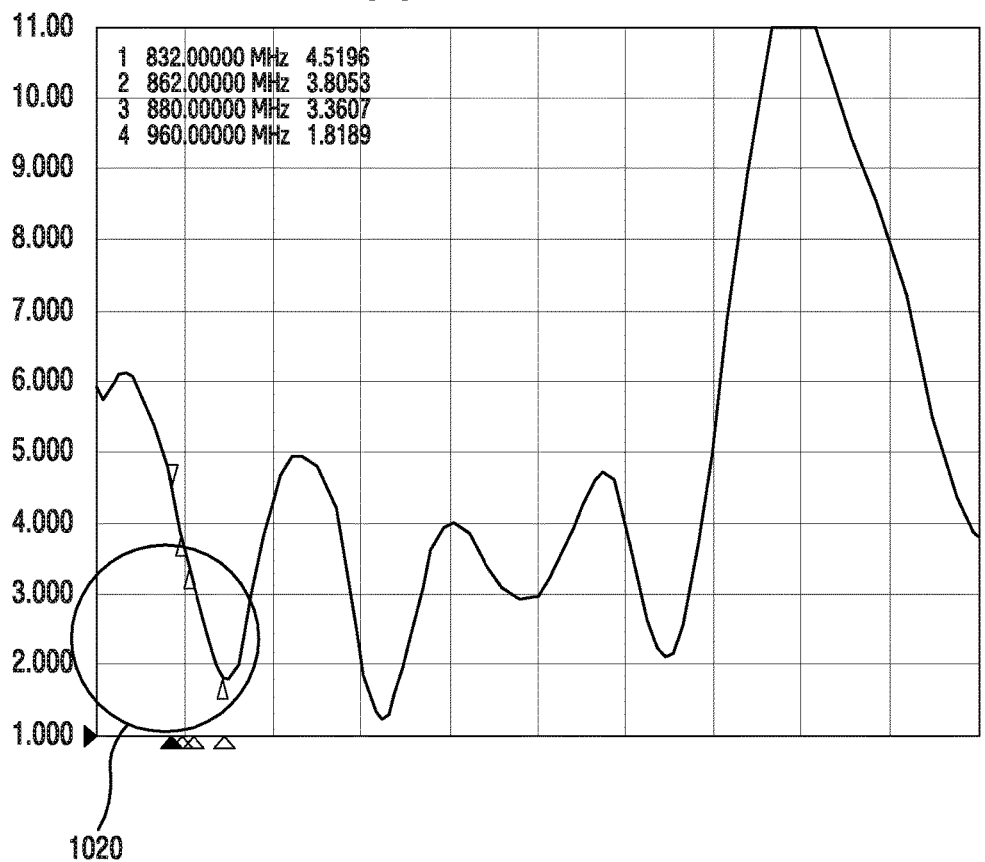

FIGS. 10A to 10C are graphs representing radiating characteristics of an antenna device according to various embodiments of the present disclosure.

Referring to FIGS. 10A to 10C, according to various embodiments of the present disclosure, FIGS. 10A to 10C may represent a radiating characteristic of a metal housing antenna that uses the main antenna 914 and the second coupling antenna 911, as in FIG. 9A.

According to various embodiments of the present disclosure, FIG. 10A may represent a radiating characteristic that is omnidirectionally measured with reference to the main antenna 914 of the electronic device.

According to one embodiment of the present disclosure, for example, the radiating characteristic may be exhibited more highly on the side face 1000 of the second split portion 918 than on the side face 1002 of the first split portion 917 due to the resonant path 926 formed on the main antenna 914 and the second coupling antenna 911. For example, the total radiating characteristic (TRP) may be measured as 24.24 dB, which corresponds to a numerical value that is increased by about 20 dB compared to 4.57 dB of FIG. 8A.

According to various embodiments of the present disclosure, FIG. 10B may represent a radiating characteristic that is measured while rotating the electronic device by 360 degrees with reference to the display thereof.

According to one embodiment of the present disclosure, the numerical value measured when the electronic device is rotated by zero (0) degrees may be larger than the numerical value measured when the electronic device is rotated by 180 degrees. For example, the radiating characteristic may be exhibited more highly on the side face 1012 of the second split portion 918 than on the side face 1010 of the first split portion 917 due to the resonant path 926 formed on the main antenna 914 and the second coupling antenna 911.

According to various embodiments of the present disclosure, a resonance frequency 1020 may be generated as illustrated in FIG. 10C due to the resonant path 926 formed on the main antenna 914 and the second coupling antenna 911.

Figure 11:
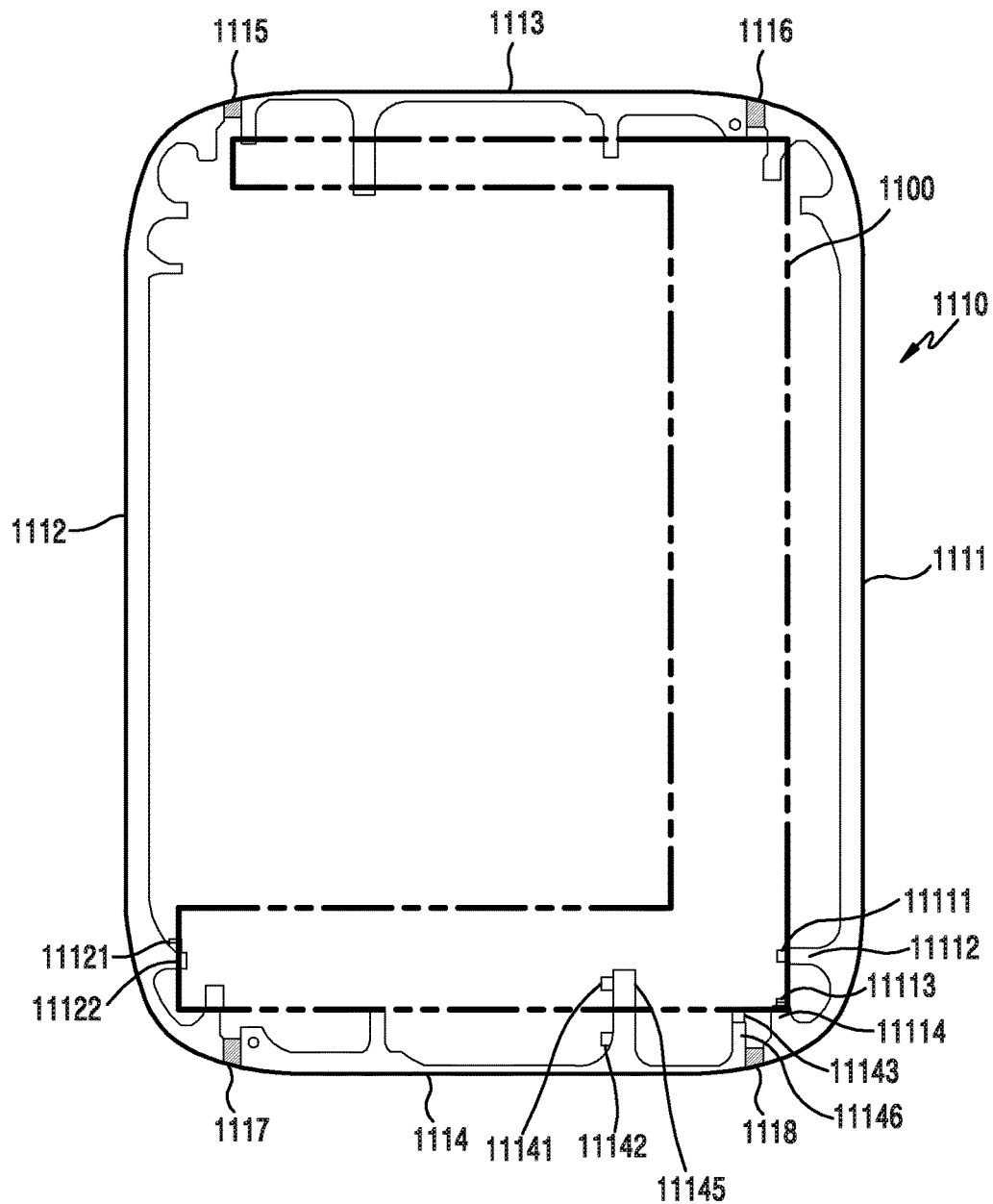
FIG. 11 is a diagram illustrating a configuration of an antenna device according to various embodiments of the present disclosure.

FIG. 11 is a diagram illustrating a configuration of an antenna device according to various embodiments of the present disclosure.

Referring to FIG. 11, according to various embodiments of the present disclosure, the metal bezel 1110 of FIG. 11 is an embodiment of a metal bezel that is the same as or similar to, or different from the metal bezel 310 of FIG. 3. In the following description, the components of the metal bezel 1110 of FIG. 11, which are different from those of the metal bezel 410 of FIG. 4, will be described while omitting descriptions for the components of the metal bezel 1110 of FIG. 11, which are the same as or similar to those of the metal bezel 410 of FIG. 4.

According to various embodiments of the present disclosure, the right bezel section 1111, which is split by the second split portion 1118, may include a power feeding piece 11114.

According to one embodiment of the present disclosure, the power feeding piece 11114 of the right bezel section 1111 may be fed with power from a power feeding portion of the board 1100, or may be electrically connected to the power feeding portion of the board 1100 a separate electric connection member 11113 (e.g., a C-clip) through an operation of installing the board 1100 in the electronic device.

According to various embodiments of the present disclosure, the right bezel section 1111 may include a ground piece 11112.

According to one embodiment of the present disclosure, the ground piece 11112 of the right bezel section 1111 may be electrically connected to a ground portion of the board 1100, or may be electrically connected to the ground portion of the board 1100 by a separate electric connection member 11111.

According to various embodiments of the present disclosure, the right bezel section 1111 may serve as a band antenna radiator that operates in a desired operating frequency band.

According to one embodiment of the present disclosure, the right bezel section 1111 may serve as an antenna radiator that operates in an operating frequency band corresponding to a physical length that extends from the power feeding piece 11114 to the ground piece 11112.

According to various embodiments of the present disclosure, when the electric connection of the second ground piece 11146 (e.g., a sub-ground) of the lower bezel section 1114 is cut off, the lower bezel section 1114 and the right bezel section 1111 may serve as band antenna radiators that operate in a desired operating frequency band due to the capacitance that is formed in the second split portion 1118 that is formed of a non-metallic member.

According to one embodiment of the present disclosure, the lower bezel section 1114 and the right bezel section 1111 may serve as antenna radiators that operate in an operating frequency band corresponding to a physical length that extends from the power feeding piece 11114 of the right bezel section 1111 to the ground portion connected to the first ground piece 11145 of the lower bezel section 1114.

Figure 12A:
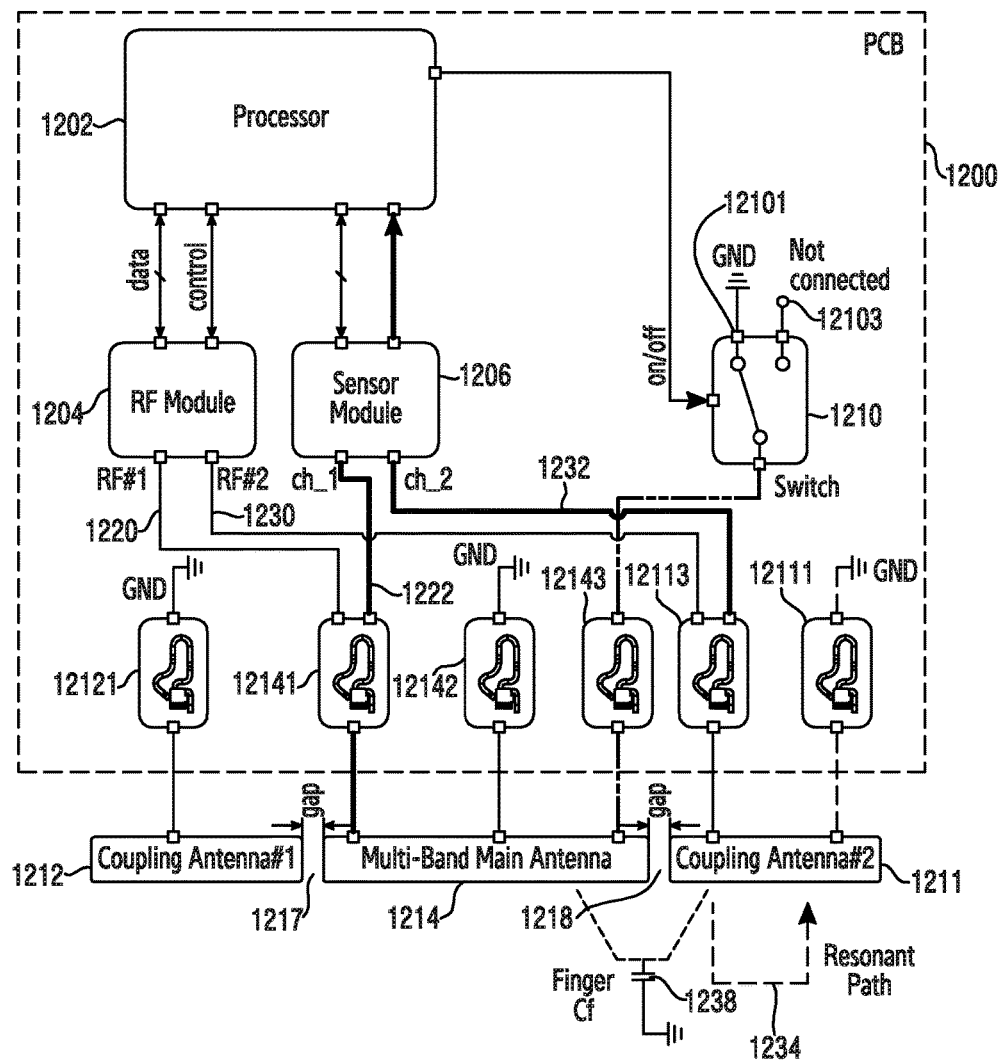
FIG. 12A is a diagram illustrating a configuration of an antenna circuit according to various embodiments of the present disclosure.

FIG. 12A is a diagram illustrating a configuration of an antenna circuit according to various embodiments of the present disclosure.

Referring to FIG. 12A, according to various embodiments of the present disclosure, the antenna circuit 1200 of FIG. 12A may be configured to be the same as or similar to the antenna circuit 500 of FIG. 5A. In the following description, the components of the antenna circuit 1200 of FIG. 12A, which are different from those of the antenna circuit 500 of FIG. 5A will be described, while omitting descriptions for the components of the antenna circuit 1200 of FIG. 12A, which are the same as or similar to those of the antenna circuit 500 of FIG. 5A.

According to various embodiments of the present disclosure, the processor 1202 may perform signal transmission and may control the switch 1210.

According to one embodiment of the present disclosure, the processor 1202 may control the RF module 1204 in order to transmit a signal to the outside.

According to one embodiment of the present disclosure, in the case where the contact (e.g., touch) information of the main antenna 1214 or the second coupling antenna 1211 is received from the sensor module 1206, the processor 1202 may control the switch 1210 in order to change a resonant path.

According to various embodiments of the present disclosure, when it is determined that a touch with respect to the second split portion 1218 is detected, the RF module 1204 converts the data received from the processor 1201 into a radiatable signal, and may deliver the radiatable signal to the main antenna 1214 or the second coupling antenna 1211.

According to one embodiment of the present disclosure, the main antenna 1214 may be electrically fed at the RF module 1204 through the connection member 12141 (1220).

According to one embodiment of the present disclosure, the second coupling antenna 1211 may be electrically fed at the RF module 1204 through the connection member 12113 (1230).

According to various embodiments of the present disclosure, the sensor module 1206 may detect, through a plurality of recognition channels 1222 and 1232, access or contact of an object that may have an influence on signal radiation (e.g., a human body), with respect to the main antenna 1214 or the second coupling antenna 1211.

According to one embodiment of the present disclosure, the sensor module 1206 may detect, through the first recognition channel 1222, whether the main antenna 1214 is touched, and may detect, through the second recognition channel 1232, whether the second coupling antenna 1211 is touched.

According to one embodiment of the present disclosure, the sensor module 1206 may differentiate, through the first recognition channel 1222 and the second recognition channel 1232, a touch with respect to the second split portion 1218 between the main antenna 1214 and the second coupling antenna 1211. For example, in the case where the contact information of the object is detected through the first recognition channel 1222 and the second recognition channel 1232, the sensor module 1206 may determine that the touch with respect to the second split portion 1218 is detected.

According to various embodiments of the present disclosure, the signal fed from the RF module 1204 flows toward the ground of the second coupling antenna 1211 through the connection member 12113 so that a resonant path 1234 may be formed.

According to various embodiments of the present disclosure, in the case where a human body touches the second split portion 1218 of the metal housing antenna, the capacitance component of the metal housing antenna may be changed by the capacitance component 1238 of the second split portion 1218 that is generated by the dielectric permittivity of a human body. When the sub-ground is electrically connected by the switch 1210, the second coupling antenna 1211 may be separated from the main antenna 1214 such that no signal is fed to the main antenna 1214. Therefore, the resonant path 1234 of the signal fed through the second coupling antenna 1211 can be maintained.

Figure 12B:
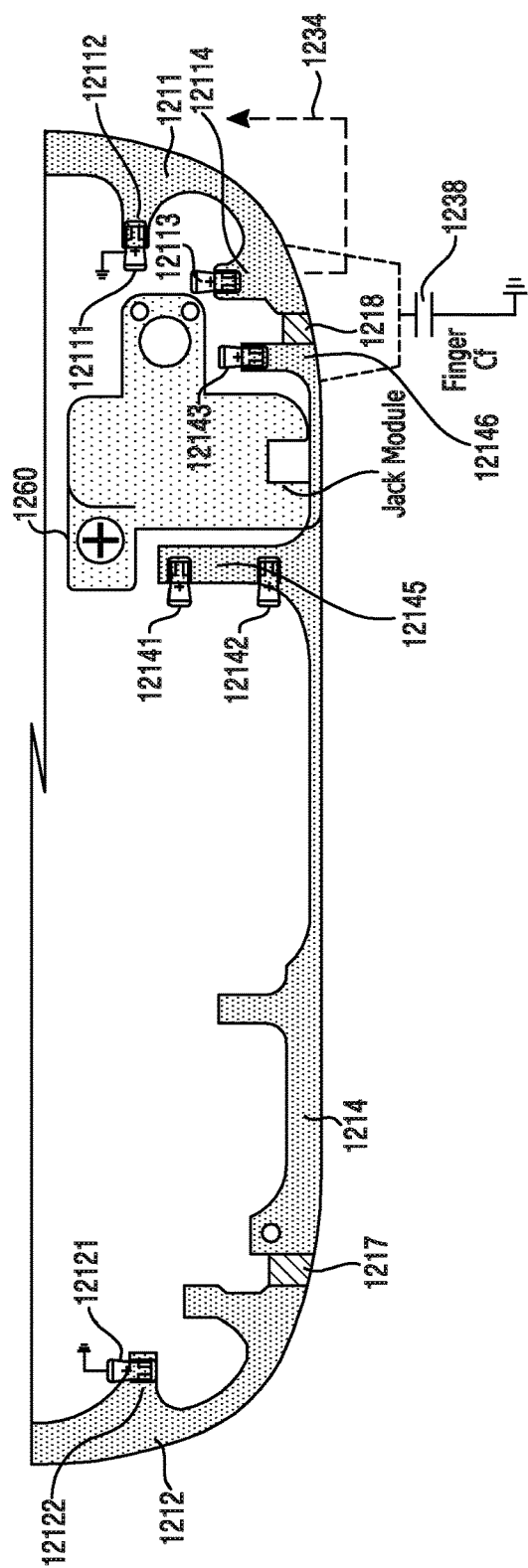
FIG. 12B is a diagram illustrating a configuration of an antenna device according to various embodiments of the present disclosure, in which radiating flows of the antenna device are illustrated.

FIG. 12B is a diagram illustrating a configuration of an antenna device according to various embodiments of the present disclosure, in which radiating flows of the antenna device are illustrated.

According to various embodiments of the present disclosure, the metal bezel of FIG. 12B is an embodiment of a metal bezel that is the same as or similar to, or different from the metal bezel 1110 of FIG. 11.

Referring to FIG. 12B, the resonant path 1234 of the signal fed from the RF module 1204 of FIG. 12A may be formed as a ground portion connected to the ground piece 12112 in the power feeding piece 12114 of the right bezel section 1211 (e.g., the second coupling antenna 1211 of FIG. 12A).

According to various embodiments of the present disclosure, in the case where a human body comes into contact with the second split portion 1218 between the lower bezel section 1214 (e.g., the main antenna 1214 of FIG. 12A) and the right bezel section 1211, the second ground piece 12146 (e.g., a sub-ground) of the lower bezel section 1214 may be electrically connected to the ground portion 12101 of the board (see FIG. 12A). For example, the lower bezel section 1214 and the right bezel section 1211 may be separated from each other. Therefore, the resonant path 1234 may not be affected by the capacitance component 1238 generated in the second split portion 1218 by the contact of the human body.

Figure 13A:
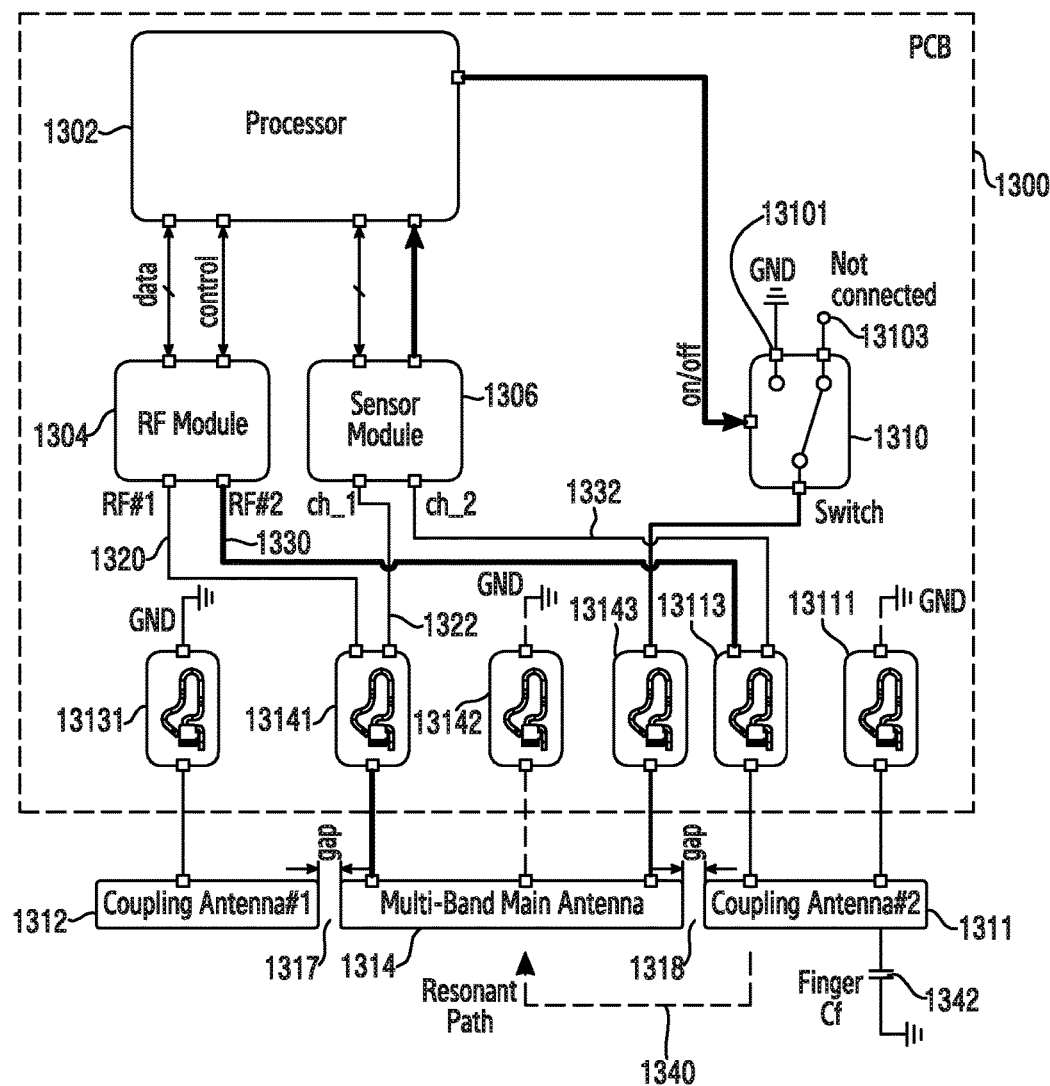
FIG. 13A is a diagram illustrating a configuration of an antenna circuit according to various embodiments of the present disclosure.

FIG. 13A is a diagram illustrating a configuration of an antenna circuit according to various embodiments of the present disclosure.

Referring to FIG. 13A, according to various embodiments of the present disclosure, the antenna circuit 1300 of FIG. 13A may be the same as or similar to the antenna circuit 1200 of FIG. 12A. Thus, in the following, descriptions for the respective components of the antenna circuit 1300 will be omitted.

According to various embodiments of the present disclosure, the sensor module 1306 may detect, through the second recognition channel 1332, access or contact of an object that may have an influence on signal radiation (e.g., a human body), with respect to the second coupling antenna 1312.

According to one embodiment of the present disclosure, when the user touches the second coupling antenna 1312, a new capacitance component 1342 may be formed in the second coupling antenna 1312 by the dielectric permittivity of the human body. The sensor module 1306 may detect access or contact of the object based on a change in the capacitance of the second coupling antenna 1312 due to the new capacitance component 1342 that is detected through the second recognition channel 1332.

According to various embodiments of the present disclosure, in the case where the access or contact information of the object with respect to the second coupling antenna 1312 is received from the sensor module 1306, the processor 1302 may control the switch 1310 such that the electric connection with respect to the sub-ground of the main antenna 1314 (e.g., the ground by the second ground piece 12146 of FIG. 12B) is cut off.

According to various embodiments of the present disclosure, the switch 1310 may cut off (13103) the electric connection with respect to a sub-ground connected to the main antenna 1314 through the connection member 13143, based on a control signal that is provided from the processor 1302. In the case where the electric connection with respect to the sub-ground is cut off by the switch 1310, an electric gap may be formed in the second split portion 1318 between the main antenna 1314 and the second coupling antenna 1312 by a signal fed from the RF module 1304. For example, the signal fed from the RF module 1304 flows toward the first ground of the main antenna 1314 through the connection member 13113 and via the ground of the main antenna 1314 so that a resonant path 1340 may be formed.

Figure 13B:
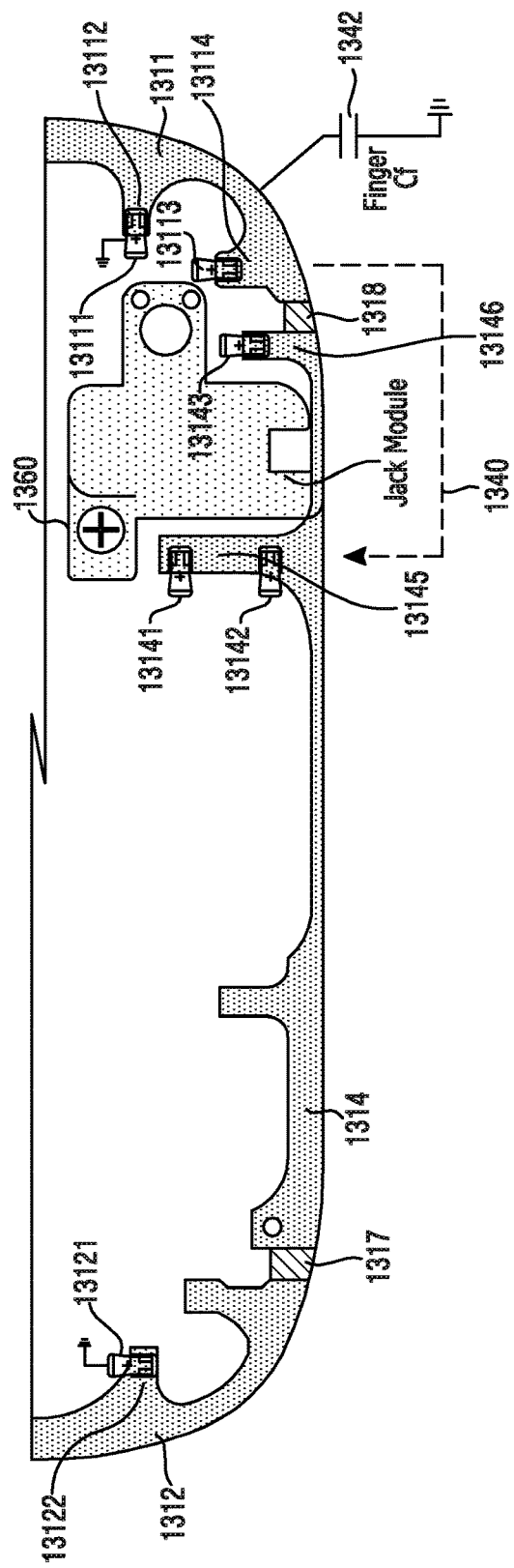
FIG. 13B is a diagram illustrating a configuration of an antenna device according to various embodiments of the present disclosure, in which radiating flows of the antenna device are illustrated.

FIG. 13B is a diagram illustrating a configuration of an antenna device according to various embodiments of the present disclosure, in which radiating flows of the antenna device are illustrated.

According to various embodiments of the present disclosure, the configuration of the antenna device of FIG. 13B may be the same as or similar to that of the antenna device of FIG. 12B. Thus, in the following description, descriptions for the respective components of the antenna device will be omitted.

Referring to FIG. 13B, in the case where a human body comes in contact with the right bezel section 1311 (e.g., the second coupling antenna 1312 of FIG. 13A), a new capacitance component 1342 may be formed in the right bezel section 1311 by the dielectric permittivity of the human body. When the capacitance component of the right bezel section 1311 is changed, the radiating characteristic of the antenna using the right bezel section 1311 may be degraded.

According to an embodiment of the present disclosure, in the case where the electric connection with respect to the second ground piece 13146 of the lower bezel section 1314 (e.g., the main antenna 1314 of FIG. 13A) is cut off by the switch 1310 of FIG. 13A, an electric gap may be formed in the second split portion 1318 between the lower bezel section 1314 and the right bezel section 1311 by the signal fed through the RF module 1304 of FIG. 13A. For example, the resonant path 1340 of the signal fed from the RF module 1304 may be coupled to the lower bezel section 1314 in the power feeding piece 13114 of the right bezel section 1311, thereby being formed as a ground portion connected to the first ground piece 13145 of the lower bezel section 1314.

Figure 14:
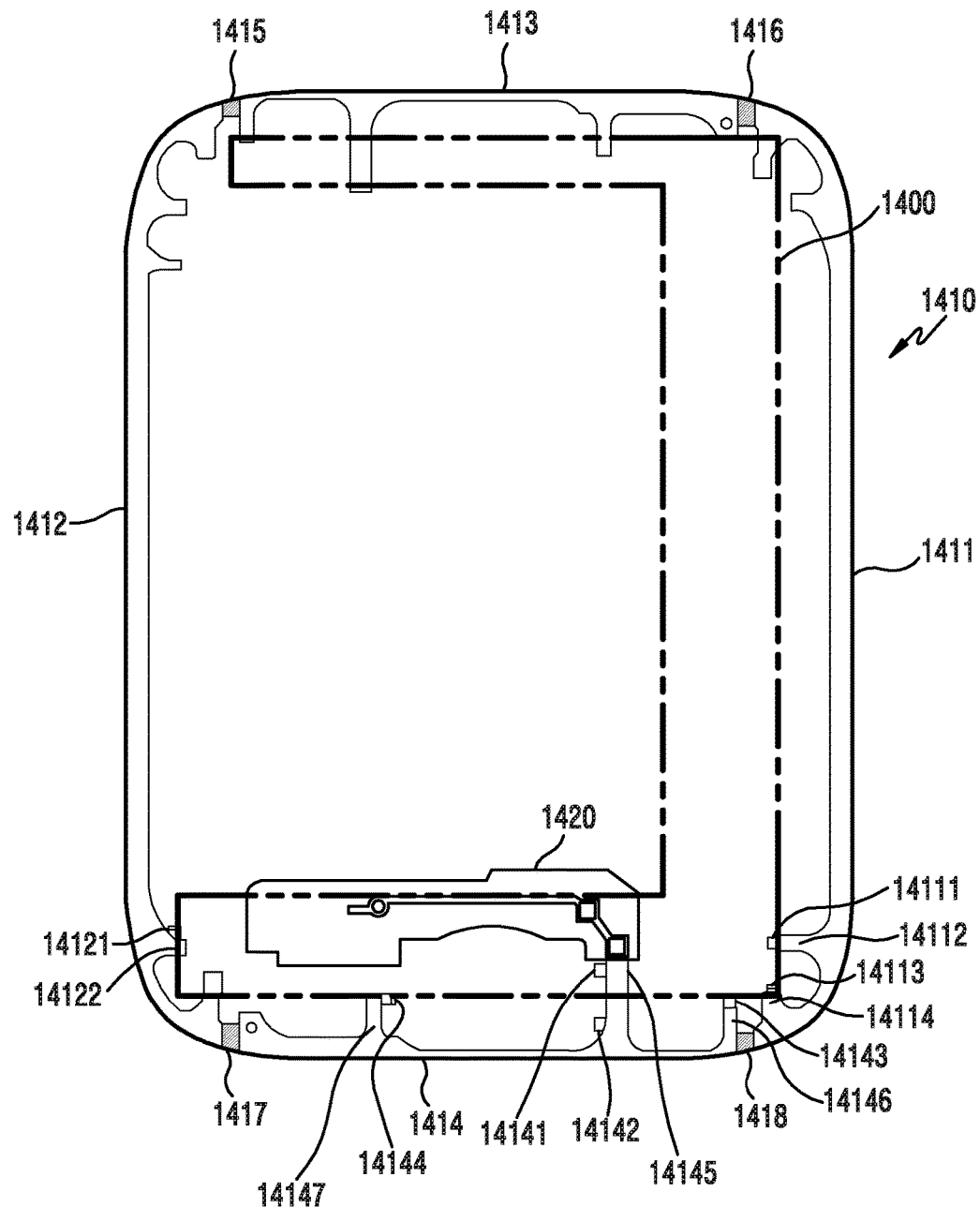
FIG. 14 is a diagram illustrating a configuration of an antenna device according to various embodiments of the present disclosure.

FIG. 14 is a diagram illustrating a configuration of an antenna device according to an embodiment of the present disclosure.

Referring to FIG. 14, according to an embodiment of the present disclosure, the metal bezel 1410 of FIG. 14 is an embodiment of a metal bezel that is the same as or similar to, or different from the metal bezel 310 of FIG. 3. In the following description, the components of the metal bezel 1410 of FIG. 14, which are different from those of the metal bezel 1110 of FIG. 11 will be described, while omitting descriptions for the components of the metal bezel 1110 of FIG. 11, which are the same as or similar to those of the metal bezel 1110 of FIG. 11.

According to various embodiments of the present disclosure, the lower bezel section 1414 may include a plurality of ground pieces 14145, 14146, and 14147 that are formed at different positions.

According to one embodiment of the present disclosure, each of the ground pieces 14145, 14146, and 14147 may be electrically connected to the ground portion of the board 1400 through the connection members 14142, 14143, and 14144, respectively. For example, the first ground piece 14145 of the lower bezel section 1414 may be electrically connected (short circuited) to the ground portion of the board 1400 through the connection member 14142 in order to set a resonant path. For example, the first ground piece 14145 of the lower bezel section 1414 may include at least a portion of the power feeding piece 14145.

According to various embodiments of the present disclosure, the second ground piece 14146 of the lower bezel section 1414 may be electrically connected to the switch of the board 1400 through the connection member 14143, thereby being selectively connected to the ground portion of the board 1400.

According to one embodiment of the present disclosure, in the case where the second ground piece 14146 of the lower bezel section 1414 is electrically connected to the ground portion of the board 1400, the right bezel section 1411 and the lower bezel section 1414 may be separated from each other such that no signal is fed to the right bezel section 1411. In this case, an electric gap may be formed in the first split portion 1417 between the lower bezel section 1414 and the left bezel section 1412 by the signal fed through the power feeding portion of the board (e.g., RF module). For example, the lower bezel section 1414 and the left bezel section 1412 may serve as antenna radiators that operate in an operating frequency band corresponding to a physical length that extends from the power feeding piece 14145 of the lower bezel section 1414 to the ground portion connected to the ground piece 14122 of the left bezel section 1412.

According to various embodiments of the present disclosure, the third ground piece 14147 of the lower bezel section 1414 may be electrically connected to the switch of the board 1400 through the connection member 14144, thereby being selectively short circuited to the ground portion of the board 1400.

According to one embodiment of the present disclosure, in the case where the electric connection to the ground portion of the board 1400 is cut off by the switch, the third ground piece of the lower bezel section 1414 may separate the left bezel section 1412 and the lower bezel section 1414 from each other such that no signal is fed to the left bezel section 1412. In this case, an electric gap may be formed in the second split portion 1418 between the lower bezel section 1414 and the right bezel section 1411 by the signal fed through the power feeding portion of the board (e.g., RF module). For example, the lower bezel section 1414 and the right bezel section 1411 may serve as antenna radiators that operate in an operating frequency band corresponding to a physical length that extends from the power feeding piece 14145 of the lower bezel section 1414 to the ground portion connected to the ground piece 14112 of the right bezel section 1411.

According to various embodiments of the present disclosure, a fabry-perot cavity (FPC) antenna 1420 electrically connected to the metal bezel 1410 may be included.

According to one embodiment of the present disclosure, in the case where a contact of a human body with respect to the split portions 1417 and 1418 at the opposite ends of the lower bezel section 1414 is detected, the second ground piece 14146 and the third ground piece 14147 of the lower bezel section 1414 may be electrically connected to the ground portion of the board 1400. In this case, since the signal fed through the lower bezel section 1414 cannot be fed through the right bezel section 1411 or the lower bezel section 1414, the signal may be fed to the FPC antenna 1420 electrically connected to the lower bezel section 1414 so that a new resonant path can be formed.

Figure 15A:
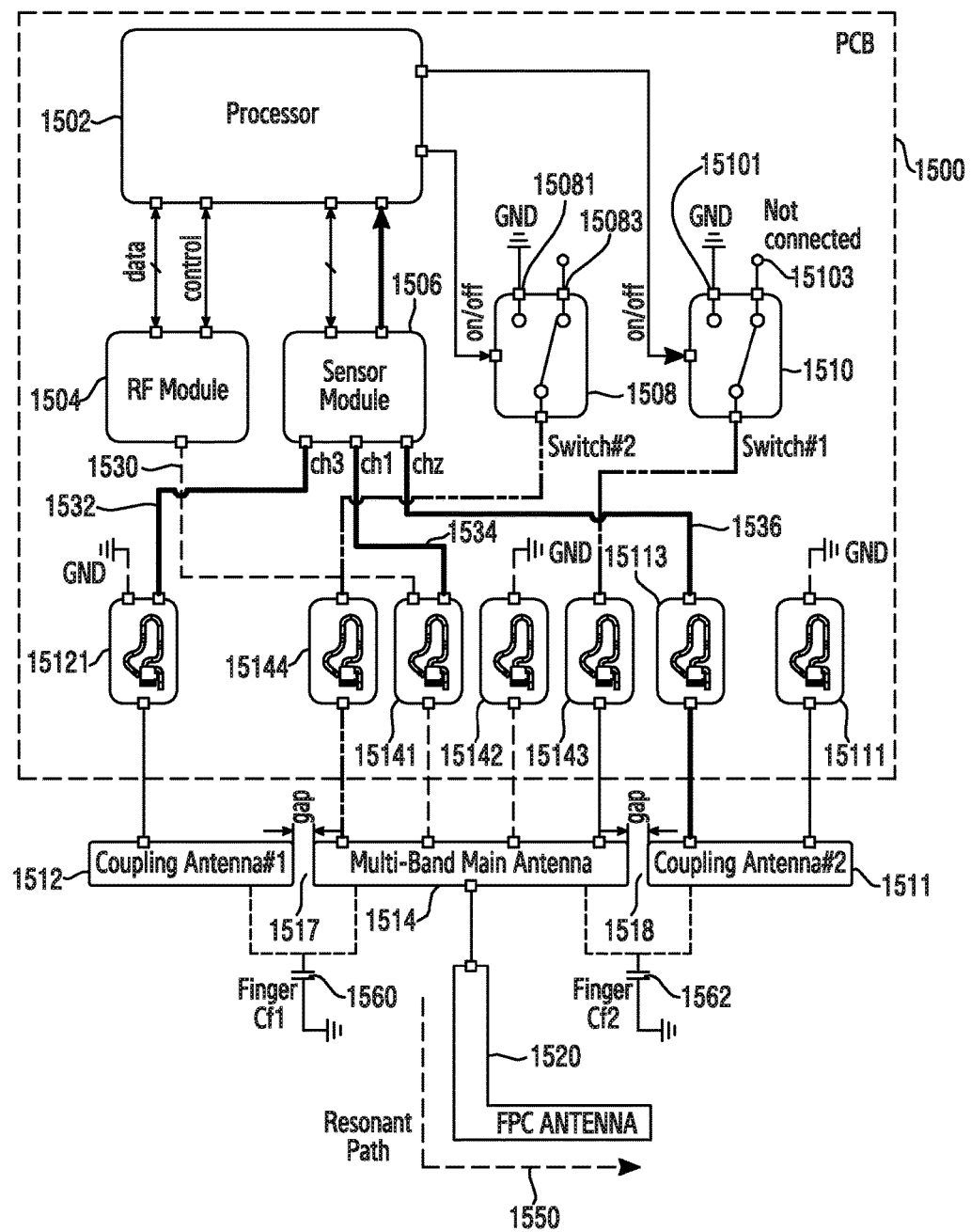
FIG. 15A is a diagram illustrating a configuration of an antenna circuit according to various embodiments of the present disclosure.

FIG. 15A is a diagram illustrating a configuration of an antenna circuit according to various embodiments of the present disclosure.

Referring to FIG. 15A, according to various embodiments of the present disclosure, the antenna circuit 1500 of FIG. 15A may be the same as or similar to the antenna circuit 1200 of FIG. 12A. In the following description, the components of the antenna circuit 1500 of FIG. 15A, which are different from those of the antenna circuit 1200 of FIG. 12A will be described, while omitting descriptions for the components of the antenna circuit 1500 of FIG. 15A, which are the same as or similar to those of the antenna circuit 1200 of FIG. 12A.

According to various embodiments of the present disclosure, the processor 1502 may control switches 1508 and 1510 to correspond to the direction of the resonant path of a signal fed through the main antenna 1514.

According to one embodiment of the present disclosure, in the case where a contact of an antenna radiator is not detected or a contact with respect to the second split portion 1518 between the main antenna 1514 and the second coupling antenna 1511 is detected, the processor 1502 may control the first switch 1510 such that the second ground piece of the main antenna 1514 (e.g., the second ground piece 14146 of FIG. 14) is electrically connected. In addition, the processor 1502 may control the second switch 1508 such that the electric connection of the third ground piece of the main antenna 1514 (e.g., the third ground piece 14147 of FIG. 14) is cut off. In this case, the signal fed through the RF module 1504 flows toward the ground of the first coupling antenna 1512 through the connection member 15141 and via the ground of the main antenna 1514 so that a resonant path may be formed.

According to one embodiment of the present disclosure, in the case where a contact with respect to the first split portion 1517 between the main antenna 1514 and the first coupling antenna 1512 is detected, the processor 1502 may control the first switch 1510 such that the electric connection to the second ground piece of the main antenna 1514 is cut off. In addition, the processor 1502 may control the second switch 1508 such that the third ground piece of the main antenna 1514 is electrically connected. For example, the signal fed through the RF module 1504 flows toward the ground of the second coupling antenna 1511 through the connection member 15141 and via the ground of the main antenna 1514 so that a resonant path may be formed.

According to one embodiment of the present disclosure, in the case where a contact with respect to the split portions 1517 and 1518 at the opposite ends of the main antenna 1514 is detected, the processor 1502 may control the first switch 1510 and the second switch 1508 such that the second ground piece and the third ground piece of the main antenna 1514 are electrically connected. For example, in the case where a contact of a human body with respect to the split portions 1517 and 1518 at the opposite ends of the main antenna 1514 is detected, the capacitance component of the metal housing antenna may be changed by the capacitances 1560 and 1562 that are generated by the human body. The processor 1502 may control the first switch 1510 and the second switch 1508 such that a new resonant path can be formed in order to electrically connect the second ground piece and the third ground piece of the main antenna 1514 to each other. For example, the signal fed through the RF module 1504 may be fed to the FPC antenna 1520 through the connection member 15141 and via the ground of the main antenna 1514 so that a resonant path 1550 may be formed.

According to various embodiments of the present disclosure, the sensor module 1506 may detect, through a plurality of recognition channels 1532, 1534, and 1536, an access or contact of an object that may have an influence on signal radiation (e.g., a human body), with respect to the main antenna 1514 or the first coupling antenna 1512 or the second coupling antenna 1511.

According to one embodiment of the present disclosure, the sensor module 1506 may detect, through the first recognition channel 1534, whether the main antenna 1514 is touched, may detect, through the second recognition channel 1536, whether the second coupling antenna 1511 is touched, and may detect, through the third recognition channel 1532, whether the first coupling antenna 1512 is touched.

According to one embodiment of the present disclosure, the sensor module 1506 may differentiate, through the first recognition channel 1534 and the third recognition channel 1532, a touch with respect to the first split portion 1517 between the main antenna 1514 and the first coupling antenna 1512. For example, in the case where the contact information of the object is detected through the first recognition channel 1534 and the second recognition channel 1532, the sensor module 1506 may determine that the touch with respect to the first split portion 1517 is detected.

According to one embodiment of the present disclosure, the sensor module 1506 may differentiate, through the first recognition channel 1534 and the second recognition channel 1536, a touch with respect to the second split portion 1518 between the main antenna 1514 and the second recognition channel 1534. For example, in the case where the contact information of the object is detected through the first recognition channel 1534 and the second recognition channel 1536, the sensor module 1506 may determine that the touch with respect to the second split portion 1518 is detected.

Figure 15B:
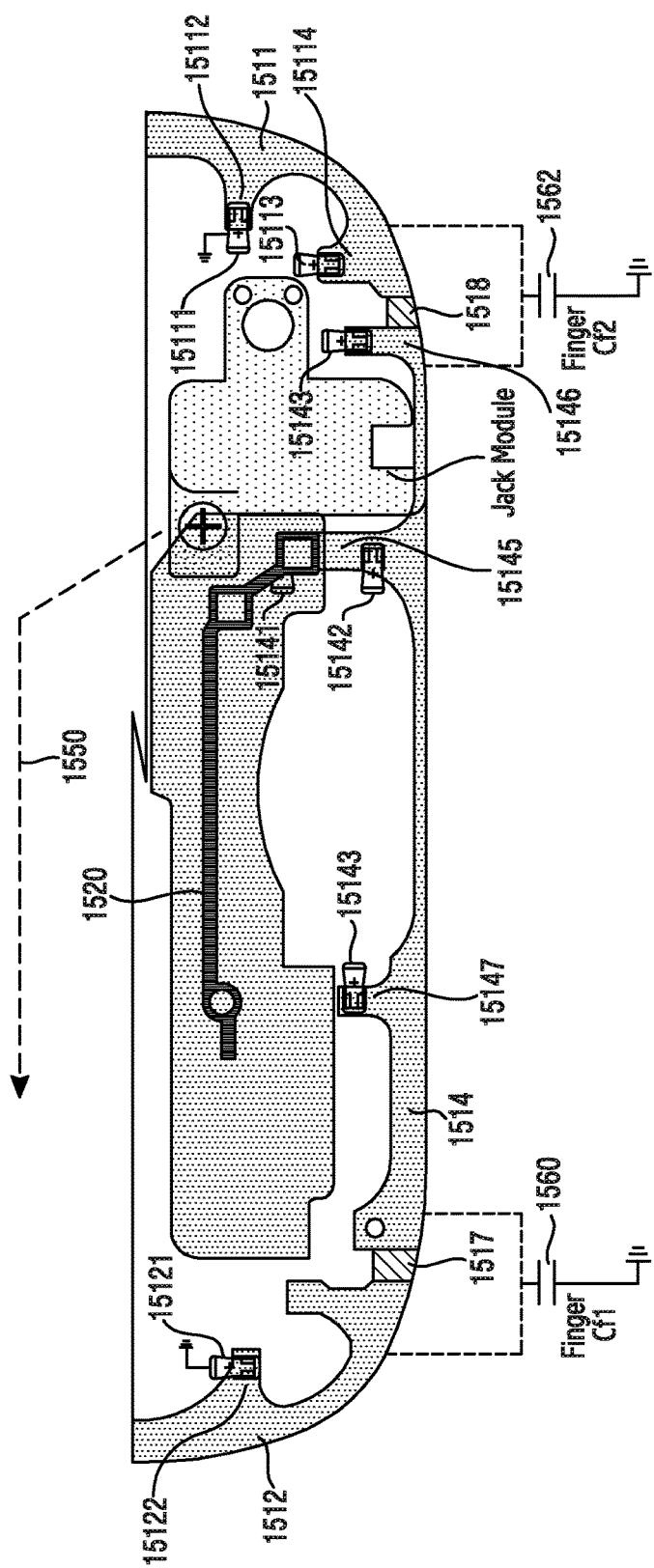
FIG. 15B is a diagram illustrating a configuration of an antenna device according to various embodiments of the present disclosure, in which radiating flows of the antenna device are illustrated.

FIG. 15B is a diagram illustrating a configuration of an antenna device according to various embodiments of the present disclosure, in which radiating flows of the antenna device are illustrated.

Referring to FIG. 15B, according to various embodiments of the present disclosure, the metal bezel of FIG. 15B is an embodiment of a metal bezel that is the same as or similar to, or different from the metal bezel 1410 of FIG. 14.

According to various embodiments of the present disclosure, the FPC antenna 1520 (e.g., the FPC antenna 1520 of FIG. 15A) may be electrically connected to the lower bezel section 1514 (e.g., the main antenna 1514 of FIG. 15A).

According to one embodiment of the present disclosure, the FPC antenna 1520 may be electrically connected to the lower bezel section 1514, thereby being connected to the power feeding piece 15142 and the first ground piece 15145. For example, the first ground piece 15145 of the lower bezel section 1514 may include at least a portion of the power feeding piece 15145.

According to various embodiments of the present disclosure, in the case where a contact of a human body with respect to the split portions 1517 and 1518 at the opposite ends of the lower bezel section 1514 is detected, new capacitances 1560 and 1562 may be generated in the split portions 1517 and 1518 at the opposite ends of the lower bezel section 1514. The second ground piece 15146 and the third ground piece 15147 of the lower bezel section 1514 may be electrically connected to the ground portion of the board 1500 of FIG. 15A such that a new resonant path is formed. In this example, since the signal fed through the lower bezel section 1514 cannot be fed through the right bezel section 1511 (e.g., the second coupling antenna 1511 of FIG. 15A) or the left bezel section 1512 (e.g., the first coupling antenna 1512 of FIG. 15A), the signal may be fed to the FPC antenna 1520 electrically connected to the lower bezel section 1514 so that a new resonant path 1550 can be formed.

Figure 16A:
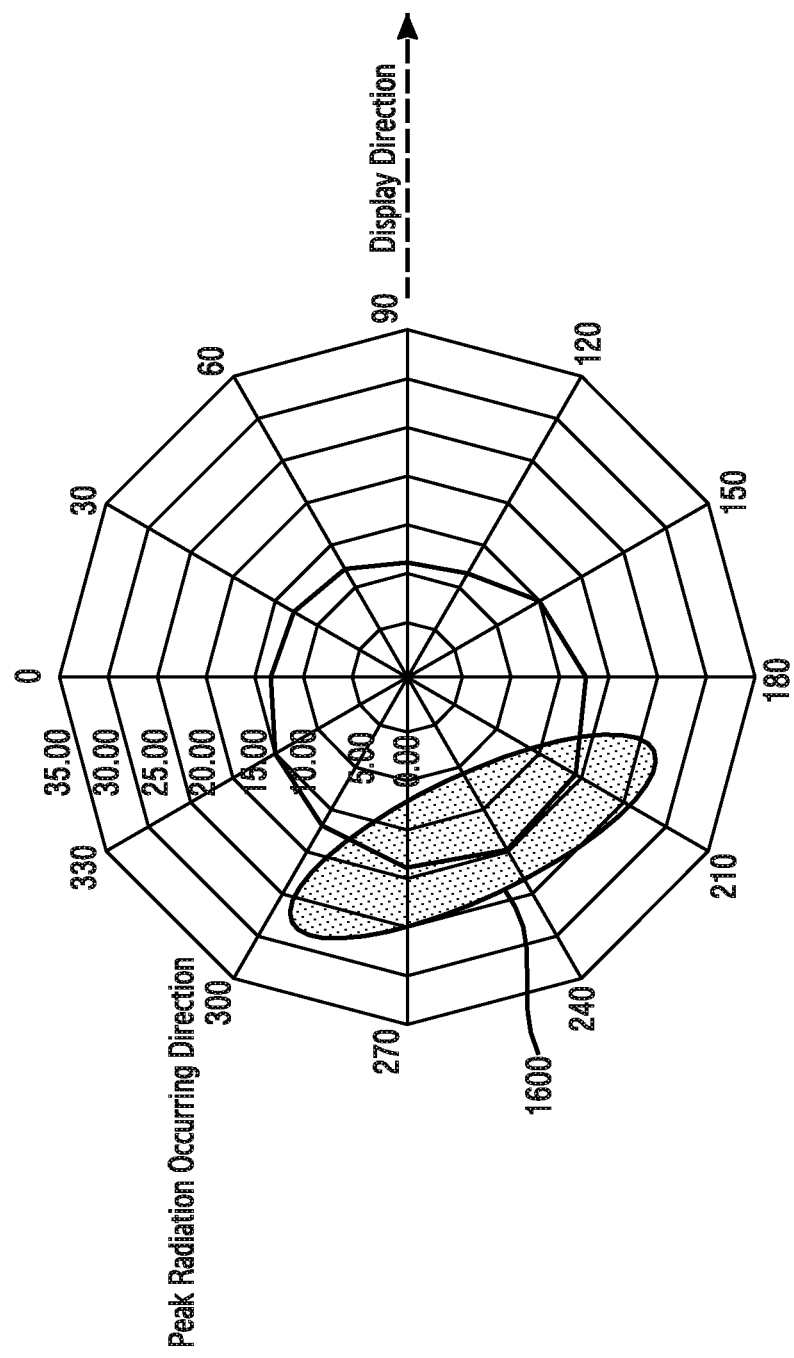
FIGS. 16A and 16B are graphs representing radiating characteristics of an antenna device according to various embodiments of the present disclosure.
Figure 16B:
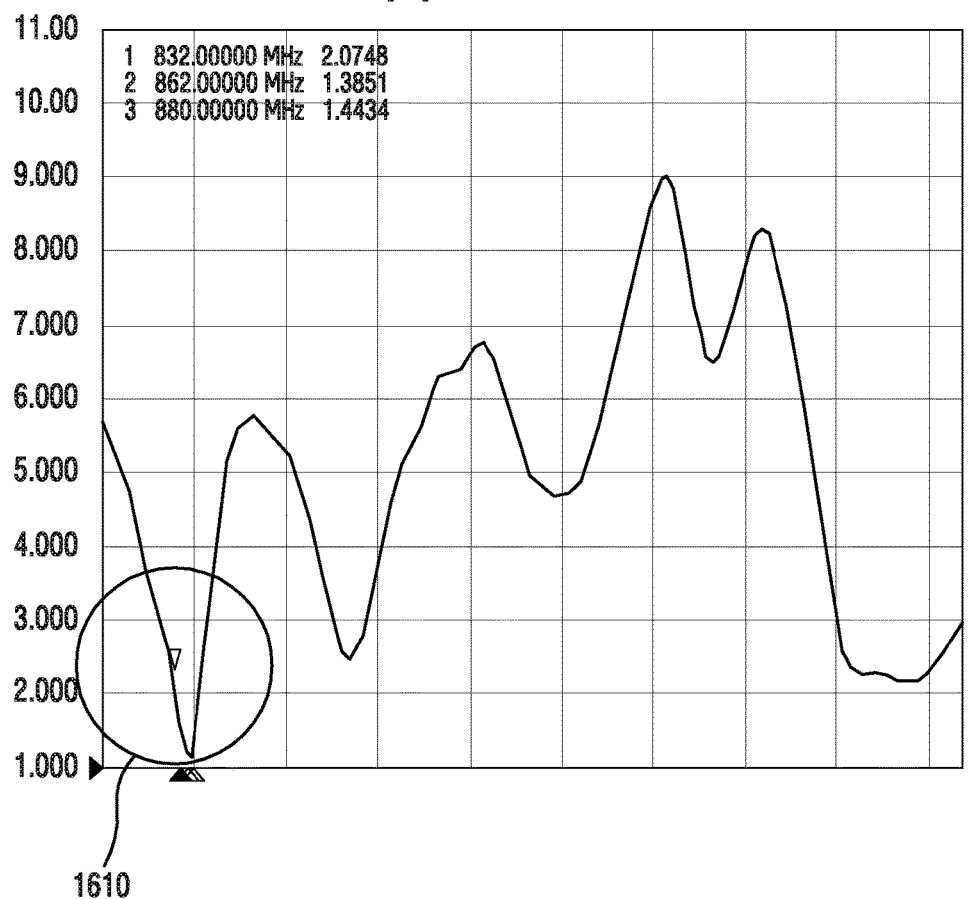

FIGS. 16A and 16B are graphs representing radiating characteristics of an antenna device according to various embodiments of the present disclosure.

Referring to FIGS. 16A and 16B, according to various embodiments of the present disclosure, FIGS. 16A and 16B may represent a radiating characteristic of a metal housing antenna that uses the main antenna 1514 and the FPC antenna 1520, as in FIG. 15A.

According to various embodiments of the present disclosure, FIG. 16A may represent a radiating characteristic that is measured while rotating the electronic device by 360 degrees with reference to the display thereof.

According to one embodiment of the present disclosure, a signal radiating characteristic may strongly appear on the rear face 1600 of the electronic device due to the resonant path formed in the FPC antenna 1520. For example, the total radiating characteristic (TRP) may be measured as 15.47 dB.

According to an embodiment of the present disclosure, a resonance frequency 1610 may be generated as illustrated in FIG. 16B due to the resonant path 1550 formed on the main antenna 1514 and the FPC antenna 1520.

Figure 17A:
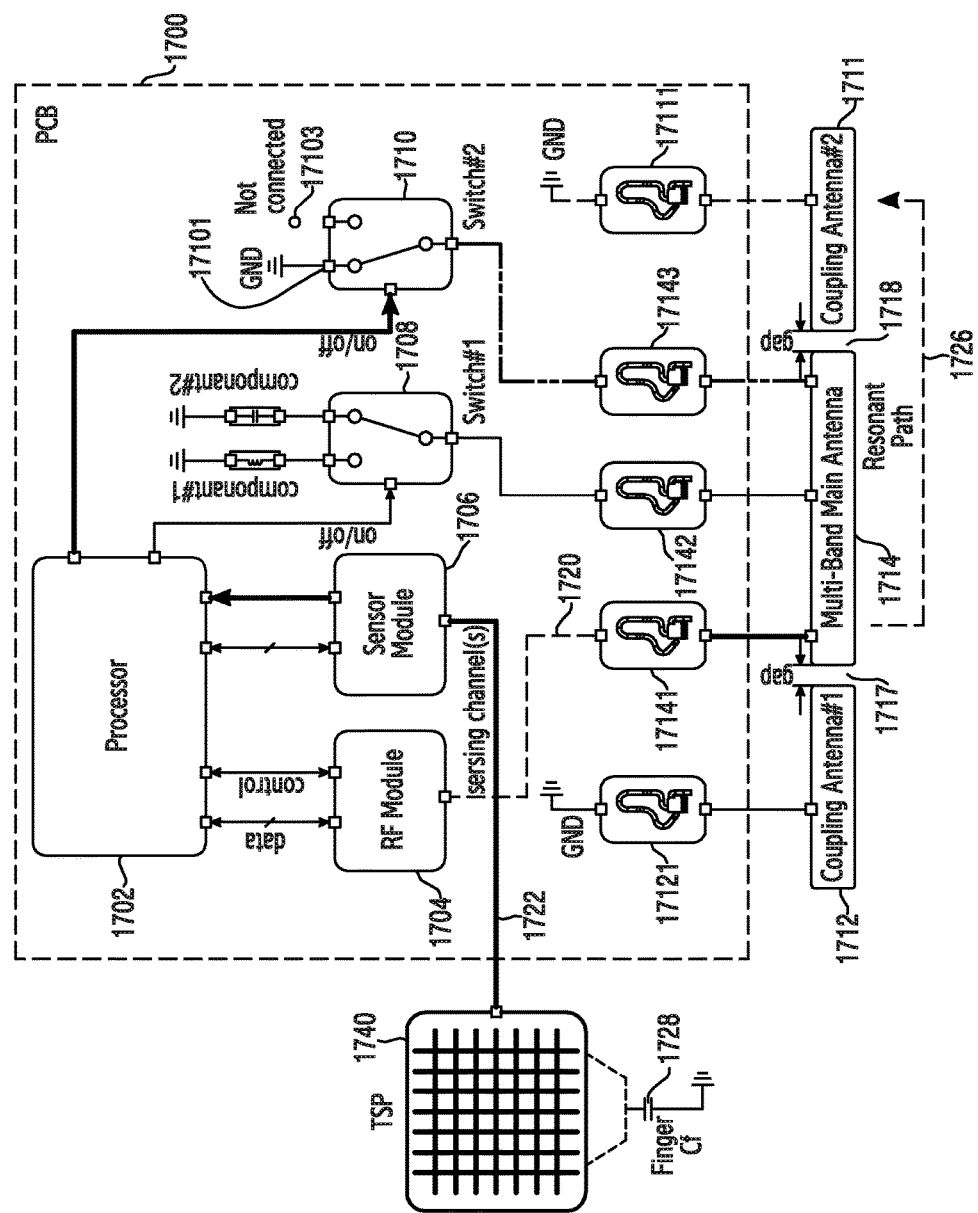
FIG. 17A is a diagram illustrating a configuration of an antenna circuit according to various embodiments of the present disclosure.

FIG. 17A is a diagram illustrating a configuration of an antenna circuit according to various embodiments of the present disclosure.

Referring to FIG. 17A, according to an embodiment of the present disclosure, the antenna circuit 1700 of FIG. 17A may be configured to be the same as or similar to the antenna circuit 500 of FIG. 5A. In the following description, the components of the antenna circuit 1700 of FIG. 17A, which are different from those of the antenna circuit 500 of FIG. 5A will be described, while omitting descriptions for the components of the antenna circuit 1700 of FIG. 17A, which are the same as or similar to those of the antenna circuit 500 of FIG. 5A.

According to various embodiments of the present disclosure, the sensor module 1706 may be connected to a sensing pad 1740 through the recognition channel 1722 so as to detect access or contact of an object that may have an influence on signal radiation (e.g., a human body).

According to one embodiment of the present disclosure, the sensor module 1706 may detect the capacitance change 1728 of the sensing pad 1740, which includes a plurality of transmission/reception sensing channel lines through a mutual-capacitance manner, in order to sense the access or contact of a human body. For example, the sensing pad 1740 may include a touch screen panel (TSP) of the electronic device.

According to one embodiment of the present disclosure, the sensing pad 1740 may recognize a human body that accesses or comes in contact with a flat top end (z-axis) of the sensing pad 1740, or may recognize a human body that accesses or comes in contact with a flat side end (x-axis and y-axis) of the sensing pad 1740 by adjusting the sensitivity of the sensing pad 1740. For example, the sensing pad 1740 may be additionally provided with a conductor that is connected to a sensing channel line of the sensing pad 1740 for sensing a side end.

According to various embodiments of the present disclosure, in the case where the access or contact information of the object with respect to the first coupling 1717 between the main antenna 1714 and the first coupling antenna 1712 is received from the sensor module 1706, the processor 1702 may control the second switch 1710 such that the electric connection with respect to the sub-ground of the main antenna 1714 (e.g., the ground by the second ground piece 4146 of FIG. 4) is cut off in order to change the resonant path. In the case where the electric connection of the sub-ground is cut off by the second switch 1710, the signal fed from the RF module 1704 flows toward the ground of the second coupling antenna 1711 through the connection member 17141 and via the ground of the main antenna 1714 so that a resonant path 1726 may be formed.

Figure 17B:
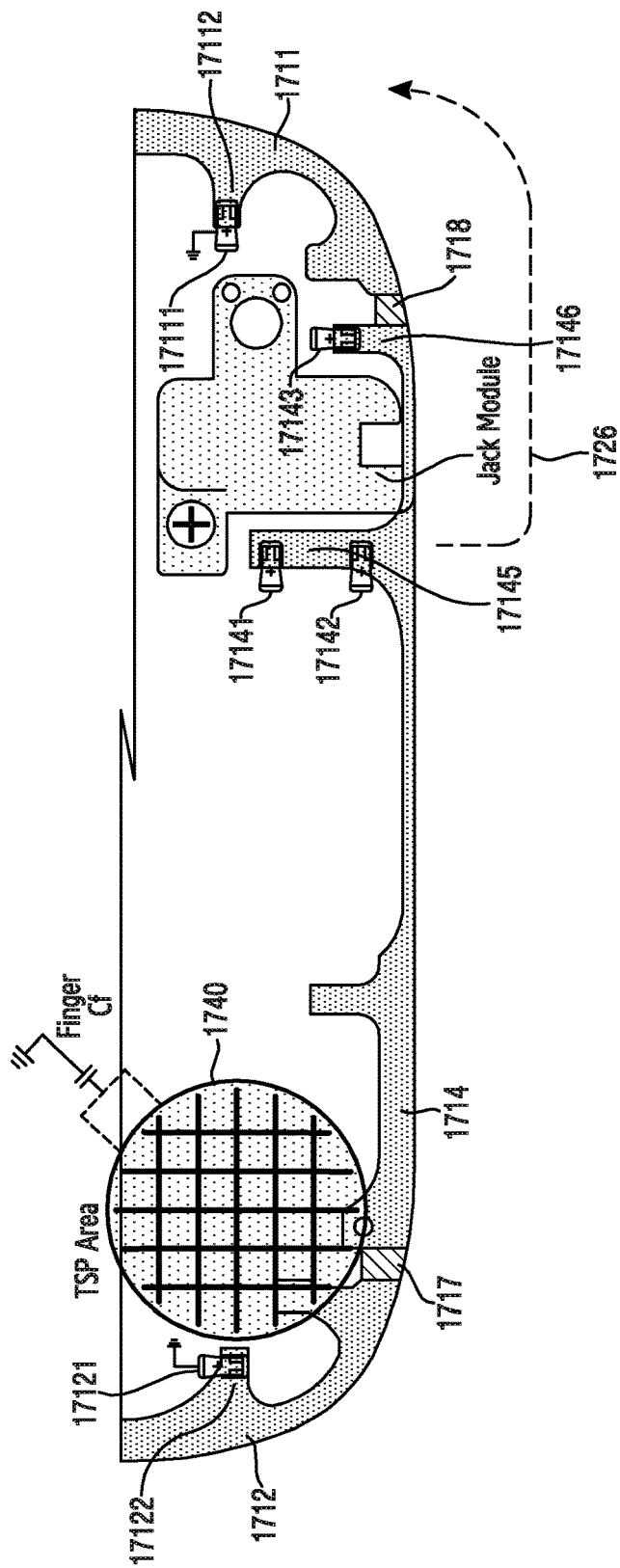
FIG. 17B is a diagram illustrating a configuration of an antenna device according to various embodiments of the present disclosure, in which radiating flows of the antenna device are illustrated.

FIG. 17B is a diagram illustrating a configuration of an antenna device according to various embodiments of the present disclosure, in which radiating flows of the antenna device are illustrated.

According to various embodiments of the present disclosure, the configuration of the antenna device of FIG. 17B is similar to or the same as that of the antenna device of FIG. 5C, and thus descriptions for respective components will be omitted.

Referring to FIG. 17B, in the case where the access or contact of a human body with respect to the first split portion 1717 of the metal housing antenna through the sensing pad 1740 of FIG. 17A is sensed, the processor 1702 of FIG. 17A may control the second switch 1710 of FIG. 17A such that the electric connection with respect to the sub-ground (e.g., the second ground piece 17146) of the lower bezel section 1714 (e.g., the main antenna 1714 of FIG. 17A) is cut off.

According to various embodiments of the present disclosure, in the case where the electric connection of the second ground piece 17146 of the lower bezel section 1714 is cut off by the second switch 1710, an electric gap may be formed in the second split portion 1718 between the lower bezel section 1714 and the right bezel section 1711 (e.g., the second coupling antenna 1711 of FIG. 17A) by the signal fed through the RF module 1704. For example, the resonant path 1726 of the signal fed from the RF module 1704 may pass through the first ground piece 17145 in the power feeding piece 17145 of the lower bezel section 1714 and may be formed in the direction of the ground piece 17112 of the right bezel section 1711.

According to various embodiments of the present disclosure, the electronic device may include: a housing that includes a first face, a second face that is directed opposite to the first face, and a side face that at least partially encloses a space between the first face and the second face; a first metallic member that forms a first portion of the side face, and includes a first end and a second end; a second metallic member that forms a second portion of the side face, and is positioned adjacent to the first end of the first metallic member and electrically insulated from the first metallic member; a third metallic member that forms a third portion of the side face, and is positioned adjacent to the second end of the first metallic member and electrically insulated from the first metallic member; a communication circuit that is electrically connected to at least one of the first metallic member, the second metallic member, and the third metallic member; at least one ground member that is included within the housing; a sensor that is configured to detect whether an external object comes in contact with at least one of the first metallic member, the second metallic member, and the third metallic member, and to generate a signal; and a circuit configured to change an electric path between at least one of the first metallic member, the second metallic member, and the third metallic member, and the ground member, at least partially based on the generated signal.

According to various embodiments of the present disclosure, the first metallic member may include: a power feeding portion set in advance; a first ground portion that is arranged at a position spaced apart from the power feeding portion; and one or more second ground portions that are arranged at different positions, respectively, which are spaced apart from the first ground portion.

According to various embodiments of the present disclosure, an electric path between at least one of the second ground portions and the ground member may be changed by a switch.

According to various embodiments of the present disclosure, in the case where a contact of an external object with respect to the first metallic member, the second metallic member, or the third metallic member is not detected through the sensor, the switch may electrically connect the at least one of the second ground portions and the ground member to each other.

According to various embodiments of the present disclosure, in the case where the at least one of the second ground portions is electrically connected to the ground member, the second metallic member may be coupled with the first metallic member.

According to various embodiments of the present disclosure, the communication circuit may be configured to transmit a signal having a first frequency band to the outside by using the third metallic member in the case where the at least one of the second ground portions is electrically connected with the ground member.

According to various embodiments of the present disclosure, in the case where a contact of an external object with respect to the first metallic member, the second metallic member, or the third metallic member is detected through the sensor, the switch may cut off an electric connection between the at least one of the second ground portions and the ground member.

According to various embodiments of the present disclosure, in the case where the electric connection between the at least one of the second ground portions and the ground member is cut off, the third metallic member may be coupled with the first metallic member.

According to various embodiments of the present disclosure, in the case where a contact of an external object with respect to the third metallic member is detected through the sensor, the switch may cut off the electric connection between the at least one of the second ground portions and the ground member.

According to various embodiments of the present disclosure, in the case where the electric connection between the at least one of the second ground portions and the ground member is cut off, the first metallic member may be coupled with the third metallic member.

According to various embodiments of the present disclosure, an electric path between at least one of the second ground portions and the ground member may be changed by a first switch, and an electric path between at least one of the other second ground portions and the ground member may be changed by a second switch.

According to various embodiments of the present disclosure, in the case where a contact of an external object with respect to the third metallic member is detected through the sensor, the first switch may electrically connect the at least one of the second ground portions and the ground member to each other.

According to various embodiments of the present disclosure, in the case where a contact of an external object with respect to the first metallic member and the third metallic member is detected through the sensor, the second switch may electrically connect the at least one of the other second ground portions and the ground member to each other.

According to various embodiments of the present disclosure, the side face may further include a fourth metallic member that is connected to the first metallic member in the first portion, and in the case where the at least one of the second ground portions and the at least one of the other second ground portions are electrically connected to the ground member, the fourth metallic member is coupled with the first metallic member.

According to various embodiments of the present disclosure, the sensor may include at least one of a touch sensor and a grip sensor.

According to various embodiments of the present disclosure, the first metallic member, the second metallic member, and the third metallic member may include a metal bezel or a decoration member that is disposed to be at least partially exposed to the outside of the electronic device.

According to various embodiments of the present disclosure, the electronic device may further include a display, and the first metallic member, the second metallic member, and the third metallic member may be arranged in such a manner of enclosing at least a partial region of the rim of the display.

Figure 18:
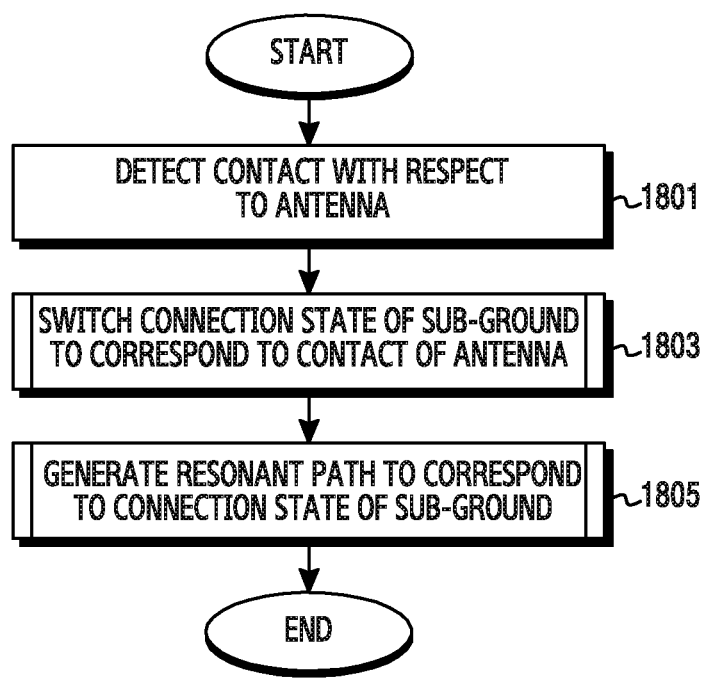
FIG. 18 is a flowchart illustrating a process for switching a connection state of a sub-ground to correspond to an antenna contact in an electronic device according to various embodiments of the present disclosure.

FIG. 18 is a flowchart illustrating a process for switching a connection state of a sub-ground to correspond to an antenna contact in an electronic device according to various embodiments of the present disclosure.

Referring to FIG. 18, in operation 1801, the electronic device may detect the access or contact of an object that may have an influence on signal radiation (e.g., a human body), with respect to an antenna radiator. For example, the electronic device may detect the access or contact of an object (human body) with respect to one or more antenna radiators by sensing a change in the capacitance of the antenna radiators through a self-capacitance type or mutual capacitance type sensor module 506. For example, as illustrated in FIG. 3, the antenna radiators may include a lower bezel section 314 (a main antenna radiator) that is separated by a pair of split portions 317 and 318, a first sub-bezel section (the first coupling antenna radiator 312) that is positioned at the left side of the lower bezel section 314 with reference to the sub-bezel sections 317 and 318, and a second sub-bezel section (the second coupling antenna radiator 311) that is positioned at the right side of the lower bezel section 314 with reference to the sub-bezel sections 317 and 318. For example, the first sub-bezel section may be formed with a region from the first split portion 317 of the lower bezel section 314 to a grounded position of the left bezel section 312. The second sub-bezel section may be formed with a region from the second split portion 318 of the lower bezel section 314 to a grounded position of the right bezel section 311. For example, the sensor module 506 may include at least one of a touch sensor and a grip sensor.

In operation 1803, the electronic device may convert the connection state of the sub-ground of the main antenna radiator to correspond to the contact of an antenna radiator or a split portion. For example, as illustrated in FIG. 5A, in the case where the access or contact of an object with respect to an antenna radiator is not detected, the electronic device may electrically connect the sub-ground of the main antenna radiator 514 (e.g., the ground by the second ground piece 4146 of FIG. 4) through the second switch 510. For example, as illustrated in FIG. 9A, in the case where no contact of a human body with respect to the first split portion 917 is detected, the electronic device may cut off, through the second switch 910, the electric connection with respect to the sub-ground of the main antenna radiator 914. For example, as illustrated in FIG. 13A, in the case where the contact of a human body with respect to the second split portion 1311 is detected, the electronic device may cut off, through the second switch 1310, the electric connection with respect to the sub-ground of the main antenna radiator 1314.

In operation 1805, the electronic device may form or generate a resonant path to correspond to the connection state of the sub-ground. For example, in the case where the sub-ground of the main antenna radiator 514 is electrically connected (short circuited) as illustrated in FIG. 5A, the electronic device may cause a signal, which is fed from the RF module 504, to flow toward the ground of the first coupling antenna 512 via the ground of the main antenna 514 from the power feeding piece of the main antenna 514 connected to the connection member 5141 such that a resonant path 524 may be formed. For example, in the case where the electric connection with respect to the sub-ground of the main antenna 914 is cut off (opened) as illustrated in FIG. 9A, the electronic device may cause a signal, which is fed from the RF module 904, to flow toward the ground of the second coupling antenna 911 via the ground of the main antenna radiator 914 from the power feeding piece of the main antenna 514 connected to the connection member 9141 such that a resonant path 926 may be formed. For example, in the case where the sub-ground of the main antenna 1214 is electrically connected as illustrated in FIG. 12A, the electronic device may cause a signal, which is fed from the RF module 1204, to flow toward the ground of the second coupling antenna 1211 from the power feeding piece of the second coupling antenna 1211 connected to the connection member 12113 such that that a resonant path 1234 may be formed. For example, in the case where the electric connection with respect to the sub-ground of the main antenna radiator 1314 is cut off as illustrated in FIG. 13A, the electronic device may cause a signal, which is fed from the RF module 1304, to flow toward the first ground of the main coupling antenna radiator 1314 from the power feeding piece of the second coupling antenna 1211 connected to the connection member 13113 such that that a resonant path 1340 may be formed.

Figure 19:
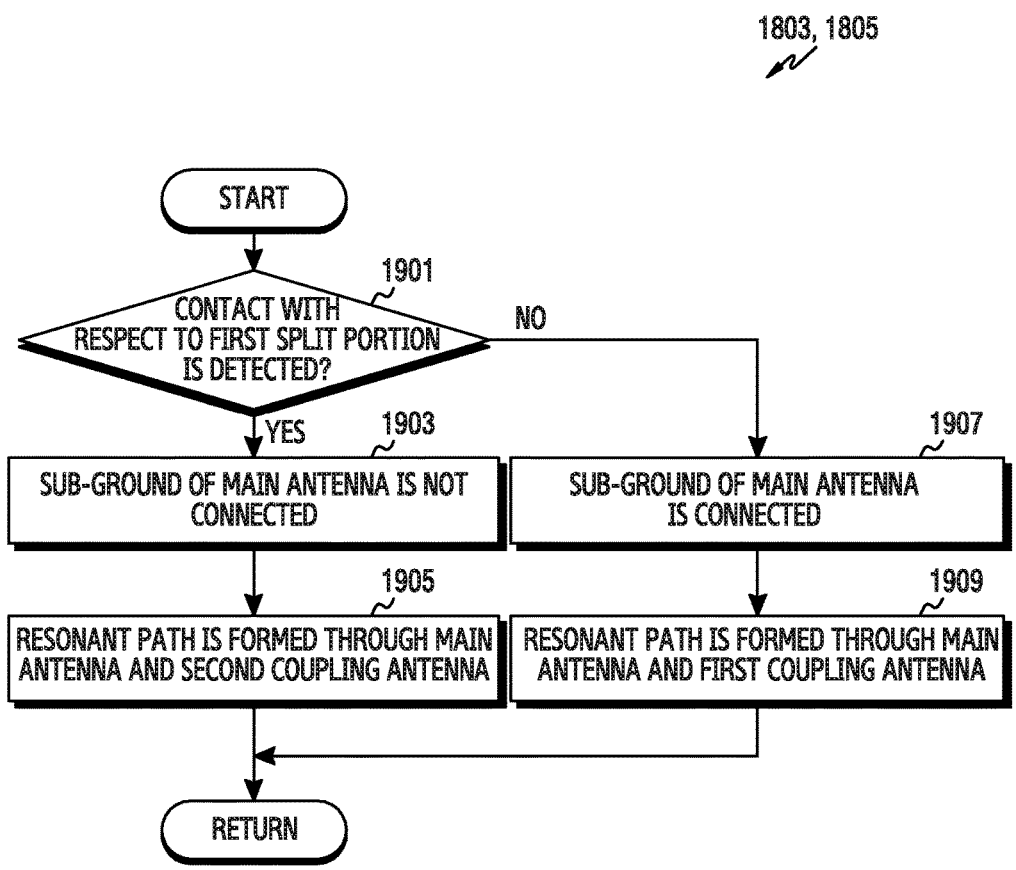
FIG. 19 is a flowchart for illustrating a process of forming a resonant path to correspond to a connection state of a sub-ground in an electronic device according to various embodiments of the present disclosure.

FIG. 19 is a flowchart for illustrating a process of forming a resonant path to correspond to a connection state of a sub-ground in an electronic device according to various embodiments of the present disclosure. Now, descriptions will be made on operations of forming a resonant path to correspond to the connection state of a sub-ground in operations 1803 and 1805 of FIG. 18.

Referring to FIG. 19, in operation 1901, the electronic device may confirm whether an access or contact of an object (e.g., a human body) with respect to a split portion (e.g., the first split portion 517 of FIG. 9A) between the main antenna and the first coupling antenna, which has an influence on the resonant path of an antenna, is detected. For example, in the case of FIG. 9A, the processor 902 may confirm, through the sensor module 906, whether a contact of an object with respect to the main antenna 914 or the first coupling antenna 912 is detected. For example, in the case where the contact of the object with respect to the main antenna 914 and the first coupling antenna 912 is detected, the processor 902 may determine that a contact of an object with respect to the main antenna 914 or the first split portion 917 is detected. For example, in the case of FIG. 15A, the processor 1502 may confirm, through the first recognition channel 1534 and the second recognition channel 1532 of the sensor module 1506, whether a contact of an object with respect to the first split portion 1517 is detected. For example, in the case where a contact of the object is detected through the first recognition channel 1534 and the second recognition channel 1532, the processor 1502 may determine that a contact of the object with respect to the first split portion 1517 is detected. For example, in the case of FIG. 17A, the processor 1702 may confirm, through a sensing pad 1740, whether a contact of an object with respect to the first split portion 1717 is detected.

In operation 1903, in the case where an access or contact of an object (e.g., a human body) with respect to a split portion between the main antenna and the first coupling antenna is detected, the electronic device may convert the sub-ground of the main antenna into a non-connection state. For example, in the case of FIG. 9A, in the case where a contact of a human body with respect to the first split portion 917 is detected through the sensor module 906, the processor 902 may control the second switch 910 such that the electric connection of the sub-ground of the main antenna radiator 914 is cut off.

In operation 1905, in the case where the sub-ground of the main antenna is converted into the non-connection state, the electronic device may form a resonant path through the main antenna and the second coupling antenna. For example, in the case of FIG. 9A, a signal fed from the RF module 904 may be coupled to the second coupling antenna 911 via the first ground in the power feeding piece of the main antenna 914 such that a resonant path 926 may be formed to a ground portion connected to the ground piece of the second coupling antenna 911.

In operation 1907, in the case where an access or contact of an object (e.g., a human body) with respect to a split portion between the main antenna and the first coupling antenna is not detected, the electronic device may cause the sub-ground of the main antenna to be electrically connected. For example, in the case of FIG. 5A, in the case where a contact of a human body with respect to the main antenna radiator 514 or the split portion 517 is not detected through the sensor module 506, the processor 502 may control the second switch 510 such that the sub-ground of the main antenna radiator 514 is electrically connected.

In operation 1909, in the case where the sub-ground of the main antenna is electrically connected, the electronic device may form a resonant path through the main antenna and the first coupling antenna. For example, in the case of FIG. 5A, a signal fed from the RF module 504 may be coupled to the first coupling antenna 512 via the first ground in the power feeding piece of the main antenna 514 such that a resonant path 524 may be formed to a ground portion connected to the ground piece of the first coupling antenna 512.

Figure 20:
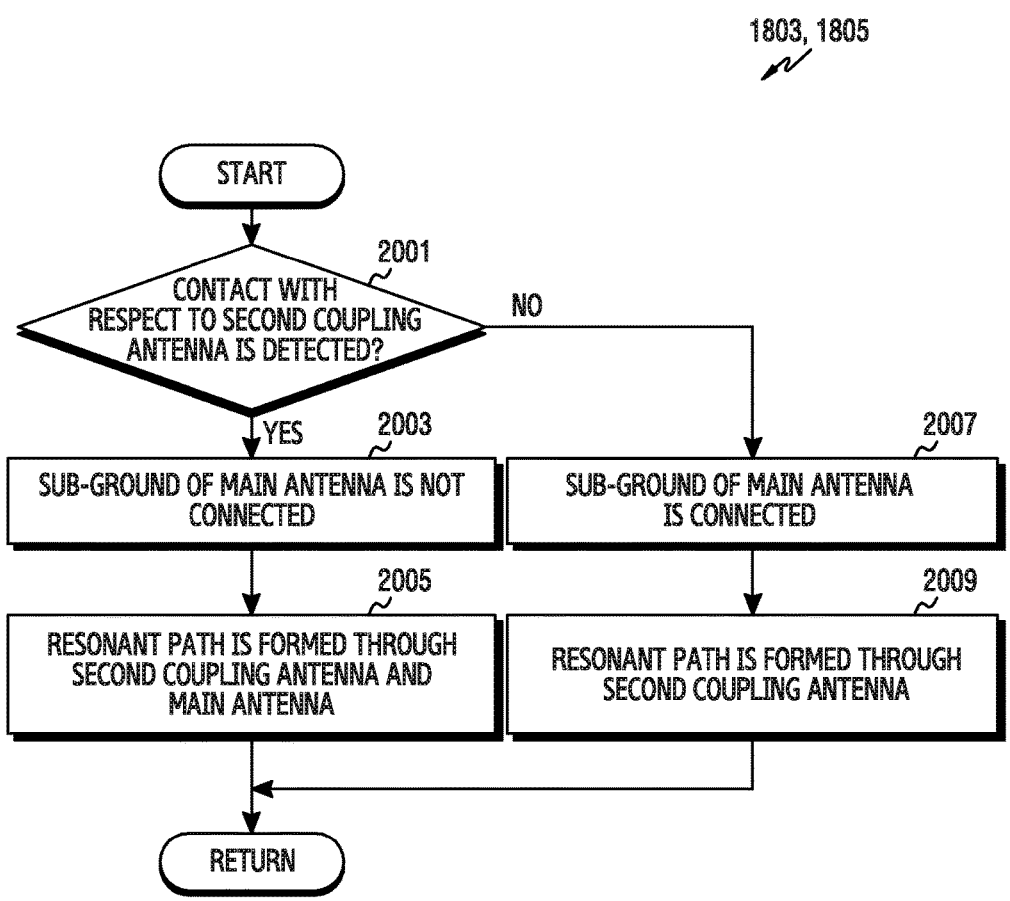
FIG. 20 is a flowchart for illustrating a process of forming a resonant path to correspond to a connection state of a sub-ground in an electronic device according to various embodiments of the present disclosure.

FIG. 20 is a flowchart for illustrating a process of forming a resonant path to correspond to a connection state of a sub-ground in an electronic device according to various embodiments of the present disclosure. Now, descriptions will be made on operations of forming a resonant path to correspond to the connection state of a sub-ground in operations 1803 and 1805 of FIG. 18.

Referring to FIG. 20, in operation 2001, the electronic device may confirm whether an access or contact of an object (e.g., a human body) with respect to the second coupling antenna radiator, which forms a resonant path, is detected. For example, in the case of FIG. 12A, the processor 1202 may confirm, through the second recognition channel 1232 of the sensor module 1206, whether a contact of an object with respect to the second coupling antenna 1211 is detected.

In operation 2003, in the case where an access or contact of an object (e.g., a human body) with respect to the second coupling antenna is detected, the electronic device may convert the sub-ground of the main antenna into a non-connection state. For example, in the case of FIG. 13A, in the case where a contact of a human body with respect to the second coupling antenna 1311 is detected through the sensor module 1306, the processor 1302 may control the second switch 1310 such that the electric connection of the main antenna radiator 1314 with respect to the sub-ground is cut off.

In operation 2005, in the case where the sub-ground of the main antenna is converted into the non-connection state, the electronic device may form a resonant path through the main antenna and the second coupling antenna. For example, in the case of FIG. 13A, a signal fed from the RF module 1304 may be coupled to the main coupling antenna 1314 in the power feeding piece of the second coupling antenna 1311 such that a resonant path 1340 may be formed to a ground portion connected to the first ground piece of the main coupling antenna 1314.

In operation 2007, in the case where an access or contact of an object (e.g., a human body) with respect to the second coupling antenna radiator is detected, the electronic device may electrically connect the sub-ground of the main antenna. For example, in the case of FIG. 12A, in the case where a contact of a human body with respect to the second coupling antenna 1211 is not detected through the sensor module 1206, the processor 1202 may control the second switch 1210 such that the sub-ground of the main antenna radiator 1214 may be electrically connected.

In operation 2009, in the case where the sub-ground of the main antenna is electrically connected, the electronic device may form a resonant path through the second coupling antenna. For example, in the case of FIG. 12A, a signal fed from the RF module 1204 may be coupled to the second coupling antenna 1211 in the power feeding piece of the second coupling antenna 1211 such that a resonant path 1234 may be formed to a ground portion connected to the ground piece of the second coupling antenna 1211.

Figure 21:
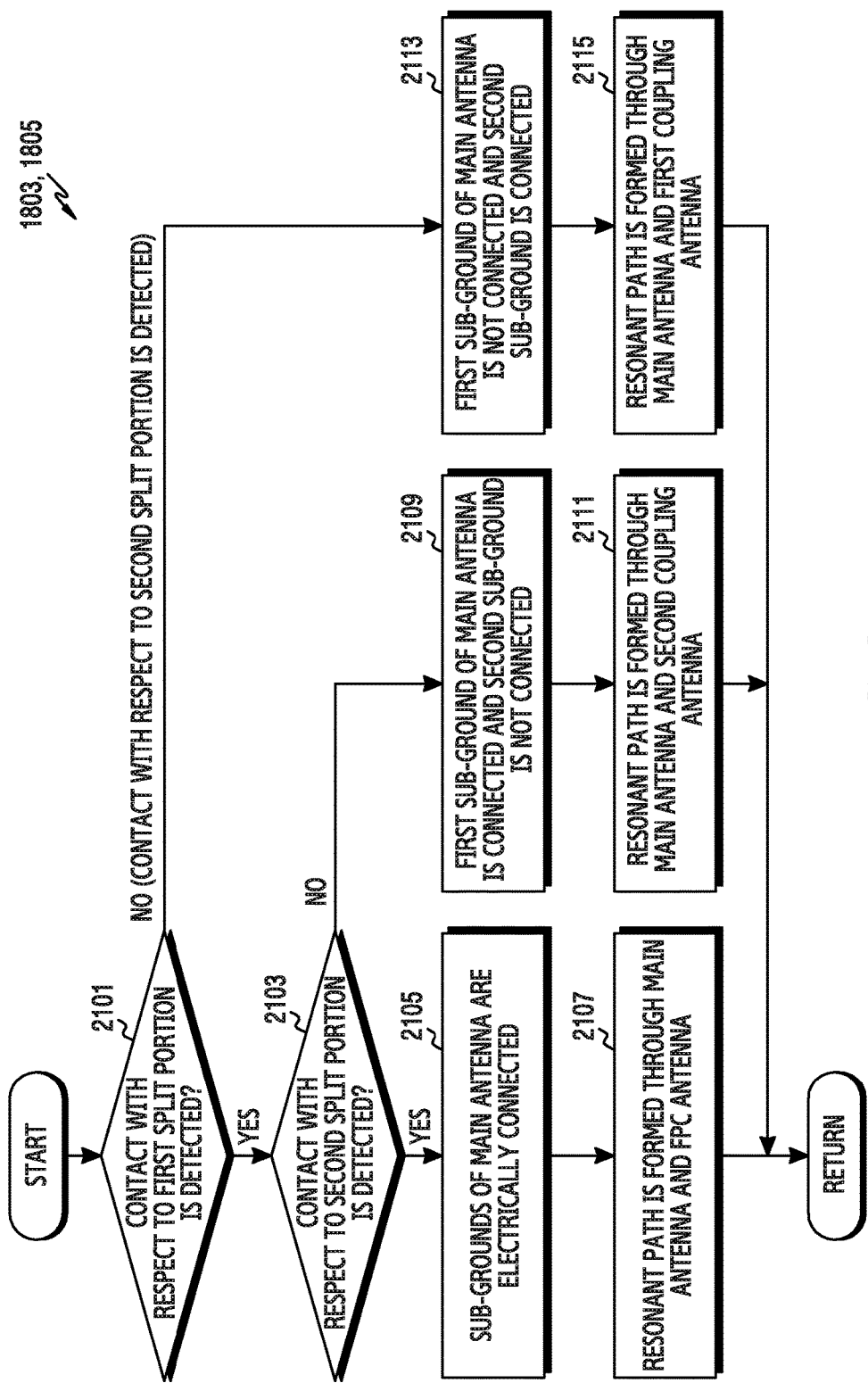
FIG. 21 is a flowchart for illustrating a process of forming a resonant path to correspond to a connection state of a sub-ground in an electronic device according to various embodiments of the present disclosure.

FIG. 21 is a flowchart for illustrating a process of forming a resonant path to correspond to a connection state of a sub-ground in an electronic device according to various embodiments of the present disclosure. Now, descriptions will be made on operations of forming a resonant path to correspond to the connection state of a sub-ground in operations 1803 and 1805 of FIG. 18.

Referring to FIG. 21, in operation 2101, the electronic device may confirm whether an access or contact of an object (e.g., a human body) with respect to a first split portion (e.g., the first split portion 1517 of FIG. 15A) between the main antenna and the first coupling antenna is detected. For example, in the case of FIG. 15A, the processor 1502 may confirm, through the first recognition channel 1534 and the second recognition channel 1532 of the sensor module 1506, whether a contact of an object with respect to the first split portion 1517 is detected. For example, in the case where a contact of the object is detected through the first recognition channel 1534 and the second recognition channel 1532, the sensor module 1502 may determine that a contact of the object with respect to the first split portion 1517 is detected.

In operation 2103, in the case where an access or contact of an object (e.g., a human body) with respect to the first split portion is detected, the electronic device may confirm whether an access or contact of an object (e.g., a human body) with respect to a second split portion (e.g., the second split portion 1518 of FIG. 15A) between the main antenna and the second coupling antenna is detected. For example, in the case of FIG. 15A, the processor 1502 may confirm, through the first recognition channel 1534 and the third recognition channel 1536, whether a contact of an object with respect to the second split portion 1518 is detected. For example, in the case where a contact of the object is detected through the first recognition channel 1534 and the third recognition channel 1536, the processor 1502 may determine that a contact of the object with respect to the second split portion 1518 is detected.

In operation 2105, in the case where a contact of an object with respect to the first split portion and the second split portion is detected, the electronic device may convert the first sub-ground and the second sub-ground such that each of the first sub-ground and the second sub-ground is electrically connected. For example, in the case of FIG. 15A, in the case where a contact of a human body with respect to the first split portion 1517 and the second split portion 1518 is detected, the processor 1502 may control the first switch 1510 and the second switch 1508 such that the first sub-ground and the second sub-ground of the main antenna radiator 1514, which are connected to the board 1500 through the connection members 15143 and 15144, respectively, are electrically connected.

In operation 2107, in the case where each of the first sub-ground and second sub-ground of the main antenna is switched to be electrically connected, the electronic device may form a resonant path through the main antenna and the FPC antenna. For example, in the case of FIG. 15A, a signal fed from the RF module 1504 may be coupled to the FPC antenna 1520 in the power feeding piece of the main antenna 1514 such that a resonant path 1550 may be formed.

In operation 2109, in the case where a contact of an object with respect to the first split portion is detected and a contact of the object with respect to the second split portion is not detected, the electronic device may electrically connect the first sub-ground of the main antenna and may cut off the electric connection with respect to the second sub-ground. For example, in the case of FIG. 15A, in the case where a contact of a human body with respect to the first split portion 1517 is detected and a contact of the human body with respect to the second split portion 1518 is not detected, the processor 1502 may control the first switch 1510 such that the first sub-ground of the main antenna radiator 1514, which is connected to the board 1500 through the connection members 15143, is electrically connected. In addition, the processor 1502 may control the second switch 1508 such that the electric connection of the main antenna radiator 1514, which is connected to the board 1500 through the connection member 15144, with respect to the sub-ground is cut off.

In operation 2111, in the case where the first sub-ground of the main antenna is electrically connected and the second sub-ground is not connected, the electronic device may form a resonant path through the main antenna and the second coupling antenna. For example, in the case of FIG. 15A, a signal fed from the RF module 1504 may be coupled to the second coupling antenna 1511 via the first ground in the power feeding piece of the main antenna 1514 such that a resonant path may be formed to a ground portion connected to the ground piece of the second coupling antenna 1511.

In operation 2113, in the case where a contact of an object with respect to the second split portion is detected and a contact of the object with respect to the first split portion is not detected, the electronic device may cut off the electric connection with respect to the first sub-ground of the main antenna and may electrically connect the second sub-ground. For example, in the case of FIG. 15A, in the case where a contact of a human body with respect to the second split portion 1518 is detected and a contact of the human body with respect to the first split portion 1517 is not detected, the processor 1502 may control the first switch 1510 such that the electric connection with respect to the first sub-ground of the main antenna radiator 1514, which is connected to the board 1500 through the connection members 15143, is cut off. In addition, the processor 1502 may control the second switch 1508 such that the second sub-ground of the main antenna radiator 1514, which is connected to the board 1500 through the connection member 15144, is electrically connected.

In operation 2115, in the case where the first sub-ground is not connected and the second sub-ground is electrically connected, the electronic device may form a resonant path through the main antenna and the first coupling antenna. For example, in the case of FIG. 15A, a signal fed from the RF module 1504 may be coupled to the first coupling antenna 1512 via the first ground in the power feeding piece of the main antenna 1514 such that a resonant path may be formed to a ground portion connected to the ground piece of the first coupling antenna 1512.

According to various embodiments of the present disclosure, there is provided a method of operating an electronic device that includes: a housing that includes a first face, a second face that is directed opposite to the first face, and a side face that at least partially enclose a space between the first face and the second face; a first metallic member that forms a first portion of the side face, and includes a first end and a second end; a second metallic member that forms a second portion of the side face, and is positioned adjacent to the first end of the first metallic member and electrically insulated from the first metallic member; a third metallic member that forms a third portion of the side face, and is positioned adjacent to the second end of the first metallic member and electrically insulated from the first metallic member; a communication circuit that is electrically connected to at least one of the first metallic member, the second metallic member, and the third metallic member; and at least one ground member that is included within the housing. The method may include: detecting, by the electronic device, whether an external object comes in contact with at least one of the first metallic member, the second metallic member, and the third metallic member; and changing an electric path between at least one of the first metallic member, the second metallic member, and the third metallic member, and the ground member, at least partially based on the detected result.

According to various embodiments of the present disclosure, the first metallic member may include: a power feeding portion set in advance; a first ground portion that is arranged at a position spaced apart from the power feeding portion; and at least one of the second ground portions that are arranged at different positions, respectively, which are spaced apart from the first ground portion.

According to various embodiments of the present disclosure, when where a contact of an external object with respect to the first metallic member, the second metallic member, or the third metallic member is not detected, the operation of changing the path may include electrically connecting at least one of the second ground portions and the ground member.

According to various embodiments of the present disclosure, in the case where the at least one of the second ground portions is electrically connected to the ground member, the above-described method may further include transmitting a signal having a first frequency band to the outside as the second metallic member is coupled to the first metallic member.

According to various embodiments of the present disclosure, in the case where the at least one of the second ground portions is electrically connected with the ground member, the above-described method may further include transmitting a signal having a second frequency band to the outside by using the third metallic member.

According to various embodiments of the present disclosure, in the case where a contact of an external object with respect to the first metallic member or with respect to the first metallic member and the second metallic member is detected through the sensor, the operation of changing the path may include cutting off an electric connection between the at least one of the second ground portions and the ground member.

According to various embodiments of the present disclosure, in the case where the electric connection between the at least one of the second ground portions and the ground member is cut off, the above-described method may further include transmitting a signal having a third frequency band to the outside as the third metallic member is coupled to the first metallic member.

According to various embodiments of the present disclosure, in the case where a contact of an external object with respect to the third metallic member is detected, the operation of changing the path may include cutting off an electric connection between the at least one of the second ground portions and the ground member.

According to various embodiments of the present disclosure, in the case where the electric connection between the at least one of the second ground portions and the ground member is cut off, the above-described method may further include transmitting a signal having a fourth frequency band to the outside as the first metallic member is coupled to the third metallic member.

According to various embodiments of the present disclosure, in the case where a contact of an external object with respect to the first metallic member and the second metallic member is detected, the operation of changing the path may include electrically connecting at least one of the second ground portions and the ground member, and in the case where a contact of an external object with respect to the first metallic member and the third metallic member is detected, the operation of changing the path may include electrically connecting at least one of the other second ground portions and the ground member.

According to various embodiments of the present disclosure, in the case where the at least one of the second ground portions and the at least one of the other second ground portion are electrically connected to the ground member, the above-described method may further include transmitting a signal having a fourth frequency band to the outside as the fourth metallic member is coupled to the first metallic member. The side face of the fourth metallic member may be connected to the first metallic member at the first portion.

According to various embodiments of the present disclosure, the operation of detecting whether the external object comes in contact may include detecting whether the external object comes in contact with at least one of the first metallic member, the second metallic member, and the third metallic member by using at least one of a touch sensor and a grip sensor.

According to various embodiments of the present disclosure, in the case where a capacitance change of a bezel section (e.g., a lower bezel section) used as a metal housing antenna is detected, it is possible to suppress the deterioration of an antenna radiating performance by forming a new resonant path.

According to various embodiments of the present disclosure, in the case where a contact with respect to a split portion between a main antenna and a first coupling antenna that are included in the metal housing is detected, it is possible to suppress the deterioration of an antenna radiating performance by switching a sub-ground for separating the second coupling antenna from the main antenna to a non-connection (open) state to form a resonant path by using the second coupling antenna.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an application-specific integrated circuit (ASIC) chip, a field-programmable gate arrays (FPGA), and a programmable-logic device for performing operations which has been known or are to be developed hereinafter.

The computer readable recoding medium may include a hard disk, a floppy disk, magnetic media (for example, a magnetic tape), optical media (for example, a compact disc read only memory (CD-ROM) and a digital versatile disc (DVD)), magneto-optical media (for example, a floptical disk), a hardware device (for example, a read only memory (ROM), a random access memory (RAM), a flash memory), and the like. In addition, the program instructions may include high class language codes, which can be executed in a computer by using an interpreter, as well as machine codes made by a compiler. Any of the hardware devices as described above may be configured to work as one or more software modules in order to perform the operations according to various embodiments of the present disclosure, and vice versa.

Any of the modules or programming modules according to various embodiments of the present disclosure may include at least one of the above described elements, exclude some of the elements, or further include other additional elements. The operations performed by the modules, programming module, or other elements according to various embodiments of the present disclosure may be executed in a sequential, parallel, repetitive, or heuristic manner. Further, some operations may be executed according to another order or may be omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a housing that includes a first face, a second face that is directed opposite to the first face, and a side face that at least partially encloses a space between the first face and the second face;
a first metallic member configured to form a first portion of the side face, and includes a first end and a second end;
a second metallic member configured to form a second portion of the side face, and is positioned adjacent to the first end of the first metallic member and electrically insulated from the first metallic member;
a third metallic member configured to form a third portion of the side face, and is positioned adjacent to the second end of the first metallic member and electrically insulated from the first metallic member;
a communication circuit that is electrically connected to at least one of the first metallic member, the second metallic member, and the third metallic member;
at least one ground member that is included within the housing;
a sensor configured to:
detect if an external object comes in contact with at least one of the first metallic member, the second metallic member, and the third metallic member,
when a contact of the external object with respect to at least one of the first metallic member or the second metallic member is detected, generate a first signal, and
when the contact of the external object with respect to at least one of the first metallic member or the second metallic member is not detected, generate a second signal; and
a circuit configured to:
when the sensor generates the first signal, open an electric path between the first metallic member and the ground member such that a resonant path is formed in between the first metallic member and the third metallic member by a signal fed from the communication circuit, and
when the sensor generates the second signal, connect the electric path between the first metallic member and the ground member such that a resonant path is formed in between the first metallic member and the second metallic member by a signal fed from the communication circuit.

2. The electronic device of claim 1, wherein the first metallic member includes:
a power feeding portion set in advance;
a first ground portion that is arranged at a position spaced apart from the power feeding portion; and
one or more second ground portions that are arranged at different positions, respectively, which are spaced apart from the first ground portion.

3. The electronic device of claim 2, wherein an electric connection between at least one of the second ground portions and the ground member is changed by a switch.

4. The electronic device of claim 3, wherein, if a contact of an external object with respect to the first metallic member, the second metallic member, or the third metallic member is not detected through the sensor, the switch electrically connects the at least one of the second ground portions and the ground member to each other.

5. The electronic device of claim 4, wherein, if the at least one of the second ground portions is electrically connected to the ground member, the second metallic member is coupled with the first metallic member.

6. The electronic device of claim 4, wherein the communication circuit is configured to transmit a signal having a first frequency band to an outside the electronic device by using the third metallic member in the case where the at least one of the second ground portions is electrically connected with the ground member.

7. The electronic device of claim 3, wherein, if a contact of an external object with respect to the first metallic member, or the first metallic member and the second metallic member is detected through the sensor, the switch opens an electric connection between the at least one of the second ground portions and the ground member.

8. The electronic device of claim 7, wherein, if the electric connection between the at least one of the second ground portions and the ground member is opened, the third metallic member is coupled with the first metallic member.

9. The electronic device of claim 3, wherein, if a contact of an external object with respect to the third metallic member is detected through the sensor, the switch opens the electric connection between the at least one of the second ground portions and the ground member.

10. The electronic device of claim 9, wherein, if the electric connection between the at least one of the second ground portions and the ground member is opened, the first metallic member is coupled with the third metallic member.

11. The electronic device of claim 2,
wherein an electric path between at least one of the second ground portions and the ground member is changed by a first switch, and
wherein an electric path between at least one of the other second ground portions and the ground member is changed by a second switch.

12. The electronic device of claim 11, wherein, if a contact of an external object with respect to the first metallic member and the second metallic member is detected through the sensor, the first switch electrically connects the at least one of the ground portions and the ground member to each other.

13. The electronic device of claim 11, wherein, if a contact of an external object with respect to the first metallic member and the third metallic member is detected through the sensor, the second switch electrically connects the at least one of the other ground portions and the ground member to each other.

14. The electronic device of claim 11,
wherein the side face further includes a fourth metallic member that is connected to the first metallic member in the first portion, and
wherein, if the at least one of the second ground portions and at least one of the other second ground portions are electrically connected to the ground member, the fourth metallic member is coupled with the first metallic member.

15. The electronic device of claim 1, wherein the first metallic member, the second metallic member, and the third metallic member includes a metal bezel or a decoration member that is disposed to be at least partially exposed to an outside of the electronic device.

16. A method of operating an electronic device that includes a first metallic member, a second metallic member, a third metallic member and at least one ground member, the method comprising:
detecting, by the electronic device, if an external object comes in contact with at least one of the first metallic member, the second metallic member, and the third metallic member;
when a contact of the external object with respect to at least one of the first metallic member or the second metallic member is detected, opening, by the electronic device, an electric path between the first metallic member and the ground member such that a resonant path is formed in between the first metallic member and the third metallic member by a signal fed from a communication circuit of the electronic device; and
when the contact of the external object with respect to at least one of the first metallic member or the second metallic member is not detected, connecting, by the electronic device, the electric path between the first metallic member and the ground member such that a resonant path is formed in between the first metallic member and the second metallic member by a signal fed from the communication circuit.

17. The method of claim 16, wherein the first metallic member includes:
a power feeding portion set in advance;
a first ground portion that is arranged at a position spaced apart from the power feeding portion; and
one or more second ground portions that are arranged at different positions, respectively, which are spaced apart from the first ground portion.

18. The method of claim 17,
wherein the changing of the electric path includes electrically connecting at least one of the second ground portions and the ground member if a contact of an external object with respect to the first metallic member, the second metallic member, or the third metallic member is not detected,
wherein, if the at least one of the second ground portions is electrically connected to the ground member, the changing of the electric path further includes transmitting a signal having a first frequency band to an outside of the electronic device as the second metallic member is coupled to the first metallic member, and
wherein, if the at least one of the second ground portions is electrically connected with the ground member, the changing of the electric path further includes transmitting a signal having a second frequency band to the outside by using the third metallic member.

19. The method of claim 17,
wherein, if a contact of an external object with respect to the first metallic member or with respect to the first metallic member and the second metallic member is detected through the sensor, the changing of the electric path includes cutting off an electric connection between the at least one of the second ground portions and the ground member, and
wherein, if the electric connection between the at least one of the second ground portions and the ground member is opened, the changing of the electric path further includes transmitting a signal having a third frequency band to an outside of the electronic device as the third metallic member is coupled to the first metallic member.

20. The method of claim 17,
wherein, if a contact of an external object with respect to the third metallic member is detected, the changing of the electric path includes cutting off an electric connection between the at least one of the second ground portions and the ground member, and
wherein, if the electric connection between the at least one of the second ground portions and the ground member is opened, the changing of the electric path further includes transmitting a signal having a fourth frequency band to an outside of the electronic device as the first metallic member is coupled to the third metallic member.

* * * * *